(12) United States Patent
Ware et al.

(10) Patent No.: US 7,484,064 B2
(45) Date of Patent: Jan. 27, 2009

(54) METHOD AND APPARATUS FOR SIGNALING BETWEEN DEVICES OF A MEMORY SYSTEM

(75) Inventors: Frederick A. Ware, Los Altos, CA (US); Ely K. Tsern, Los Altos, CA (US); Richard E. Perego, San Jose, CA (US); Craig E. Hampel, San Jose, CA (US)

(73) Assignee: Rambus Inc., Los Altos, CA (US)

( * ) Notice: Subject to any disclaimer, the term of this patent is extended or adjusted under 35 U.S.C. 154(b) by 86 days.

(21) Appl. No.: 10/053,340

(22) Filed: Oct. 22, 2001

(65) Prior Publication Data

US 2004/0054845 A1    Mar. 18, 2004

Related U.S. Application Data

(63) Continuation-in-part of application No. 09/841,911, filed on Apr. 24, 2001, now Pat. No. 6,675,272.

(51) Int. Cl.
G06F 13/36 (2006.01)
(52) U.S. Cl. ............... 711/167; 711/105; 710/125; 710/305
(58) Field of Classification Search ........... 365/63, 365/189.01, 230.03; 710/4, 307; 711/105, 711/167, 169
See application file for complete search history.

(56) References Cited

U.S. PATENT DOCUMENTS

| | | | |
|---|---|---|---|
| 3,820,081 A | 6/1974 | Donahue | 360/172.5 |
| 3,950,735 A | 4/1976 | Patel | |
| 4,183,095 A | 1/1980 | Ward | |
| 4,266,282 A | 5/1981 | Henle et al. | 365/52 |
| 4,280,221 A * | 7/1981 | Chun et al. | 375/288 |
| 4,315,308 A | 2/1982 | Jackson | |
| 4,330,852 A | 5/1982 | Redwine et al. | |
| 4,337,523 A | 6/1982 | Hotta et al. | |

(Continued)

FOREIGN PATENT DOCUMENTS

EP    0 379 772    8/1990

(Continued)

OTHER PUBLICATIONS

Changsik Yoo, DRAM Design 3, Samsung Electronics, High Speed DRAM Interface, 35 pages.

(Continued)

*Primary Examiner*—Than Nguyen
(74) *Attorney, Agent, or Firm*—Shemwell Mahamedi LLP

(57) ABSTRACT

A method and apparatus for signaling between devices of a memory system is provided. In accordance with an embodiment of the invention, one or more of several capabilities are implemented to provide heretofore unattainable levels of important system metrics, for example, high performance and/or low cost. These capabilities relate to timing adjustment capabilities, bit time adjustment capabilities, cycle time selection, use of differential and/or non-differential signaling for bus signals and/or clock signals, use of termination structures on a bus, including integrated termination structures, and active control circuitry to allow adjustment to different characteristic bus impedances and power-state control, including a calibration process to optimize the termination value, use of slew rate control circuitry and transfer characteristic control circuitry in the predriver and driver of transmitter blocks to allow adjustment to different characteristic bus impedances and to allow adjustment for other bus properties, including a calibration process to optimize the such circuitry, and/or provision of a memory component designed to prefetch (preaccess) words that are wider than the width of the data bus so that the memory access bandwidth approximately matches the transfer bandwidth, and memory component able to adjust the size of the prefetch (preaccess) word to accommodate connection to data buses of different width.

36 Claims, 38 Drawing Sheets

U.S. PATENT DOCUMENTS

| | | | |
|---|---|---|---|
| 4,445,204 A | 4/1984 | Nishiguchi | |
| 4,499,536 A | 2/1985 | Gemma et al. | |
| 4,567,545 A | 1/1986 | Mettler, Jr. | |
| 4,637,018 A | 1/1987 | Flora et al. | |
| 4,646,270 A | 2/1987 | Voss | |
| 4,656,605 A | 4/1987 | Clayton | 365/52 |
| 4,712,190 A | 12/1987 | Guglielmi et al. | |
| 4,719,602 A | 1/1988 | Hag et al. | |
| 4,755,937 A | 7/1988 | Glier | |
| 4,763,249 A | 8/1988 | Bomba et al. | |
| 4,792,926 A | 12/1988 | Roberts | |
| 4,792,929 A | 12/1988 | Olson et al. | |
| 4,799,199 A | 1/1989 | Scales, III et al. | |
| 4,800,530 A | 1/1989 | Itoh et al. | |
| 4,821,226 A | 4/1989 | Christopher et al. | |
| 4,825,411 A | 4/1989 | Hamano | |
| 4,845,664 A | 7/1989 | Aichelmann, Jr. et al. | |
| 4,845,677 A | 7/1989 | Chappell et al. | |
| 4,849,937 A | 7/1989 | Yoshimoto | |
| 4,866,675 A | 9/1989 | Kawashima | |
| 4,875,192 A | 10/1989 | Matsumoto | |
| 4,882,712 A | 11/1989 | Ohno et al. | |
| 4,891,791 A | 1/1990 | Iijima | |
| 4,916,670 A | 4/1990 | Suzuki et al. | |
| 4,920,483 A | 4/1990 | Pogue et al. | |
| 4,928,265 A | 5/1990 | Higuchi et al. | |
| 4,937,734 A | 6/1990 | Bechtolsheim | |
| 4,945,516 A | 7/1990 | Kashiyama | |
| 4,953,128 A | 8/1990 | Kawai et al. | |
| 5,001,672 A | 3/1991 | Ebbers et al. | |
| 5,077,693 A | 12/1991 | Hardee et al. | |
| 5,083,296 A | 1/1992 | Hara et al. | |
| 5,097,489 A | 3/1992 | Tucci | 375/120 |
| 5,111,386 A | 5/1992 | Fujishima et al. | |
| 5,117,389 A | 5/1992 | Yiu | |
| 5,124,589 A | 6/1992 | Shiomi et al. | |
| 5,140,688 A | 8/1992 | White et al. | |
| 5,179,687 A | 1/1993 | Hidaka et al. | |
| 5,260,905 A | 11/1993 | Mori | |
| 5,276,858 A | 1/1994 | Oak et al. | |
| 5,301,278 A | 4/1994 | Bowater et al. | |
| 5,305,278 A | 4/1994 | Inoue | |
| 5,311,483 A | 5/1994 | Takasugi | |
| 5,319,755 A | 6/1994 | Farmwald et al. | |
| 5,323,358 A | 6/1994 | Toda et al. | |
| 5,327,390 A | 7/1994 | Takasugi | |
| 5,329,484 A | 7/1994 | Tsuiki | 365/45 |
| 5,339,276 A | 8/1994 | Takasugi | |
| 5,341,341 A | 8/1994 | Fukuzo | |
| 5,345,573 A | 9/1994 | Bowden, III et al. | |
| 5,357,621 A | 10/1994 | Cox | 395/400 |
| 5,365,489 A | 11/1994 | Jeong | |
| 5,379,438 A | 1/1995 | Bell et al. | |
| 5,381,376 A | 1/1995 | Kim et al. | |
| 5,381,538 A | 1/1995 | Amini et al. | |
| 5,384,745 A | 1/1995 | Konishi et al. | |
| 5,386,375 A | 1/1995 | Smith | |
| 5,390,149 A | 2/1995 | Vogley et al. | |
| 5,392,239 A | 2/1995 | Margulis et al. | |
| 5,404,338 A | 4/1995 | Murai et al. | |
| 5,404,463 A | 4/1995 | McGarvey | |
| 5,422,858 A | 6/1995 | Mizukami et al. | |
| 5,444,667 A | 8/1995 | Obara | |
| 5,455,803 A | 10/1995 | Kodama | |
| 5,475,690 A | 12/1995 | Burns et al. | |
| 5,504,874 A | 4/1996 | Galles et al. | |
| 5,511,024 A | 4/1996 | Ware et al. | |
| 5,530,623 A | 6/1996 | Sanwo et al. | 361/788 |
| 5,533,204 A | 7/1996 | Tipley | |
| 5,548,786 A | 8/1996 | Amini et al. | |
| 5,553,248 A | 9/1996 | Melo et al. | |
| 5,577,236 A | 11/1996 | Johnson et al. | 395/551 |
| 5,578,940 A | 11/1996 | Dillon et al. | |
| 5,579,352 A | 11/1996 | Llewellyn | 375/376 |
| 5,606,717 A * | 2/1997 | Farmwald et al. | 710/36 |
| 5,611,058 A | 3/1997 | Moore et al. | |
| 5,615,358 A | 3/1997 | Vogley | 395/556 |
| 5,638,531 A | 6/1997 | Crump et al. | |
| 5,649,161 A | 7/1997 | Andrade et al. | |
| 5,655,113 A | 8/1997 | Leung et al. | |
| 5,663,661 A | 9/1997 | Dillon et al. | |
| 5,680,361 A | 10/1997 | Ware et al. | |
| 5,708,297 A | 1/1998 | Clayton | |
| 5,742,798 A | 4/1998 | Goldrian | |
| 5,748,914 A | 5/1998 | Barth et al. | |
| 5,764,963 A | 6/1998 | Ware et al. | |
| 5,778,419 A * | 7/1998 | Hansen et al. | 711/112 |
| 5,796,624 A | 8/1998 | Sridhar et al. | |
| 5,844,855 A | 12/1998 | Ware et al. | |
| 5,867,541 A | 2/1999 | Tanaka et al. | |
| 5,892,981 A | 4/1999 | Wiggers | |
| 5,928,343 A | 7/1999 | Farmwald et al. | |
| 5,933,379 A * | 8/1999 | Park et al. | 365/201 |
| 5,943,573 A | 8/1999 | Wen | |
| 5,952,691 A | 9/1999 | Yamaguchi | |
| 5,987,576 A | 11/1999 | Johnson et al. | |
| 6,005,776 A | 12/1999 | Holman et al. | |
| 6,016,282 A | 1/2000 | Keeth | 365/233 |
| 6,034,878 A | 3/2000 | Osaka et al. | |
| 6,049,238 A | 4/2000 | Shimizu et al. | |
| 6,049,467 A | 4/2000 | Tamarkin et al. | |
| 6,065,092 A | 5/2000 | Roy | |
| 6,067,594 A | 5/2000 | Perino et al. | |
| 6,075,393 A | 6/2000 | Tomita et al. | 327/153 |
| 6,075,730 A | 6/2000 | Barth et al. | |
| 6,111,757 A | 8/2000 | Dell et al. | |
| 6,125,419 A | 9/2000 | Umemura et al. | |
| 6,131,149 A | 10/2000 | Lu et al. | 711/167 |
| 6,154,417 A | 11/2000 | Kim | |
| 6,154,821 A | 11/2000 | Barth et al. | |
| 6,160,754 A | 12/2000 | Suh | |
| 6,172,895 B1 | 1/2001 | Brown et al. | |
| 6,185,644 B1 | 2/2001 | Farmwald et al. | |
| 6,226,723 B1 | 5/2001 | Gustavson et al. | 711/170 |
| 6,232,792 B1 | 5/2001 | Starr | |
| 6,233,157 B1 | 5/2001 | Yoon et al. | |
| 6,253,266 B1 | 6/2001 | Ohanian | |
| 6,260,097 B1 | 7/2001 | Farmwald et al. | |
| 6,266,285 B1 | 7/2001 | Farmwald et al. | |
| 6,266,730 B1 | 7/2001 | Perino et al. | |
| 6,266,737 B1 | 7/2001 | Ware et al. | |
| 6,292,877 B1 | 9/2001 | Ryan | |
| 6,292,903 B1 | 9/2001 | Coteus et al. | 713/401 |
| 6,304,937 B1 | 10/2001 | Farmwald et al. | |
| 6,314,051 B1 | 11/2001 | Farmwald et al. | |
| 6,321,282 B1 | 11/2001 | Horowitz et al. | |
| 6,336,205 B1 | 1/2002 | Kurokawa et al. | |
| 6,343,352 B1 | 1/2002 | Davis et al. | |
| 6,356,260 B1 * | 3/2002 | Montalbo | 345/204 |
| 6,359,815 B1 | 3/2002 | Sato et al. | |
| 6,388,886 B1 | 5/2002 | Tobita | |
| 6,401,167 B1 | 6/2002 | Barth et al. | |
| 6,442,644 B1 * | 8/2002 | Gustavson et al. | 711/105 |
| 6,445,624 B1 | 9/2002 | Janzen et al. | 365/191 |
| 6,449,159 B1 | 9/2002 | Haba | |
| 6,449,727 B1 | 9/2002 | Toda | 712/500 |
| 6,477,592 B1 | 11/2002 | Chen et al. | |
| 6,493,789 B2 | 12/2002 | Ware et al. | |
| 6,496,897 B2 | 12/2002 | Ware et al. | |
| 6,502,161 B1 | 12/2002 | Perego et al. | |
| 6,504,790 B1 | 1/2003 | Wolford | 365/233 |
| 6,510,503 B2 | 1/2003 | Gillingham et al. | |
| 6,516,365 B2 | 2/2003 | Horowitz et al. | |
| 6,526,469 B1 | 2/2003 | Drehmel et al. | |

| | | |
|---|---|---|
| 6,539,454 B2 | 3/2003 | Mes |
| 6,545,875 B1 | 4/2003 | Perino et al. |
| 6,553,472 B2 | 4/2003 | Yang et al. ............... 711/167 |
| 6,590,781 B2 | 7/2003 | Kollipara et al. |
| 6,611,905 B1 | 8/2003 | Grundon et al. ........... 711/167 |
| 6,618,736 B1* | 9/2003 | Menage .................... 707/204 |
| 6,640,292 B1 | 10/2003 | Barth et al. |
| 6,643,752 B1 | 11/2003 | Donnelly et al. |
| 6,643,787 B1 | 11/2003 | Zerbe et al. |
| 6,646,953 B1 | 11/2003 | Stark |
| 6,657,871 B2 | 12/2003 | Perino et al. |
| 6,675,272 B2 | 1/2004 | Ware et al. |
| 6,680,866 B2 | 1/2004 | Kajimoto |
| 6,681,288 B2 | 1/2004 | Griffin et al. |
| 6,684,263 B2 | 1/2004 | Horowitz et al. |
| 6,724,666 B2 | 4/2004 | Janzen et al. .............. 365/191 |
| 6,760,857 B1* | 7/2004 | Lau et al. ................... 713/500 |
| 6,765,800 B2 | 7/2004 | Haba et al. |
| 6,804,764 B2 | 10/2004 | LaBerge et al. ........... 711/170 |
| 6,807,614 B2 | 10/2004 | Chung ........................ 711/168 |
| 6,833,984 B1 | 12/2004 | Belgacem |
| 6,839,266 B1 | 1/2005 | Garrett, Jr. et al. |
| 6,839,393 B1 | 1/2005 | Sidiropoulos |
| 6,853,557 B1 | 2/2005 | Haba et al. |
| 6,873,939 B1 | 3/2005 | Zerbe et al. |
| 6,898,085 B2 | 5/2005 | Haba et al. |
| 6,912,680 B1 | 6/2005 | Keeth |
| 6,928,571 B1 | 8/2005 | Bonella et al. ............. 713/401 |
| 6,950,956 B2 | 9/2005 | Zerbe et al. |
| 6,970,988 B1 | 11/2005 | Chung ........................ 711/168 |
| 7,057,948 B2 | 6/2006 | Shimizu et al. ............ 365/200 |
| 7,076,745 B2 | 7/2006 | Togo ............................. 716/1 |
| 7,095,661 B2 | 8/2006 | Osaka et al. ............... 365/194 |
| 7,100,066 B2 | 8/2006 | Jeong ......................... 713/500 |
| 7,224,595 B2 | 5/2007 | Dreps et al. .................. 365/63 |
| 7,251,162 B2 | 7/2007 | Kawajiri et al. ........ 365/185.18 |
| 2001/0026487 A1 | 10/2001 | Koga |
| 2001/0047450 A1 | 11/2001 | Gillingham et al. ......... 711/105 |
| 2002/0174311 A1 | 11/2002 | Ware et al. ................. 711/167 |
| 2003/0076702 A1 | 4/2003 | Kyung et al. |
| 2004/0003194 A1 | 1/2004 | Bodas et al. |
| 2004/0054845 A1 | 3/2004 | Ware et al. ................. 711/100 |
| 2004/0170072 A1 | 9/2004 | Ware et al. |
| 2005/0169097 A1 | 3/2005 | Ware et al. |
| 2006/0007761 A1 | 1/2006 | Ware et al. |
| 2006/0039174 A1 | 2/2006 | Ware et al. |
| 2006/0056244 A1 | 3/2006 | Ware et al. |
| 2006/0069895 A1 | 3/2006 | Ware et al. |
| 2006/0077731 A1 | 4/2006 | Ware |
| 2006/0129776 A1 | 6/2006 | Ware |

FOREIGN PATENT DOCUMENTS

| | | |
|---|---|---|
| EP | 0 709 786 | 5/1996 |
| EP | 0735492 | 10/1996 |
| EP | 0849685 A2 | 6/1998 |
| JP | 2008227394 | 9/1996 |
| JP | 11284126 | 10/1999 |
| JP | 2000035831 | 2/2000 |
| JP | 02000035831 A | 2/2000 |
| JP | 2000174505 | 6/2000 |
| JP | 2000348490 | 12/2000 |
| JP | 2001027918 | 1/2001 |
| WO | 9815897 | 4/1998 |
| WO | WO99/41667 | 8/1999 |
| WO | WO99/50852 | 10/1999 |
| WO | WO00/54164 | 9/2000 |

OTHER PUBLICATIONS

Crisp, Richard "Direct Rambus Technology: The New Main Memory Standard," IEEE Micro, Nov./Dec. 1997, 0272-1732/97.

European Search Report and Written Opinion in European Patent Application 02009032.0-2212-, search completed Jun. 27, 2005, 9 pgs.

European Search Report and Written Opinion for EP 1 653374 A2 (Application No. 05022021.9), Jul. 26, 2006, 6 pgs.

IBM, 184 Pin DIMM Design Updates/Ramifications for Unbuffered and Registered DDR DIMMs, JC-42.5, Dec. 1999, pp. 1-12.

IBM, Corp., Application Note, Direct Rambus Memory System Overview, Mar. 30, 1998, pp. 1-5.

IBM, Micron Technology, and Reliance Computer Corporation, DDR SDRAM Registered DIMM Design Specification, Revision 0.6, Nov. 1999, 62 pages.

IEEE Draft Standard for a High-Speed Memory Interface (SyncLink), IEEE Draft 0.99 IEEE P 1596.7-199X, 1996, 66 pages.

IEEE Standard for Scalable Coherent Interface (SCI), Std 1596-1992, 270 pages.

International Search Report and Written Opinion of the International Searching Authority in International Application PCT/US2005/032346, ISA European Patent Office, Apr. 18, 2006, 12 pgs.

John Poulton, Signaling in High-Performance Memory Systems, ISSCC 1999, slides 1-59 on 30 pages.

Lluis Paris, et al., WP 24.3 A 800MB/s 72 Mb SLDRAM with Digitally-Calibrated DLL, 1999 IEEE International Solid-State Circuits Conference, 0-7803-5129-0/99, 10 pages.

Mike Seibert, DRAM Memory Enabling, Micron Technology, Inc., Competitive DDR Memory Sub-systems, Platform Conference, Jul. 18-19, 2000, 67 pages.

Peter Gillingham, MOSAID Technologies and Bill Vogley, Texas Instruments, SLDRAM: High-Performance, Open-Standard Memory, IEEE Micro, Nov./Dec. 1997, pp. 29-39.

Peter Gillingham, MOSAID Technologies, Inc. SLDRAM Architectural and Functional Overview, SLDRAM Consortium, Aug. 29, 1997, 13 pages.

Rambus, Inc. Data Sheet "Direct RDRAM 256/286-Mbit (1Mx16/18x16d)" Preliminary Information, Document DL00105 Version 1.1, 72 pages.

Rambus, Inc. Data Sheet, Preliminary Information, 8/9-Mbit (1M x 8/9) and 16/18-Mbit (2M x 8/9) RDRAM, March 1996, pp. 1-30.

Rambus, Inc. Direct RAC Data Sheet, Advance Information, Aut. 7, 1998, pp. 1-47.

Rambus, Inc., Direct Rambus Short Channel Layout Guide, Version 0.8, Mar. 2000, 33 pages.

Rambus, Inc., Rambus RIMM Connector, Document DL 0069 Version 1.01, Jul. 1999, 14 pages.

Rambus, Inc., Rambus SO-RIMM Module (with 128/144Mb RDRAMs), Advance Information, Document DL0076 Version 0.7, Feb. 2000, pp. 1-12.

Rambus, Inc., Rambus RIMM Module (with 64/72Mb RDRAMs) Data Sheet, Preliminary Information, Document DL0078 Version 0.90, Mar. 1999, pp. 1-11.

Samsung Electronics, SDRAM Module, Preliminary KMM377S1620CT2, Rev. 1, Nov. 1998, 12 pages.

SLDRAM Inc., 4M × 18 SLDRAM, DraftAdvance, Jul. 9, 1998, pp. 1-69.

Wong, D., et al., "Inserting Active Delay Elements to Achieve Wave Pipellining," IEEE 1989, pp. 270-273.

Y.R. Kim, Memory Product Planning and Application, Samsung Electronics, DDR, Today and Tomorrow, Platform Conference, Jul. 18-19, 2000, 26 pages.

Yasunobu Nakase, et al., Source-Synchronization and Timing Vernier Techniques for 1.2-GB/s SLDRAM Interface, IEEE Journal of Solid-State Circuits, vol. 34, No. 4, Apr. 1999, pp. 494-501.

"Standard for a High-Speed Memory Interface (SyncLink)," IEEE Draft 0.99 IEEE P 1596.7 199X, 1996, 66 pages.

Rambus Inc. Data Sheet, "8/9-Mbit (1M x 8/9) and 16/18-Mbit (2M x 8/9) RDRAM", Mar. 1996, pp. 1-30 (Dup of 3809).

Rambus Inc. Data Sheet, "8/9-Mbit (1M x 8/9) and 16/18-Mbit (2M x 8/9) RDRAM", Mar. 1996, pp. 1-30.

Rambus Inc., Rambus RIMM Module (with 64/72Mb RDRAMSs) Data Sheet, Prliminary Information, Document DL0078 Version 0.90, Mar. 1999, pp. 1-11.

Rambus, Inc. Direct Rambus Short Channel Layout Guide, Version 0.8, Mar. 2000, 34 pages.

"Standard for a High-Speed Memory Interface (SyncLink)," IEEE Draft 0.99 IEEE P 1596.7 199X, 1996, 66 pages.

The Institute of Electrical and Electronics Engineers: "Standard for High-Bandwith Memory Interface Based on Scalable Coherent Interface Signalling Technology (RamLink)" Mar. 19, 1996, IEEE STD 1596.4-1996, XP002315223 * pp. 12,43-45 *.

International Preliminary Report on Patentability and Written Opinion of the International Searching Authority in International Application PCT/US2005/032346, European Patent Office, Mar. 29, 2007, 10 pages.

International Preliminary Report and Written Opinion of the International Searching Authority in International Application PCT/US/2005/032770, World Intellectual Property Organization, Apr. 12, 2007, 6 pages. (RBS2.P034WO).

International Search Report and Written Opinion of the International Searching Authority in International Application PCT/US/2005/042722, World Intellectual Property Organization, May 10, 2006, 15 pages. (RBS2.P011WO).

Yeung et al., 2000, "A 2.4 Gb/s/pin Simultaneous Bidirectional Parallel Link with Per-PinSkew Compensation," IEEE Journal of Solid-State Circuits, vol. 35, No. 11, pp. 1619-1627.

Notice of Opposition to European Patent No. 1291778; Application No. 02009032.0; 24 pages.

Complaint Under Section 337 of the Tariff Act of 1930, as Amended, In the Matter of Certain Semiconductor Chips Having Synchoronous Dynamic Random Access Memory Controller and Products Containing Same, Including Graphics Cards and Motherboards, in United States International Trade Commission, Washington, D.C., Investigation No. 337-TA, Nov. 6, 2008, 215 pages, Appendices and Exhibits omitted except as otherwise cited herein.

Exhibit 4 - Infringement Claim Charts for U.S. Patent No. 7,177,998 for in United States International Trade Commission, Washington, D.C., Investigation No. 337-TA, Nov. 6, 2008, 9 pages.

Exhibit 5 - Infringement Claim Charts for U.S. Patent No. 7,210,016 forin United States International Trade Commission, Washington, D.C., Investigation No. 337-TA, Nov. 6, 2008, 10 pages.

First Amended Complaint for Patent Infringement and Jury Demand, *Rambus Inc.* v. *NVIDIA Corporation*, United States District Court Northern District of California, San Jose Division, Case No. C0803343JCS, Jul. 10, 2008, 18 pages.

* cited by examiner

METHOD AND APPARATUS FOR SIGNALING BETWEEN DEVICES OF A MEMORY SYSTEM

This application is a continuation-in-part of patent application Ser. No. 09/841,911, filed on Apr. 24, 2001 now U.S. Pat. No. 6,675,272.

TECHNICAL FIELD OF THE INVENTION

The invention relates generally to information storage and retrieval and, more specifically, to coordinating memory components.

BACKGROUND OF THE INVENTION

As computers and data processing equipment have grown in capability, users have developed applications that place increasing demands on the equipment. Thus, there is a continually increasing need to process more information in a given amount of time. One way to process more information in a given amount of time is to process each element of information in a shorter amount of time. As that amount of time is shortened, it approaches the physical speed limits that govern the communication of electronic signals. While it would be ideal to be able to move electronic representations of information with no delay, such delay is unavoidable. In fact, not only is the delay unavoidable, but, since the amount of delay is a function of distance, the delay varies according to the relative locations of the devices in communication.

Since there are limits to the capabilities of a single electronic device, it is often desirable to combine many devices, such as memory components, to function together to increase the overall capacity of a system. However, since the devices cannot all exist at the same point in space simultaneously, consideration must be given to operation of the system with the devices located diversely over some area.

Traditionally, the timing of the devices' operation was not accelerated to the point where the variation of the location of the devices was problematic to their operation. However, as performance demands have increased, traditional timing paradigms have imposed barriers to progress.

One example of an existing memory system uses DDR (double data rate) memory components. The memory system includes a memory controller and a memory module.

A propagation delay occurs along an address bus between the memory controller and the memory module. Another propagation delay occurs along the data bus between the memory controller and the memory module.

The distribution of the control signals and a control clock signal in the memory module is subject to strict constraints. Typically, the control wires are routed so there is an equal length to each memory component. A "star" or "binary tree" topology is typically used, where each spoke of the star or each branch of the binary tree is of equal length. The intent is to eliminate any variation of the timing of the control signals and the control clock signal between different memory components of a memory module, but the balancing of the length of the wires to each memory component compromises system performance (some paths are longer than they need to be). Moreover, the need to route wires to provide equal lengths limits the number of memory components and complicates their connections.

In such DDR systems, a data strobe signal is used to control timing of both data read and data write operations. The data strobe signal is not a periodic timing signal, but is instead only asserted when data is being transferred. The timing signal for the control signals is a periodic clock. The data strobe signal for the write data is aligned to the clock for the control signals. The strobe for the read data is delayed by delay relative to the control clock equal to the propagation delay along the address bus plus the propagation delay along the data bus. A pause in signaling must be provided when a read transfer is followed by a write transfer to prevent interference along various signal lines used. Such a pause reduces system performance.

Such a system is constrained in several ways. First, because the control wires have a star topology or a binary tree routing, reflections occur at the stubs (at the ends of the spokes or branches). The reflections increase the settling time of the signals and limit the transfer bandwidth of the control wires. Consequently, the time interval during which a piece of information is driven on a control wire will be longer than the time it takes a signal wavefront to propagate from one end of the control wire to the other. Additionally, as more modules are added to the system, more wire stubs are added to each conductor of the data bus, thereby adding reflections from the stubs. This increases the settling time of the signals and further limits the transfer bandwidth of the data bus.

Also, because there is a constraint on the relationship between the propagation delays along the address bus and the data bus in this system, it is hard to increase the operating frequency without violating a timing parameter of the memory component. If a clock signal is independent of another clock signal, those clock signals and components to which they relate are considered to be in different clock domains. Within a memory component, the write data receiver is operating in a different clock domain from the rest of the logic of the memory component, and the domain crossing circuitry will only accommodate a limited amount of skew between these two domains. Increasing the signaling rate of data will reduce this skew parameter (when measured in time units) and increase the chance that a routing mismatch between data and control wires on the board will create a timing violation.

Also, most DDR systems have strict limits on how large the address bus and data bus propagation delays may be (in time units). These are limits imposed by the memory controller and the logic that is typically included for crossing from the controller's read data receiver clock domain into the clock domain used by the rest of the controller. There is also usually a limit (expressed in clock cycles) on how large the sum of these propagation delays can be. If the motherboard layout makes this sum too large (when measured in time units), the signal rate of the system may have to be lowered, thereby decreasing performance.

In another example of an existing memory system, the control wires and data bus are connected to a memory controller and are routed together past memory components on each memory module. One clock is used to control the timing of write data and control signals, while another clock is used to control the timing of read data. The two clocks are aligned at the memory controller. Unlike the previous prior art example, these two timing signals are carried on separate wires.

In such an alternate system, several sets of control wires and a data bus may be used to intercouple the memory controller to one or more of the memory components. The need for separate sets of control wires introduces additional cost and complexity, which is undesireable. Also, if a large capacity memory system is needed, the number of memory components on each data bus will be relatively large. This will tend to limit the maximum signal rate on the data bus, thereby limiting performance.

Another example of an existing memory system is found in U.S. Pat. No. 5,778,419, issued to Hansen, et al. on Jul. 7, 1998. While the Hansen, et al. patent relates to a dynamic random access memory (DRAM) with high bandwidth interface that uses packets and arbitration, such a DRAM suffers from certain disadvantages that limit its utility.

Thus, a technique is needed to coordinate memory operations among diversely-located memory components.

DETAILED DESCRIPTION OF A PREFERRED EMBODIMENT

Figure 1:
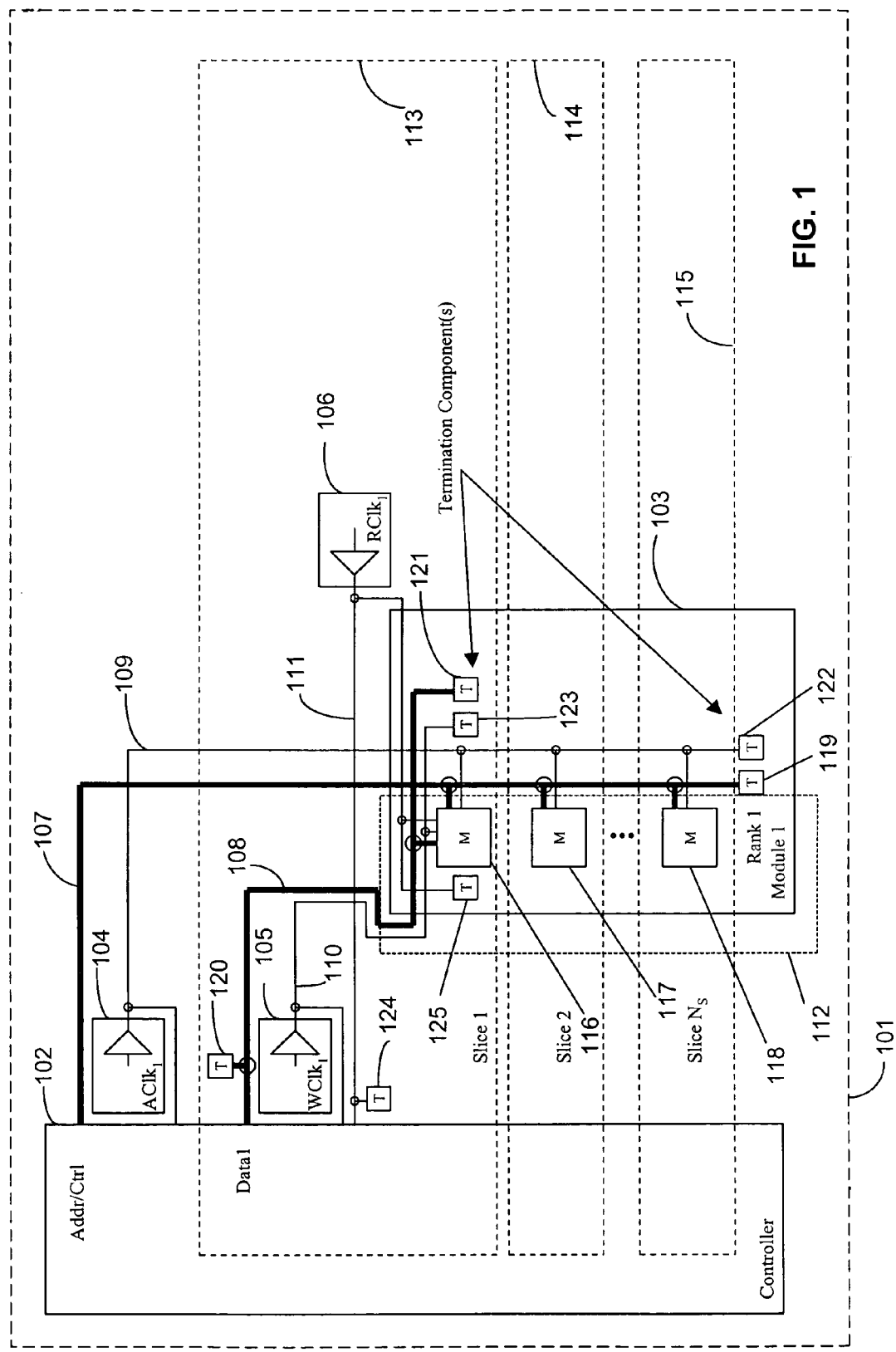
FIG. 1 is a block diagram illustrating a memory system having a single rank of memory components with which an embodiment of the invention may be implemented.

A method and apparatus for signaling between devices of a memory system is described. In accordance with an embodiment of the invention, one or more of the following capabilities are implemented to provide heretofore unattainable levels of important system metrics, for example, high performance and/or low cost:

Individual timing adjustment for each pin or pin group, including timing asymmetrically configured between devices, including a calibration process to optimize the timing adjustment, Adjustment of a bit time of a bus to correspond to a signaling rate supported by the topology of the bus in the system, Selection of a cycle time of the clock signal that accompanies a bus to provide adequate phase and frequency information to connected devices, but without requiring a signaling bandwidth significantly higher than that of the accompanying bus, A differential clock accompanying a non-differential bus to accommodate the more demanding requirements of clock receivers as compared with data or address and control receivers, including, for example, use of differential signaling for a bus with a topology that permits a higher signaling bandwidth and/or use of non-differential signaling for a bus with a topology that limits the signaling bandwidth, Use of termination structures on a bus, including integrated termination structures, and active control circuitry to allow adjustment to different characteristic bus impedances and power-state control, including a calibration process to optimize the termination value, Use of slew rate control circuitry and transfer characteristic control circuitry in the predriver and driver of transmitter blocks to allow adjustment to different characteristic bus impedances and to allow adjustment for other bus properties, including a calibration process to optimize the such circuitry, and/or Memory component designed to prefetch (preaccess) words that are wider than the width of the data bus so that the memory access bandwidth approximately matches the transfer bandwidth, and memory component able to adjust the size of the prefetch (preaccess) word to accommodate connection to data buses of different width.

In accordance with an embodiment of the invention, wave-pipelining is implemented for an address bus coupled to a plurality of memory components. The plurality of memory components are configured according to coordinates relating to the address bus propagation delay and the data bus propagation delay. A timing signal associated with address and/or control signals which duplicates the propagation delay of these signals is used to coordinate memory operations. The address bus propagation delay, or common address bus propagation delay, refers to the delay for a signal to travel along an address bus between the memory controller component and a memory component. The data bus propagation delay refers to the delay for a signal to travel along a data bus between the memory controller component and a memory component.

According to one embodiment of the invention, a memory system includes multiple memory modules providing multiple ranks and multiple slices of memory components. Such a system can be understood with reference to FIG. 27. The memory system of FIG. 27 includes memory module 2703 and memory module 2730. Memory module 2703 includes a rank that includes memory components 2716-2618 and another rank that includes memory components 2744-2746.

The memory system is organized into slices across the memory controller component and the memory modules. The memory system of FIG. 27 includes a slice 2713 that includes a portion of memory controller 2702, a portion of memory module 2703 including memory components 2716 and 2744, and a portion of memory module 2730 including memory components 2731 and 2734. The memory system of FIG. 27 includes another slice 2714 that includes another portion of memory controller 2702, another portion of memory module 2703 including memory components 2717 and 2745, and another portion of memory module 2730 including memory components 2732 and 2735. The memory system of FIG. 27 further includes yet another slice 2715 that includes yet another portion of memory controller 2702, yet another portion of memory module 2703 including memory components 2718 and 2746, and yet another portion of memory module 2730 including memory components 2733 and 2736.

The use of multiple slices and ranks, which may be implemented using multiple modules, allows efficient interconnection of a memory controller and several memory components while avoiding degradation of performance that can occur when a data bus or address bus has a large number of connections to it. With a separate data bus provided for each slice, the number of connections to each data bus can be kept to a reasonable number. The separate data buses can carry different signals independently of each other. A slice can include one or more memory components per module. For example, a slice can include one memory component of each rank. Note that the term slice may be used to refer to the portion of a slice excluding the memory controller. In this manner, the memory controller can be viewed as being coupled to the slices. The use of multiple modules allows memory components to be organized according to their path lengths to a memory controller. Even slight differences in such path lengths can be managed according to the organization of the memory components into ranks. The organization of memory components according to ranks and modules allows address and control signals to be distributed efficiently, for example through the sharing of an address bus within a rank or module.

In one embodiment, a slice can be understood to include several elements coupled to a data bus. As one example, these elements can include a portion of a memory controller component, one or more memory components on one module, and, optionally, one or more memory components on another module. In one embodiment, a rank can be understood to include several memory components coupled by a common address bus. The common address bus may optionally be coupled to multiple ranks on the module or to multiple modules. The common address bus can connect a memory controller component to each of the slices of a rank in succession, thereby allowing the common address bus to be routed from a first slice of the rank to a second slice of the rank and from the second slice of the rank to a third slice of the rank. Such a configuration can simplify the routing of the common address bus.

For discussion purposes, a simplified form of a memory system is first discussed in order to illustrate certain concepts, whereas a more complex memory system that includes a plurality of modules and ranks is discussed later in the specification.

FIG. 1 is a block diagram illustrating a memory system having a single rank of memory components with which an embodiment of the invention may be implemented. Memory system 101 comprises memory controller component 102 and memory module 103. Address clock 104 provides an address clock signal that serves as a timing signal associated with the address and control signals that propagate along address bus 107. Address clock 104 provides its address clock signal along address clock conductor 109, which is coupled to memory controller component 102 and to memory module 103. The address and control signals are sometimes referred to as simply the address signals or the address bus. However, since control signals may routed according to a topology common to address signals, these terms, when used, should be understood to include address signals and/or control signals.

Write clock 105 provides a write clock signal that serves as a timing signal associated with the data signals that propagate along data bus 108 during write operations. Write clock 105 provides its write clock signal along write clock conductor 110, which is coupled to memory controller component 102 and memory module 103. Read clock 106 provides a read clock signal that serves as a timing signal associated with the data signals that propagate along data bus 108 during read operations. Read clock 106 provides its read clock signal along read clock conductor 111, which is coupled to memory controller component 102 and memory module 103.

Termination component 120 is coupled to data bus 108 near memory controller component 102. As one example, termination component 120 may be incorporated into memory controller component 102. Termination component 121 is coupled to data bus 108 near memory module 103. Termination component 121 is preferably incorporated into memory module 103. Termination component 123 is coupled to write clock conductor 110 near memory component 116 of memory module 103. Termination component 123 is preferably incorporated into memory module 103. Termination component 124 is coupled to read clock conductor 111 near memory controller component 102. As an example, termination component 124 may be incorporated into memory controller component 102. Termination component 125 is coupled to read clock conductor 111 near memory component 116 of memory module 103. Termination component 125 is preferably incorporated into memory module 103. The termination components may utilize active devices (e.g., transistors or other semiconductor devices) or passive devices (e.g. resistors, capacitors, or inductors). The termination components may utilize an open connection. The termination components may be incorporated in one or more memory controller components or in one or more memory components, or they may be separate components on a module or on a main circuit board.

Memory module 103 includes a rank 112 of memory components 116, 117, and 118. The memory module 103 is organized so that each memory component corresponds to one slice. Memory component 116 corresponds to slice 113, memory component 117 corresponds to slice 114, and memory component 118 corresponds to slice 115. Although not shown in FIG. 1, the specific circuitry associated with the data bus, write clock and associated conductors, and read clock and associated conductors that are illustrated for slice 113 is replicated for each of the other slices 114 and 115. Thus, although such circuitry has not been illustrated in FIG. 1 for simplicity, it is understood that such dedicated circuitry on a slice-by-slice basis is preferably included in the memory system shown.

Within memory module 103, address bus 107 is coupled to each of memory components 116, 117, and 118. Address clock conductor 109 is coupled to each of memory components 116, 117, and 118. At the terminus of address bus 107 within memory module 103, termination component 119 is coupled to address bus 107. At the terminus of address clock conductor 109, termination component 122 is coupled to address clock conductor 109.

In the memory system of FIG. 1, each data signal conductor connects one controller data bus node to one memory device data bus node. However, it is possible for each control and address signal conductor to connect one controller address/control bus node to an address/control bus node on each memory component of the memory rank. This is possible for several reasons. First, the control and address signal conductors pass unidirectional signals (the signal wavefront propagates from the controller to the memory devices). It is easier to maintain good signal integrity on a unidirectional signal conductor than on a bidirectional signal conductor (like a data signal conductor). Second, the address and control signals contain the same information for all memory devices. The data signals will be different for all memory devices. Note that there might be some control signals (such as write enable signals) which are different for each memory device —these are treated as unidirectional data signals, and are considered to be part of the data bus for the purposes of this distinction. For example, in some instances, the data bus may include data lines corresponding to a large number of bits, whereas in some applications only a portion of the bits carried by the data bus may be written into the memory for a particular memory operation. For example, a 16-bit data bus may include two bytes of data where during a particular memory operation only one of the two bytes is to be written to a particular memory device. In such an example, additional control signals may be provided along a similar path as that taken by the data signals such that these control signals, which control whether or not the data on the data bit lines is written, traverse the system along a path with a delay generally matched to that of the data such that the control signals use in controlling the writing of the data is aptly timed. Third, routing the address and control signals to all the memory devices saves pins on the controller and memory module interface.

As a result, the control and address signals will be propagated on wires that will be longer than the wires used to propagate the data signals. This enables the data signals to use a higher signaling rate than the control and address signals in some cases.

To avoid impairment of the performance of the memory system, the address and control signals may be wave-pipelined in accordance with an embodiment of the invention. The memory system is configured to meet several conditions conducive to wave-pipelining. First, two or more memory components are organized as a rank. Second, some or all address and control signals are common to all memory components of the rank. Third, the common address and control signals propagate with low distortion (e.g. controlled impedance). Fourth, the common address and control signals propagate with low intersymbol-interference (e.g. single or double termination).

Wave-pipelining occurs when Tbit<Twire, where the timing parameter Twire is defined to be the time delay for a wavefront produced at the controller to propagate to the termination component at the end of the wire carrying the signal, and the timing parameter Tbit is defined to be the time interval between successive pieces (bits) of information on the wire. Such pieces of information may represent individual bits or multiple bits encoded for simultaneous transmission. Wave-pipelined signals on wires are incident-wave sampled by receivers attached to the wire. This means that sampling will generally take place before the wavefront has reflected from the end of the transmission line (e.g., the wire).

It is possible to extend the applicability of the invention from a single rank to multiple ranks of memory components in several ways. First, multiple ranks of memory components may be implemented on a memory module. Second, multiple memory modules may be implemented in a memory system. Third, data signal conductors may be dedicated, shared, or "chained" to each module. Chaining involves allowing a bus to pass through one module, connecting with the appropriate circuits on that module, whereas when it exits that particular module it may then enter another module or reach termination. Examples of such chaining of conductors are provided and described in additional detail in FIGS. 29, 32, and 35 below. Fourth, common control and address signal conductors may be dedicated, shared, or chained to each module. Fifth, data signal conductors may be terminated transmission lines or terminated stubs on each module. For this discussion, transmission lines are understood to represent signal lines that have sufficient lengths such that reflections and other transmission line characteristics must be considered and accounted for in order to assure proper signal transmission over the transmission lines. In contrast, terminated stubs are understood to be of such limited length that the parasitic reflections and other transmission line characteristics associated with such stubs can generally be ignored. Sixth, common control and address signal conductors may be terminated transmission lines or terminated stubs on each module. Permitting the shared address and control signals to be wave-pipelined allows their signaling rate to be increased, thereby increasing the performance of the memory system.

Figure 2:
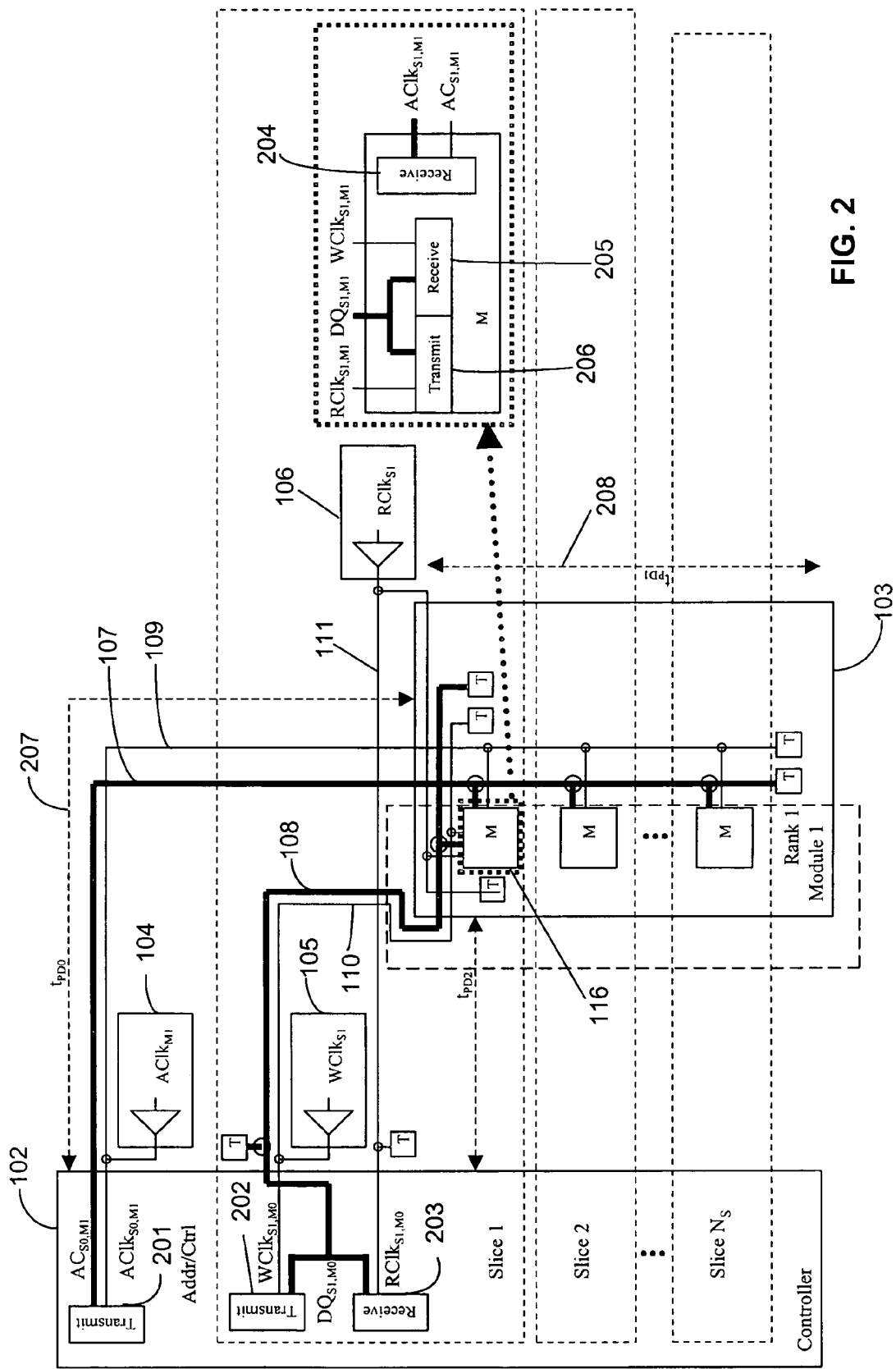
FIG. 2 is a block diagram illustrating clocking details for one slice of a rank of memory components of a memory system such as that illustrated in FIG. 1 in accordance with an embodiment of the invention.

FIG. 2 is a block diagram illustrating clocking details for one slice of a rank of memory components of a memory system such as that illustrated in FIG. 1 in accordance with an embodiment of the invention. The memory controller component 102 includes address transmit block 201, which is coupled to address bus 107 and address clock conductor 109. The memory controller component 102 also includes, on a per-slice basis, data transmit block 202 and data receive block 203, which are coupled to data bus 108. Data transmit block 202 is coupled to write clock conductor 110, and data receive block 203 is coupled to read clock conductor 111.

Within each memory component, such as memory component 116, an address receive block 204, a data receive block 205, and a data transmit block 206 are provided. The address receive block 204 is coupled to address bus 107 and address clock conductor 109. The data receive block 205 is coupled to data bus 108 and write clock conductor 110. The data transmit block 206 is coupled to data bus 108 and read clock conductor 111.

A propagation delay 207, denoted $t_{PD0}$, exists along address bus 107 between memory controller component 102 and memory module 103. A propagation delay 208, denoted $t_{PD1}$, exists along address bus 107 within memory module 103.

The basic topology represented in FIG. 2 has several attributes. It includes a memory controller. It includes a single memory module. It includes a single rank of memory components. It includes a sliced data bus (DQ), with each slice of wires connecting the controller to a memory component. It includes a common address and control bus (Addr/Ctrl or AC) connecting the controller to all the memory components. Source synchronous clock signals flow with data, control, and address signals. Control and address signals are unidirectional and flow from controller to memory components. Data signals are bidirectional and may flow from controller to memory components (write operation) or may flow from memory components to controller (read operation). There may be some control signals with the same topology as data signals, but which flow only from controller to memory components. Such signals may be used for masking write data in write operations, for example. These may be treated as unidirectional data signals for the purpose of this discussion. The data, address, control, and clock wires propagate with low distortion (e.g., along controlled impedance conductors). The data, address, control, and clock wires propagate with low inter-symbol interference (e.g., there is a single termination on unidirectional signals and double termination on bidirectional signals). These attributes are listed to maintain clarity. It should be understood that the invention is not constrained to be practiced with these attributes and may be practiced so as to include other system topologies.

In FIG. 2, there is a two dimensional coordinate system based on the slice number of the data buses and the memory components (S={0,1, . . . $N_S$}) and the module number (M={0,1}). Here a slice number of '0' and a module number of '0' refer to the controller. This coordinate system allows signals to be named at different positions on a wire. This coordinate system will also allow expansion to topologies with more than one memory rank or memory module.

FIG. 2 also shows the three clock sources (address clock 104, which generates the AClk signal, write clock 105, which generates the WClk signal, and read clock 106, which generates the RClk signal) which generate the clocking reference signals for the three types of information transfer. These clock sources each drive a clock wire that is parallel to the signal bus with which it is associated. Preferably, the positioning of the clock sources within the system is such that the physical position on the clock line at which the clock source drives the corresponding clock signal is proximal to the related driving point for the bus line such that the propagation of the clock for a particular bus generally tracks the propagation of the related information on the associated bus. For example, the positioning of the address clock (AClk clock 104) is preferably close to the physical position where the address signals are driven onto the address bus 107. In such a configuration, the address clock will experience similar delays as it propagates throughout the circuit as those delays experienced by the address signals propagating along a bus that follows generally the same route as the address clock signal line.

The clock signal for each bus is related to the maximum bit rate on the signals of the associated bus. This relationship is typically an integer or integer ratio. For example, the maximum data rate may be twice the frequency of the data clock signals. It is also possible that one or two of the clock sources may be "virtual" clock sources; the three clock sources will be in an integral-fraction-ratio (N/M) relationship with respect to one another, and any of them may be synthesized from either of the other two using phase-locked-loop (PLL) techniques to set the frequency and phase. Virtual clock sources represent a means by which the number of actual clock sources within the circuit can be minimized. For example, a WClk clock might be derived from an address clock (AClk) that is received by a memory device such that the memory device is not required to actually receive a WClk clock from an external source. Thus, although the memory device does not actually receive a unique, individually-generated WClk clock, the WClk clock generated from the AClk clock is functionally equivalent. The phase of a synthesized clock signal will be adjusted so it is the same as if it were generated by a clock source in the positions shown.

Any of the clock signals shown may alternatively be a non-periodic signal (a strobe control signal, for example) which is asserted only when information is present on the associated bus. As was described above with respect to clock sources, the non-periodic signal sources are preferably positioned, in a physical sense, proximal to the appropriate buses to which they correspond such that propagation delays associated with the non-periodic signals generally match those propagation delays of the signals on the buses to which they correspond.

Figure 3:
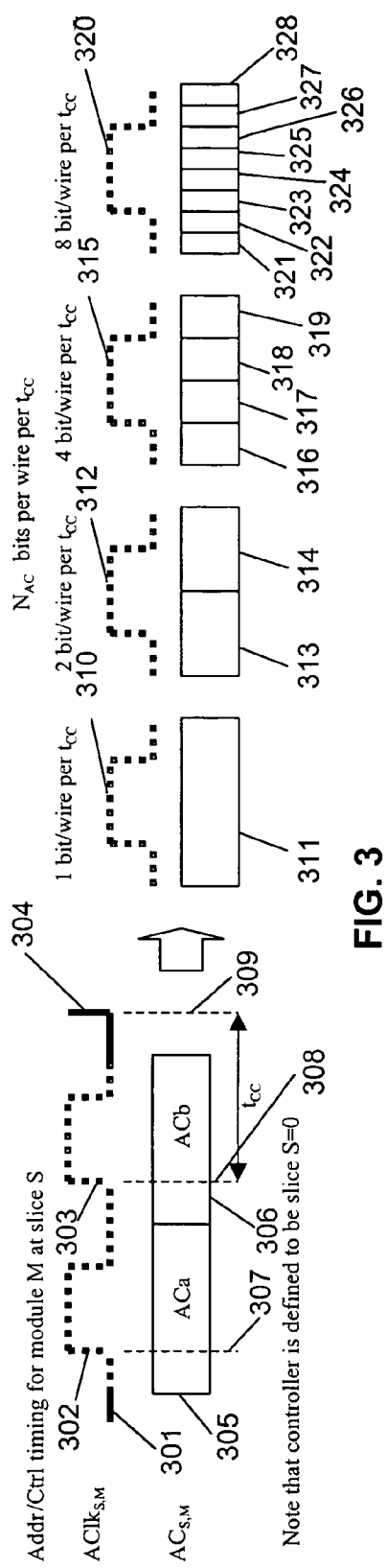
FIG. 3 is a timing diagram illustrating address and control timing notations used in timing diagrams of other Figures.

FIG. 3 is a timing diagram illustrating address and control timing notations used in timing diagrams of other Figures. In FIG. 3, a rising edge 302 of the AClk signal 301 occurs at a time 307 during transmission of address information ACa 305. A rising edge 303 of the AClk signal occurs at a time 308 during transmission of address S information ACb 306. Time 308 occurs at a time $t_{CC}$ before the time 309 of the next rising edge 304 of AClk signal 301. The time $t_{CC}$ represents a cycle time of a clock circuit of a memory controller component. Dashed lines in the timing diagrams are used to depict temporal portions of a signal coincident with address information or datum information. For example, the AClk signal 301 includes a temporal portion corresponding to the presence of address information ACa 305 and another temporal portion corresponding to the presence of address information ACb 306. Address information can be transmitted over an address bus as an address signal.

If one bit per wire occurs per $t_{CC}$, address bit 311 is transmitted during cycle 310. If two bits per wire occur per $t_{CC}$, address bits 313 and 314 are transmitted during cycle 312. If four bits per wire occur per $t_{CC}$, address bits 316, 317, 318, and 319 are transmitted during cycle 315. If eight bits per wire occur per $t_{CC}$, address bits 321, 322, 323, 324, 325, 326, 327, and 328 are transmitted during cycle 320. Note that the drive and sample points for each bit window may be delayed or advanced by an offset (up to one bit time, which is $t_{CC}/N_{AC}$), depending upon the driver and sampler circuit techniques used. The parameters $N_{AC}$ and $N_{DQ}$ represent the number of bits per $t_{CC}$ for the address/control and data wires, respectively. In one embodiment, a fixed offset is used. An offset between the drive/sample points and the bit windows should be consistent between the driving component and the sampling component. It is preferable that in a particular system, any offset associated with the drive point for a bus is consistent throughout the entire system. Similarly, any understood sampling offset with respect to the bus should also be consistent. For example, if data is expected to be driven at a point generally corresponding to a rising edge of a related clock signal for one data bus line, that understood offset (or lack thereof) is preferably consistently used for all data lines. Note that the offset associated with driving data onto the bus may be completely different than that associated with sampling data carried by the bus. Thus, continuing with the example above, the sample point for data driven generally coincident with a rising edge may be 180 degrees out of phase with respect to the rising edge such that the valid window of the data is better targeted by the sample point.

Figure 4:
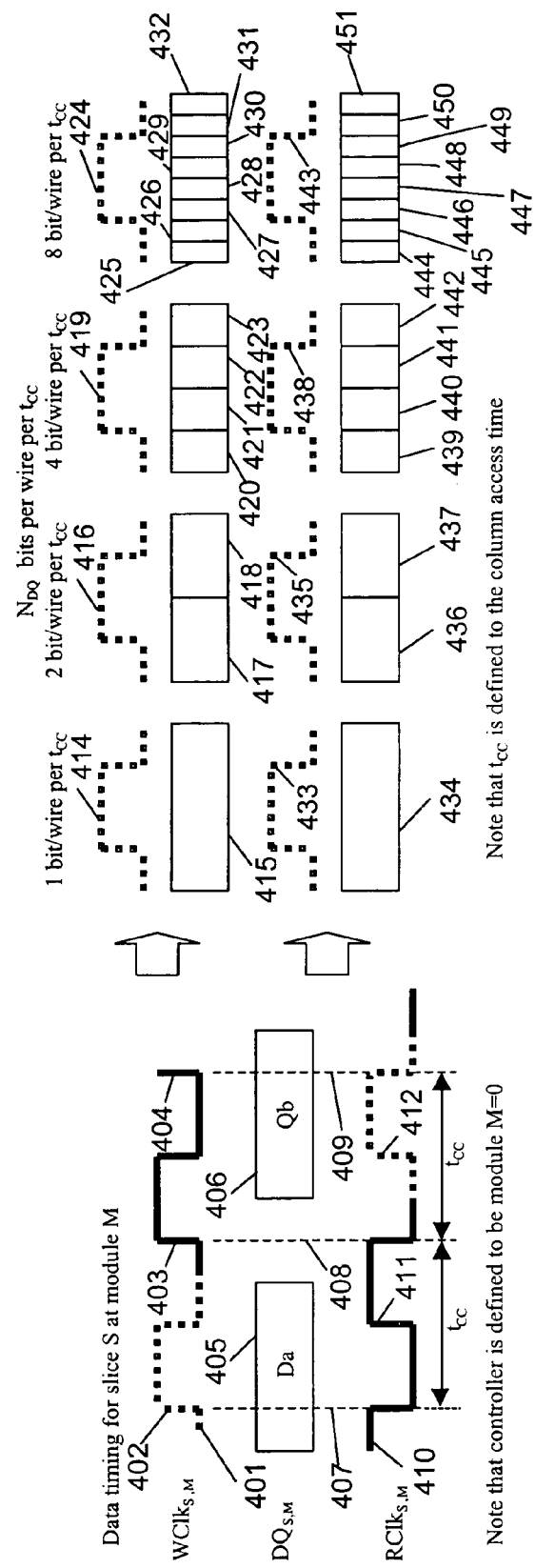
FIG. 4 is a timing diagram illustrating data timing notations used in timing diagrams of other Figures.

FIG. 4 is a timing diagram illustrating data timing notations used in timing diagrams of other Figures. In FIG. 4, a rising edge 402 of the WClk signal 401 occurs at a time 407 during transmission of write datum information Da 405. A rising edge 403 of the WClk signal 401 occurs at a time 408. A rising edge 404 of the WClk signal 401 occurs at a time 409 during transmission of read datum information Qb 406. Time 407 is separated from time 408 by a time $t_{CC}$, and time 408 is separated from time 409 by a time $t_{CC}$. The time $t_{CC}$ represents the duration of a clock cycle. RClk signal 410 includes rising edge 411 and rising edge 412. These rising edges may be used as references to clock cycles of RClk signal 410. For example, transmission of write datum information Da 405 occurs during a clock cycle of RClk signal 410 that includes rising edge 411, and transmission of read datum information Qb 406 occurs during a clock cycle of RClk signal 410 that includes rising edge 412. As is apparent to one of ordinary skill in the art, the clock cycle time associated with the address clock may differ from the clock cycle time associated with the read and/or write clocks.

Write datum information is an element of information being written and can be transmitted over a data bus as a write data signal. Read datum information is an element of information being read and can be transmitted over a data bus as a read data signal. As can be seen, the notation Dx is used to represent write datum information x, while the notation Qy is used to represent read datum information y. Signals, whether address signals, write data signals, read data signals, or other signals can be applied to conductor or bus for a period of time referred to as an element time interval. Such an element time interval can be associated with an event occurring on a conductor or bus that carries a timing signal, where such an event may be referred to as a timing signal event. Examples of such a timing signal include a clock signal, a timing signal derived from another signal or element of information, and any other signal from which timing may be derived. In a memory access operation, the time from when an address signal begins to be applied to an address bus to when a data signal corresponding to that address signal begins to be applied to a data bus can be referred to as an access time interval.

If one bit per wire occurs per $t_{CC}$, datum bit 415 is transmitted during cycle 414. If two bits per wire occur per $t_{CC}$, data bits 417 and 418 are transmitted during cycle 416. If four bits per wire occur per $t_{CC}$, data bits 420, 421, 422, and 423 are transmitted during cycle 419. If eight bits per wire occur per $t_{CC}$, data bits 425, 426, 427, 428, 429, 430, 431, and 432 are transmitted during cycle 424. Note that the drive and sample points for each bit window may be delayed or advanced by an offset (up to one bit time, which is $t_{CC}/N_{DQ}$), depending upon the driver and sampler circuit techniques used. In one embodiment, a fixed offset is used. An offset between the drive/sample points and the bit windows should be consistent between the driving component and the sampling component. For example, if the data window is assumed to be positioned such that data will be sampled on the rising edge of the appropriate clock signal at the controller, a similar convention should be used at the memory device such that valid data is assumed to be present at the rising edge of the corresponding clock at that position within the circuit as well.

If one bit per wire occurs per $t_{CC}$, datum bit 434 is transmitted during cycle 433. If two bits per wire occur per $t_{CC}$, data bits 436 and 437 are transmitted during cycle 435. If four bits per wire occur per $t_{CC}$, data bits 439, 440, 441, and 442 are transmitted during cycle 438. If eight bits per wire occur per $t_{CC}$, data bits 444, 445, 446, 447, 448, 449, 450, and 451 are transmitted during cycle 443. Note that the drive and sample points for each bit window may be delayed or advanced by an offset (up to one bit time, which is $t_{CC}/N_{DQ}$), depending upon the driver and sampler circuit techniques used. In one embodiment, a fixed offset is used. An offset between the drive/sample points and the bit windows should be consistent between the driving component and the sampling component. As stated above, it is preferable that in a particular system, any offset associated with the drive point or sampling point for a bus is consistent throughout the entire system.

The column cycle time of the memory component represents the time interval required to perform successive column access operations (reads or writes). In the example shown, the ACIk, RClk, and WClk clock signals are shown with a cycle time equal to the column cycle time. As is apparent to one of ordinary skill in the art, the cycle time of the clock signals used in the system may be different from the column cycle time in other embodiments.

Alternatively, any of the clocks could have a cycle time that is different than the column cycle time. The appropriate-speed clock for transmitting or receiving signals on a bus can always be synthesized from the clock that is distributed with the bus as long as there is an integer or integral-fraction-ratio between the distributed clock and the synthesized clock. As mentioned earlier, any of the required clocks can be synthesized from any of the distributed clocks from the other buses.

This discussion will assume a single bit is sampled or driven on each wire during each $t_{CC}$ interval in order to keep the timing diagrams as simple as possible. However, the number of bits that are transmitted on each signal wire during each $t_{CC}$ interval can be varied. The parameters $N_{AC}$ and $N_{DQ}$ represent the number of bits per $t_{CC}$ for the address/control and data wires, respectively. The distributed or synthesized clock is multiplied up to create the appropriate clock edges for driving and sampling the multiple bits per $t_{CC}$. Note that the drive and sample points for each bit window may be delayed or advanced by an offset (up to one bit time, which is $t_{CC}/N_{AC}$ or $t_{CC}/N_{DQ}$), depending upon the driver and sampler circuit techniques used. In one embodiment, a fixed offset is used. An offset between the drive/sample points and the bit windows should be consistent between the driving component and the sampling component. Once again, as stated above, it is preferable that in a particular system, any offset associated with the drive point or sampling point for a bus is consistent throughout the entire system.

Figure 5:
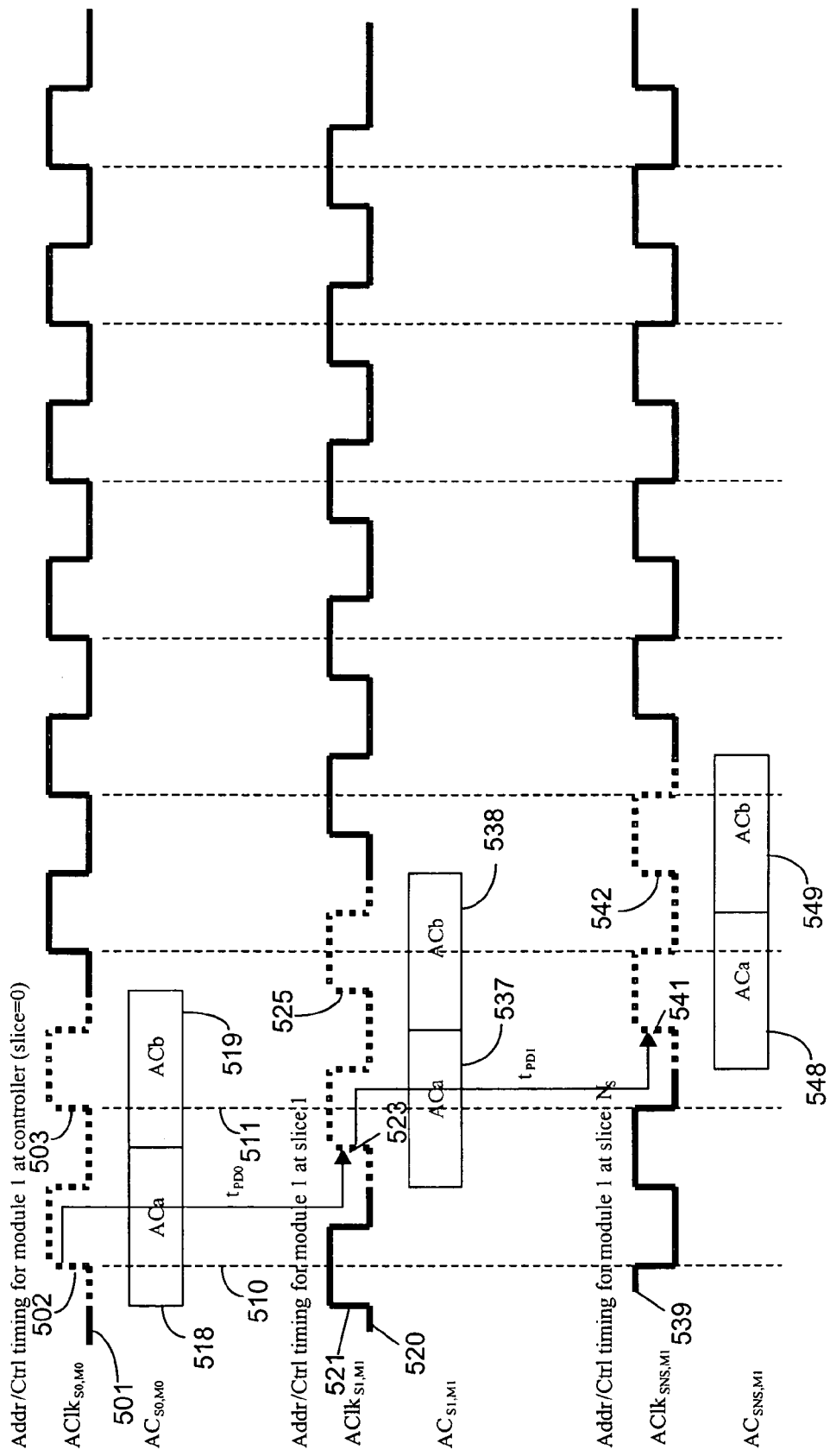
FIG. 5 is a timing diagram illustrating timing of signals communicated over the address and control bus (Addr/Ctrl or $AC_{S,M}$) in accordance with an embodiment of the invention.

FIG. 5 is a timing diagram illustrating timing of signals communicated over the address and control bus (Addr/Ctrl or $AC_{S,M}$) in accordance with an embodiment of the invention. This bus is accompanied by a clock signal $AClk_{S,M}$ which sees essentially the the bus (the point at which data signals, address signals, and/or control signals are applied to the bus) may have an offset from what is shown (relative to the rising and falling edges of the clock)—this will depend upon the design of the transmit and receive circuits in the controller and memory components. In one embodiment, a fixed offset is used. An offset between the drive/sample points and the bit windows should be consistent between the driving component and the sampling component. As reiterated above, it is preferable that in a particular system, any offset associated with the drive point or sampling point for a bus is consistent throughout the entire system.

It should be noted in FIG. 5 is that there is a delay $t_{PD0}$ in the clock $AClk_{S,M}$ and bus $AC_{S,M}$ as they propagate from the controller to the first slice. As indicated, AClk signal 520 is shifted in time and space from AClk signal 501. Also note that there is a second delay $t_{PD1}$ in the clock $AClk_{S,M}$ and bus $AC_{S,M}$ as they propagate from the first slice to the last slice $N_S$. There will be a delay of $t_{PD1}/(N_S-1)$ as the clock and bus travel between each slice. Note that this calculation assumes generally equal spacing between the slices, and, if such physical characteristics are not present in the system, the delay will not conform to this formula. Thus, as indicated, AClk signal 539 is shifted in time and space from AClk signal 520. As a result, the $N_S$ memory components will each be sampling the address and control bus at slightly different points in time.

Figure 6:
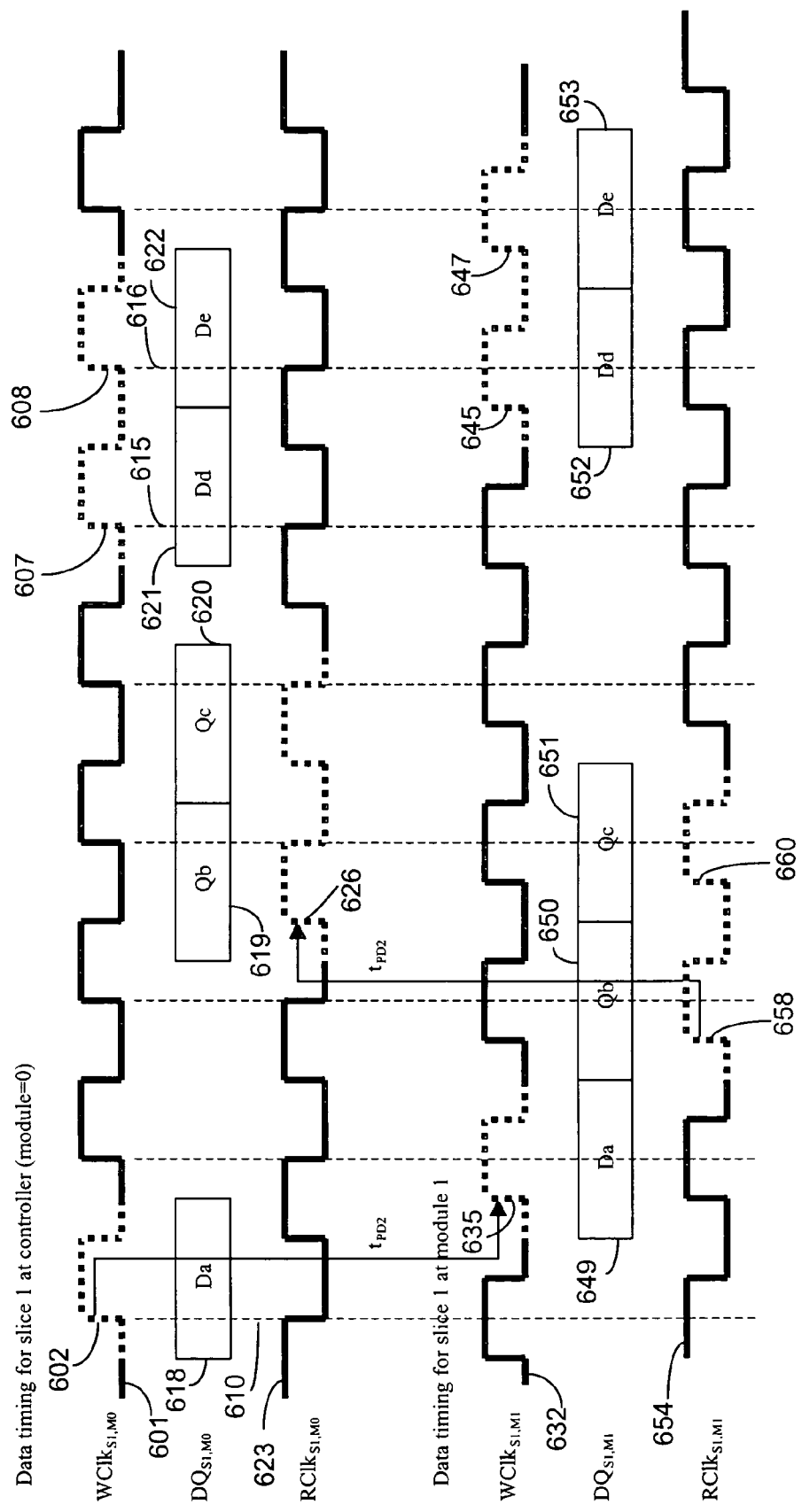
FIG. 6 is a timing diagram illustrating timing of signals communicated over the data bus ($DQ_{S,M}$) in accordance with an embodiment of the invention.

FIG. 6 is a timing diagram illustrating timing of signals communicated over the data bus ($DQ_{S,M}$) in accordance with an embodiment of the invention. This bus is accompanied by two clock signals $RClk_{S,M}$ and $WClk_{S,M}$ which see essentially the same wire path as the bus. The subscripts (S,M) indicate the bus or clock signal at a particular module M and a particular slice S. The controller is defined to be module zero. The two clocks travel in opposite directions. $WClk_{S,M}$ accompanies the write data which is transmitted by the controller and received by the memory components. $RClk_{S,M}$ accompanies the read data which is transmitted by the memory components and received by the controller. In the example described, read data (denoted by "Q") and write data (denoted by "D") do not simultaneously occupy the data bus. Note that in other embodiments, this may not be the case where additional circuitry is provided to allow for additive signaling such that multiple waveforms carried over the same conductor can be distinguished and resolved.

The waveform of WClk clock signal 601 depicts the timing of the WClk clock signal at the memory controller component. Rising edge 602 occurs at time 610 and is associated with write datum information Da 618, which is present at slice one of module zero. Rising edge 607 occurs at time 615, and is associated with write datum information Dd 621, which is present at slice one of module zero. Rising edge 608 occurs at time 616, and is associated with write datum De 622, which is present at slice one of module zero.

The waveform of RClk clock signal 623 depicts the timing of the RClk clock signal at the memory controller component (at module zero). Rising edge 626 is associated with read datum information Qb 619, which is present at the memory controller component (at slice one of module zero). Rising edge is associated with read datum information Qc 620, which is present at the memory controller component (at slice one of module zero).

The waveform of WClk clock signal 632 depicts the timing of the WClk clock signal at the memory component at slice one of module one. Rising edge 635 is associated with write datum information Da 649, which is present at slice one of module one. Rising edge 645 is associated with write datum information Dd 652, which is present at slice one of module one. Rising edge 647 is associated with write datum information De 653, which is present at slice one of module one.

The waveform of RClk clock signal 654 depicts the timing of the RClk clock signal at the memory component of slice one of module one. Rising edge 658 is associated with read datum information Qb 650, which is present at slice one of module one. Rising edge 660 is associated with read datum information Qd 651, which is present at slice one of module one.

The clock signals are shown with a cycle time that corresponds to $t_{CC}$. As previously mentioned, they could also have a shorter cycle time as long as the frequency and phase are constrained to allow the controller and memory components to generate the necessary timing points for sampling and driving the information on the bus. Likewise, the bus is shown with a single bit per wire. As previously mentioned, more than one bit could be transferred in each $t_{CC}$ interval since the controller and memory components are able to generate the necessary timing points for sampling and driving the information on the bus. Note that the actual drive point for the bus may have an offset from what is shown (relative to the rising and falling edges of the clock)—this will depend upon the design of the transmit and receive circuits in the controller and memory components. In one embodiment, a fixed offset is used. An offset between the drive/sample points and the bit windows should be consistent between the driving component and the sampling component.

It should be noted in FIG. 6 is that there is a delay $t_{PD2}$ in the clock $WClk_{S,M}$ and bus $DQ_{S,M}$ (with the write data) as they propagate from the controller to the slices of the first module. Thus, WClk clock signal 632 is shifted in time and space from WClk clock signal 601. Also note that there is an approximately equal delay $t_{PD2}$ in the clock $RClk_{S,M}$ and bus $DQ_{S,M}$ (with the read data) as they propagate from the slices of the first module to the controller. Thus, RClk clock signal 623 is shifted in time and space from RClk clock signal 654.

As a result, the controller and the memory components must have their transmit logic coordinated so that they do not attempt to drive write data and read data at the same time. The example in FIG. 6 shows a sequence in which there are write-read-read-write-write transfers. It can be seen that read-read and write-write transfers may be made in successive $t_{CC}$ intervals, since the data in both intervals is traveling in the same direction. However, gaps (bubbles) are inserted at the write-read and read-write transitions so that a driver only turns on when the data driven in the previous interval is no longer on the bus (it has been absorbed by the termination components at either end of the bus wires).

In FIG. 6, the read clock $RClk_{S,M}$ and the write clock $WClk_{S,M}$ are in phase at each memory component (however the relative phase of these clocks at each memory component will be different from the other memory components—this will be shown later when the overall system timing is discussed). Note that this choice of phase matching is one of several possible alternatives that could have been used. Some of the other alternatives will be described later.

As a result of matching the read and write clocks at each memory component (slice), the $t_{CC}$ intervals with read data Qb 650 will appear to immediately follow the $t_{CC}$ intervals with write data Da 649 at the memory components (bottom of FIG. 6), but there will be a gap of $2*t_{PD2}$ between the read data interval Qb 619 and write data interval Da 618 at the controller (top of FIG. 6). There will be a second gap of ($2*t_{CC}$-$2*t_{PD2}$) between the read data Qc 620 and the write data Dd 621 at the controller. T. here will be a gap of ($2*t_{CC}$) between the read data Qc 651 and the write data Dd 621. Note that the sum of the gaps at the memory components and the controller will be $2*t_{CC}$.

The overall system timing will be described next. The example system phase aligns the $AClk_{S,M}$, $RClk_{S,M}$, and $WClk_{S,M}$ clocks at each memory component (the slice number varies from one through $N_S$, and the module number is fixed at one). This has the benefit of allowing each memory component to operate in a single clock domain, avoiding any domain crossing issues. Because the address and control clock $AClk_{S,M}$ flows past each memory component, the clock domain of each memory slice will be offset slightly from the adjacent slices. The cost of this phasing decision is that the controller must adjust the read and write clocks for each slice to different phase values this means there will be $1+(2*N_S)$ clock domains in the controller, and crossing between these domains efficiently becomes very important. Other phase constraints are possible and will be discussed later.

Figure 7:
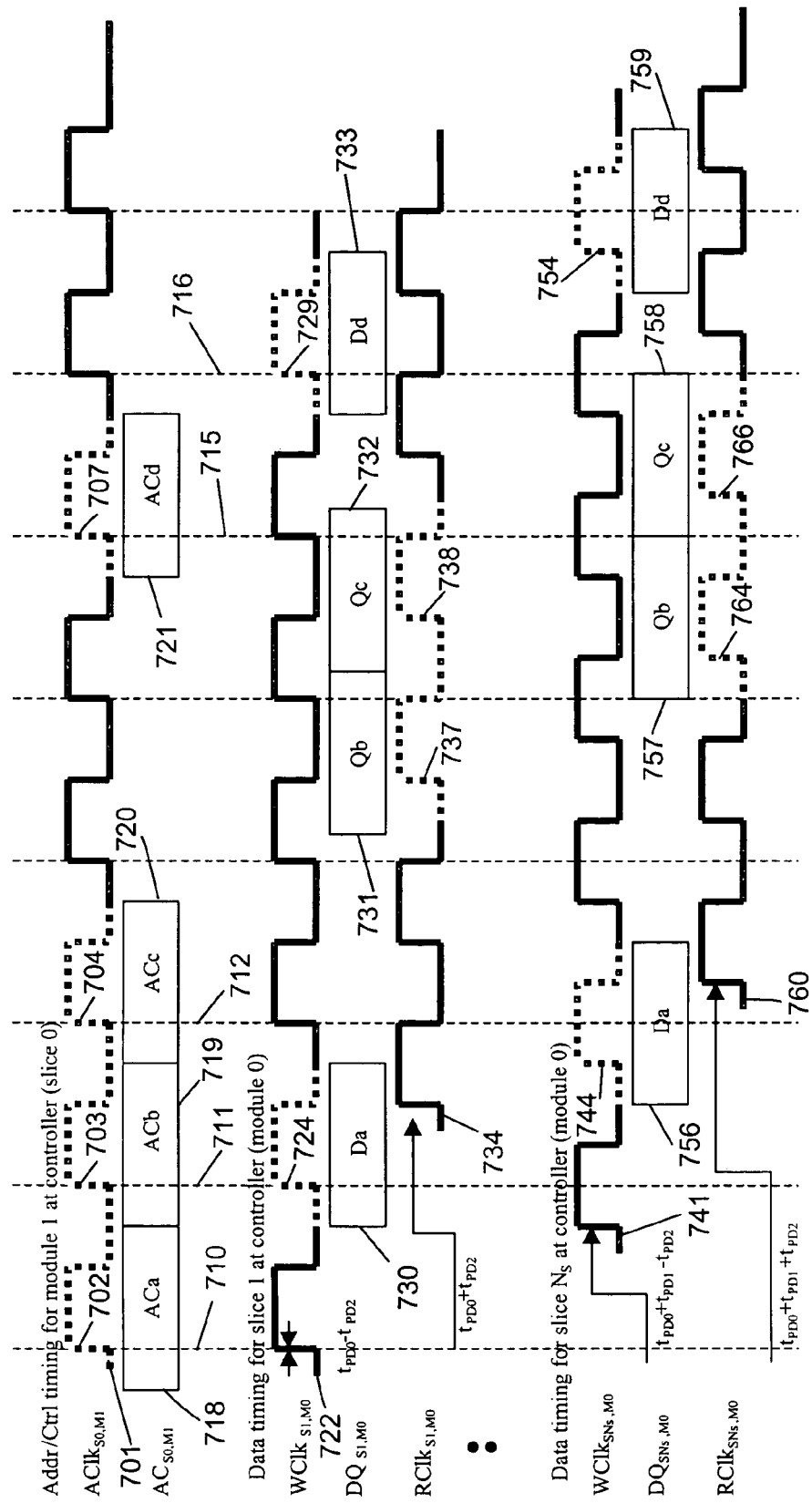
FIG. 7 is a timing diagram illustrating system timing at a memory controller component in accordance with an embodiment of the invention.

FIG. 7 is a timing diagram illustrating system timing at a memory controller component in accordance with an embodiment of the invention. As before, the controller sends a write-read-read-write sequence of operations on the control and address bus $AClk_{S0,M1}$. The Da write datum information is sent on the $WClk_{S1,M0}$ and $WClk_{SNs,M0}$ buses so that it will preferably arrive at the memory component of each slice one cycle after the address and control information ACa. This is done by making the phase of the $WClk_{S1,M0}$ clock generally equivalent to ($t_{PD0}$-$t_{PD2}$) relative to the phase of the $AClk_{S0,M1}$ clock (positive means later, negative means earlier). This will cause them to be in phase at the memory component of the first slice of the first module. Likewise, the phase of the $WClk_{SNs,M0}$ clock is adjusted to be generally equivalent to ($t_{PD0}$+$t_{PD1}$-$t_{PD2}$) relative to the phase of the $AClk_{S0,M1}$ clock. Note that some tolerance is preferably built into the system such that the phase adjustment of the clock to approximate the propagation delays can vary slightly from the desired adjustment while still allowing for successful system operation.

In a similar fashion, the phase of the $RClk_{S1,M0}$ clock is adjusted to be generally equivalent to ($t_{PD0}$+$t_{PD2}$) relative to the phase of the $AClk_{S0,M1}$ clock. This will cause them to be in phase at the memory component of the last slice of the first module. Likewise, the phase of the $RClk_{SNs,M0}$ clock is adjusted according to the expression ($t_{PD0}$+$t_{PD1}$+$t_{PD2}$) relative to the phase of the $AClk_{S0,M1}$ clock to cause the $RClk_{SNs,M0}$ clock and the $AClk_{S0,M1}$ clock to be in phase at the memory component of the last slice of the first module.

The waveform of AClk clock signal 701 depicts the AClk clock signal at the memory controller component, which is denoted as being at slice zero. Rising edge 702 occurs at time 710 and is associated with address information ACa 718, which is present at slice zero. Rising edge 703 occurs at time 711 and is associated with address information ACb 719, which is present at slice zero. Rising edge 704 occurs at time 712 and is associated with address information ACc 720, which is present at slice zero. Rising edge 707 occurs at time 715 and is associated with address information ACd 721, which is present at slice zero.

The waveform of WClk clock signal 722 depicts the WClk clock signal for the memory component at slice one when that WClk clock signal is present at the memory controller component at module zero. Rising edge 724 occurs at time 711 and is associated with write datum information Da 730, which is present. Rising edge 729 occurs at time 716 and is associated with write datum information Dd 733, which is present.

The waveform of RClk clock signal 734 depicts the RClk clock signal for the memory component of slice one when that RClk clock signal is present at the memory controller component at module zero. Rising edge 737 is associated with read datum information Qb 731, which is present. Rising edge 738 is associated with read datum information Qc 732, which is present.

The waveform of WClk clock signal 741 depicts the WClk clock signal for the memory component at slice $N_S$ when that WClk clock signal is present at the memory controller component at module zero. Write datum information Da 756 is associated with edge 744 of signal 741. Write datum information Dd 759 is associated with edge 754 of signal 741.

The waveform of RClk clock signal 760 depicts the RClk clock signal for the memory component at slice $N_S$ when that RClk clock signal is present at the memory controller component at module zero. Read datum information Qb 757 is associated with edge 764 of signal 760. Read datum information Qc 758 is associated with edge 766 of signal 760.

Figure 8:
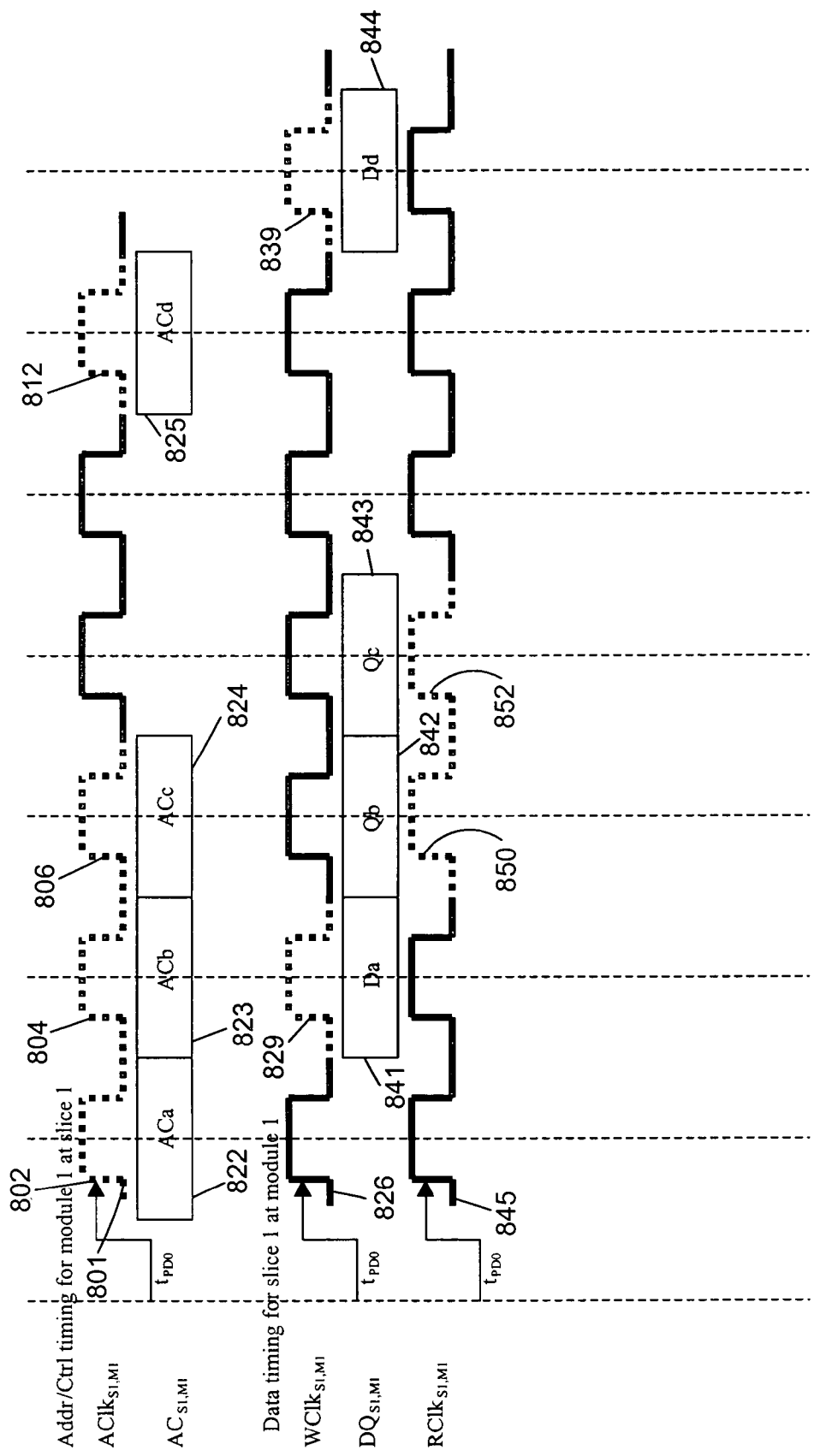
FIG. 8 is a timing diagram illustrating alignment of clocks $AClk_{S1,M1}$, $WClk_{S1,M1}$, and $RClk_{S1,M1}$ at the memory component in slice 1 of rank 1 in accordance with an embodiment of the invention.

FIG. 8 is a timing diagram illustrating alignment of clocks $AClk_{S1,M1}$, $WClk_{S1,M1}$, and $RClk_{S1,M1}$ at the memory component in slice 1 of rank 1 in accordance with an embodiment of the invention. All three clocks are delayed by $t_{PD0}$ relative to the $AClk_{S0,M1}$ clock produced at the controller.

The waveform of AClk clock signal 801 depicts the AClk clock signal for the memory component at slice one of module one. Address information ACa 822 is associated with edge 802 of signal 801. Address information ACb 823 is associated with edge 804 of signal 801. Address information ACc 824 is associated with edge 806 of signal 801. Address information ACd 825 associated with edge 812 of signal 801.

The waveform of WClk clock signal 826 depicts the WClk clock signal for the memory component at slice one of module one. Write datum information Da 841 is associated with edge 829 of signal 826. Write datum information Dd 844 is associated with edge 839 of signal 826.

The waveform of RClk clock signal 845 depicts the RClk clock signal for the memory component at slice one of module one. Read datum information Qb 842 is associated with edge 850 of signal 845. Read datum information Qc 843 is associated with edge 852 of signal 845.

Figure 9:
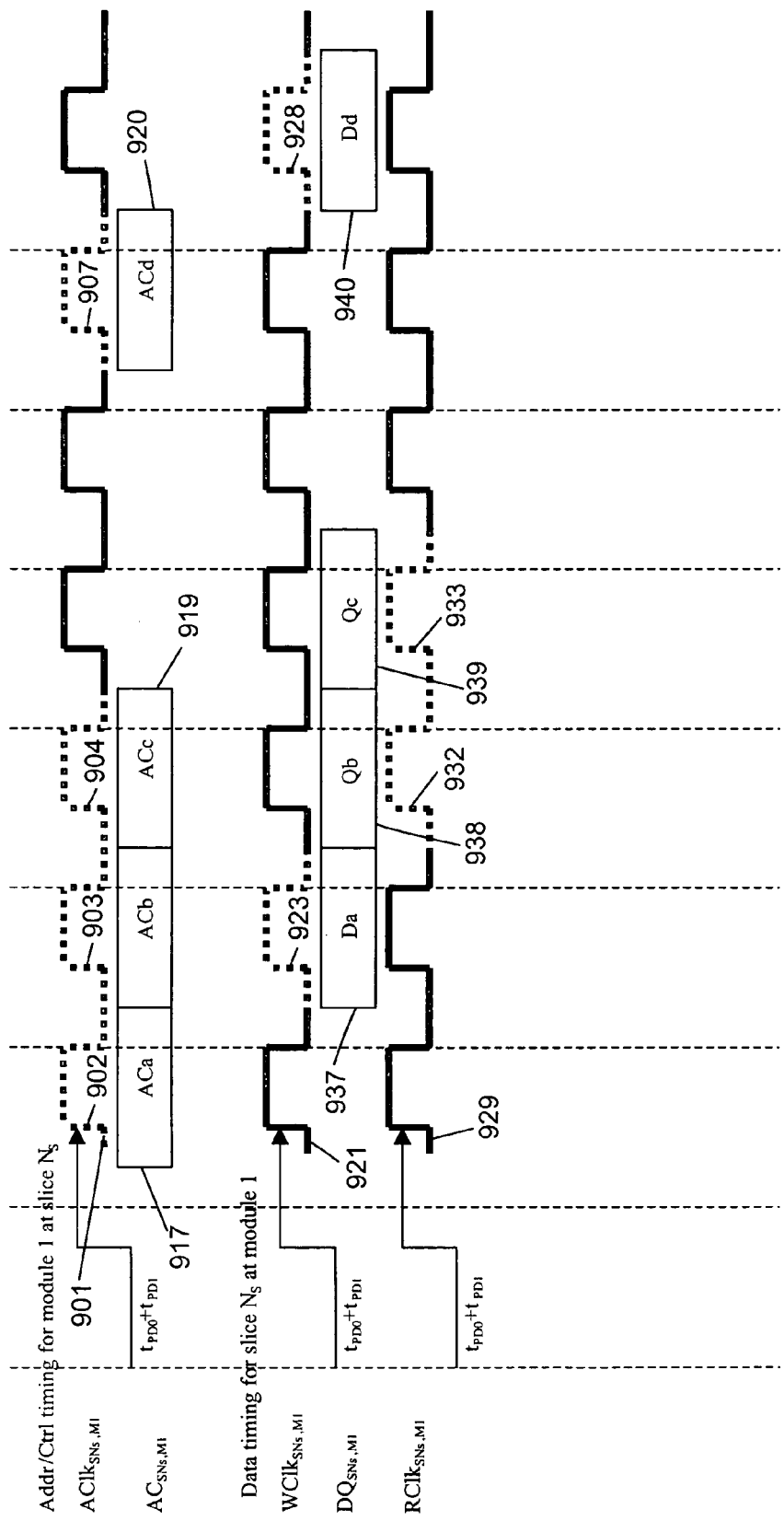
FIG. 9 is a timing diagram illustrating alignment of clocks $AClk_{SNs,M1}$, $WClk_{SNs,M1}$, and $RClk_{SNs,M1}$ at the memory component in slice $N_S$ of rank 1 in accordance with an embodiment of the invention.

FIG. 9 is a timing diagram illustrating alignment of clocks $AClk_{SNs,M1}$, $WClk_{SNs,M1}$, and $RClk_{SNs,M1}$ at the memory component in slice $N_S$ of rank one of module one in accordance with an embodiment of the invention. All three clocks are delayed by $(t_{PD0}+t_{PD1})$ relative to the $AClk_{S0,M1}$ clock produced at the controller.

The waveform of AClk clock signal 901 depicts the AClk clock signal for the memory component at slice $N_S$ at module one. Rising edge 902 of signal 901 is associated with address information ACa 917. Rising edge 903 of signal 901 is associated with address information ACb. Rising edge 904 of signal 901 is associated with address information ACc 919. Rising edge 907 of signal 901 is associated with address information ACd 920.

Figure 10:
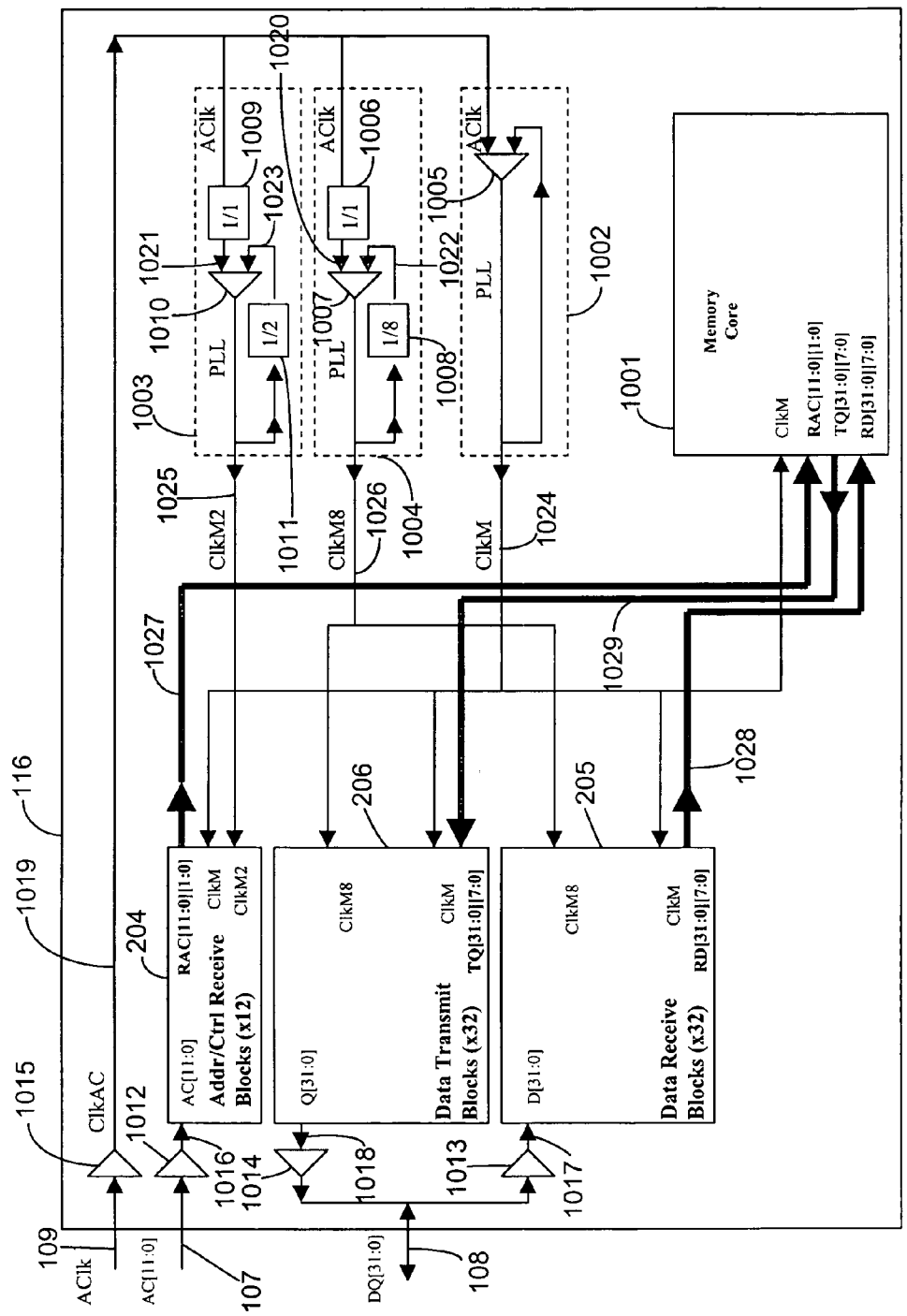
FIG. 10 is a block diagram illustrating further details for one slice of a rank of memory components of a memory system such as that illustrated in FIG. 1 in accordance with an embodiment of the invention.

The waveform of WClk clock signal 921 depicts the WClk clock signal for the memory component at slice $N_S$ at module one. Rising edge 923 of signal 921 is information for the system). Note that FIG. 10 shows all 32 bits of the DQ bus connecting to the memory rank—these 32 bits are divided up into multiple, equal-sized slices and each slice of the bus is routed to one memory component. Thus, slices are defined based on portions of the DQ bus routed to separate memory components. The example shown in FIG. 10 illustrates a memory component, or device, that supports the entire set of 32 data bits for a particular example system. In other embodiments, such a system may include two memory devices, where each memory device supports half of the 32 data bits. Thus, each of these memory devices would include the appropriate data transmit blocks, data receive blocks, and apportionment of memory core such that they can individually support the portion of the overall data bus for which they are responsible. Note that the number of data bits need not be 32, but may be varied.

The AClk signal is the clock which accompanies the AC bus. It is received and is used as a frequency and phase reference for all the clock signals generated by the memory component. The other clocks are ClkM2, ClkM8, and ClkM. These are, respectively, 2×, 8×, and 1× the frequency of AClk. The rising edges of all clocks are aligned (no phase offset).

The frequency and phase adjustment is typically done with some type of phase-locked-loop (PLL) circuit, although other techniques are also possible. A variety of different suitable PLL circuits are well known in the art. The feedback loop includes the skew of the clock drivers needed to distribute the various clocks to the receive and transmit blocks as well as the memory core. The memory core is assumed to operate in the ClkM domain.

Memory component 116 comprises memory core 1001, PLL 1002, PLL 1003, and PLL 1004. AClk clock signal 109 is received by buffer 1015, which provides clock signal 1019 to PLLs 1002, 1003, and 1004. Various PLL designs are well known in the art, however some PLLs implemented in the example embodiments described herein require minor customization to allow for the specific functionality desired. Therefore, in some embodiments described herein, the particular operation of the various blocks within the PLL are described in additional detail. Thus, although some of the PLL constructs included in the example embodiments described herein are not described in extreme detail, it is apparent to one of ordinary skill in the art that the general objectives to be achieved by such PLLs are readily recognizable through a variety of circuits well known to those skilled in the art. PLL 1002 includes phase comparator and voltage controlled oscillator (VCO) 1005. PLL 1002 provides clock signal ClkM 1024 to memory core 1001, address/control receive block 204, data receive block 205, and data transmit block 206.

PLL 1003 comprises prescaler 1009, phase comparator and VCO 1010, and divider 1011 Prescaler 1009 may be implemented as a frequency divider (such as that used to implement divider 1011) and provides a compensating delay with no frequency division necessary. Prescaler 1009 provides a signal 1021 to phase comparator and VCO 1010. The phase comparator in VCO 1010 is represented as a triangle having two inputs and an output. The functionality of the phase comparator 1010 is preferably configured such that it produces an output signal that ensures that the phase of the feedback signal 1023, which is one of its inputs, is generally phase aligned with a reference signal 1021. This convention is preferably applicable to similar structures included in other PLLs described herein. Divider 1011 provides a feedback signal 1023 to phase comparator and VCO 1010. PLL 1003 provides clock signal ClkM2 1025 to address/control receive block 204.

PLL 1004 comprises prescaler 1006, phase comparator and VCO 1007, and divider 1008. Prescaler 1006 may be implemented as a frequency divider (such as that used to implement divider 1011) and provides a compensating delay with no frequency division necessary. Prescaler 1006 provides a signal 1020 to phase comparator and VCO 1007. Divider 1008 provides a feedback signal 1022 to phase comparator and VCO 1007. PLL 1004 provides clock signal ClkM8 1026 to data receive block 205 and data transmit block 206.

The address bus 107 is coupled via buffers 1012 to address/control receive block 204 via coupling 1016. The data outputs 1018 of data transmit block 206 are coupled to data bus 108 via buffers 1014. The data bus 108 is coupled to data inputs 1017 of data receive block 205 via buffers 1013.

Address/control receive block 204 provides address information to the memory core 1001 via internal address bus 1027. Data receive blocks 205 provides write data to memory core 1001 via internal write data bus 1028. Memory core 1001 provides read data to data transmit blocks 206 via internal read data bus 1029.

Figure 11:
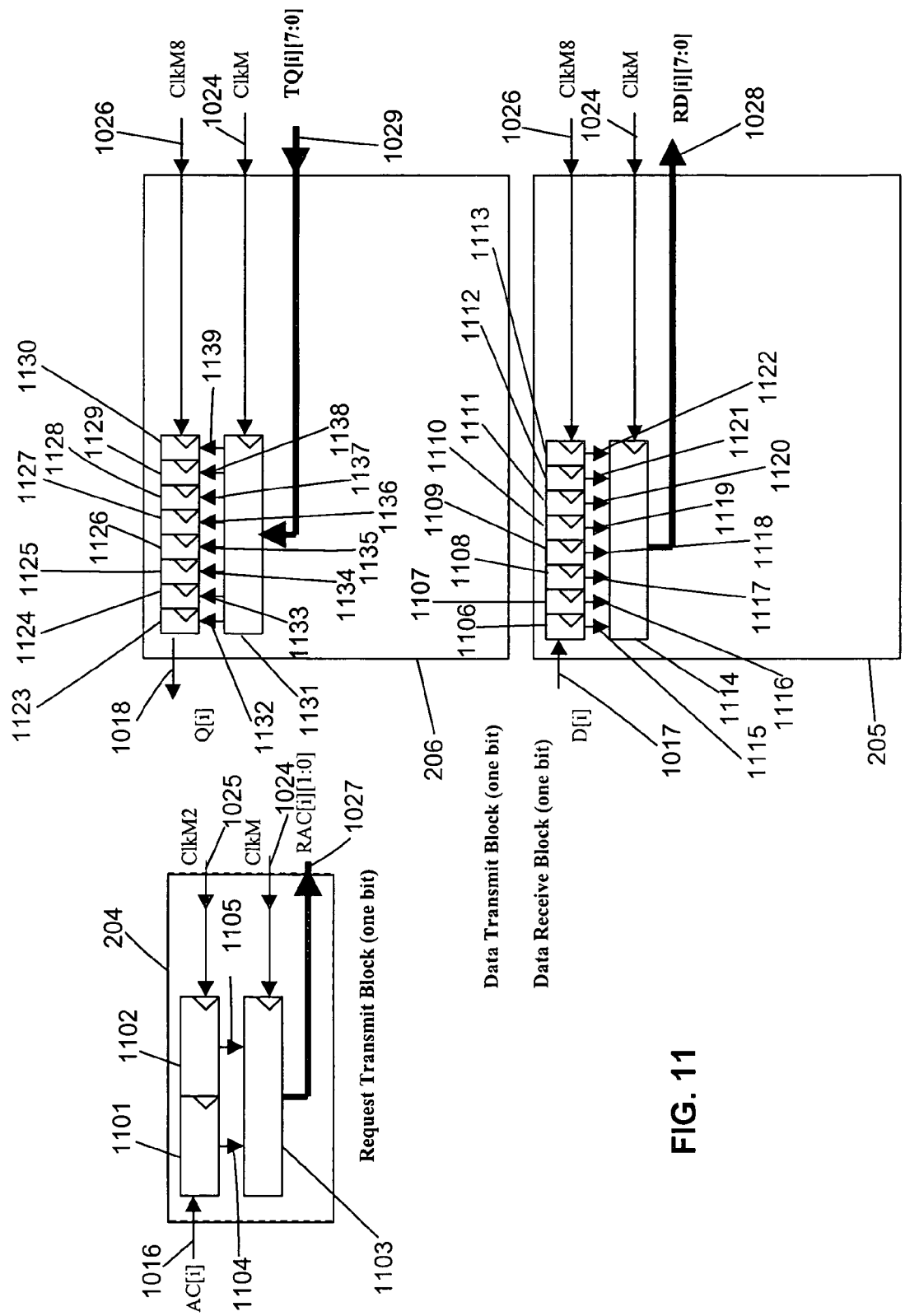
FIG. 11 is a block diagram illustrating the clocking elements of one slice of a rank of the memory components of a memory system such as that illustrated in FIG. 1 in accordance with an embodiment of the invention.

FIG. 11 is a block diagram illustrating logic used in the receive and transmit blocks of FIG. 10 in accordance with an embodiment of the invention. In this Figure, for clarity, the elements for only one bit of each bus are illustrated. It is understood that such elements may be replicated for each bit of the bus.

Address/control receive block 204 comprises registers 1101, 1102, and 1103. Address bus conductor 1016 is coupled to registers 1101 and 1102, which together form a shift register, and which are clocked by ClkM2 clock signal 1025 and coupled to register 1103 via couplings 1104 and 1105, respectively. Register 1103 is clocked by ClkM clock signal 1024 and provides address/control information to internal address bus 1027. The representation of registers 1101 and 1102 in FIG. 11 is preferably understood to imply that they form a shift register such that data entering register 1101 during one cycle is transferred into register 1102 during the subsequent cycle as new data enters register 1101. In the particular embodiment shown in FIG. 11, the movement of data is controlled by the clock signal ClkM2 1025. Thus, if clock ClkM2 1025 operates at twice the frequency of clock ClkM 1024, the receive block 204 generally operates as a serial-to-parallel shift register, where two consecutive serial bits are grouped together in a two-bit parallel format before being output onto signal lines RAC 1027. Thus, other similar representations in the figures where a number of registers are grouped together in a similar configuration preferably are understood to include the interconnections required to allow data to be serially shifted along the path formed by the registers. Examples include the registers 1123-1130 included in transmit block 206 and the registers 1106-upon the circuit implementation of the driver and sampler logic. There may be small offsets to account for driver or sampler delay. There may also be small offsets to account for the exact position of the bit valid windows on the AC and DQ buses relative to the ClkM clock.

Note also that in the memory component, the ClkM2 or ClkM8 clocks could be replaced by two or eight clocks each with a cycle time of $t_{CC}$, but offset in phase in equal increments across the entire $t_{CC}$ interval. The serial register, which in transmit block 204 includes registers 1101-1102, in transmit block 206 includes registers 1123-1130, and in data receive block 205 includes registers 1106-1113, would be replaced by a block of two or eight registers, each register loaded with a different clock signal so that the bit windows on the AC and DQ buses are properly sampled or driven. For example, in the transmit block 204, two individual registers would be included, where one register is clocked by a first clock signal having a particular phase and the second register is clocked by a different clock signal having a different phase, where the phase relationship between these two clock signals is understood such that the equivalent serial-to-parallel conversion can be achieved as that described in detail above. Another possibility is to use level-sensitive storage elements (latches) instead of edge sensitive storage elements (registers) so that the rising and falling edges of a clock signal cause different storage elements to be loaded.

Regardless of how the serialization is implemented, there are multiple bit windows per $t_{CC}$ interval on each wire, and multiple clock edges per $t_{CC}$ interval are created in the memory component in order to properly drive and sample these bit windows.

Figure 12:
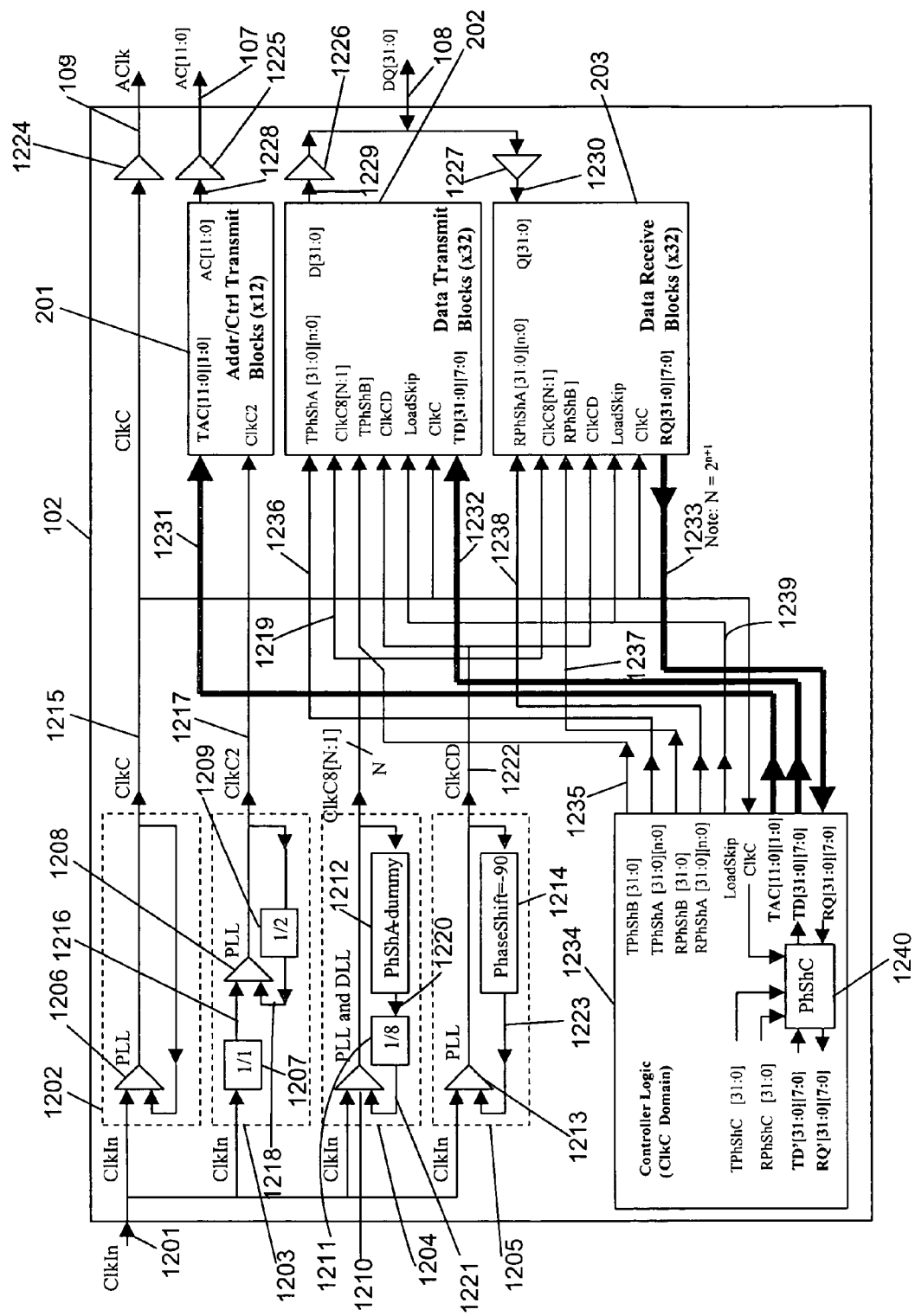
FIG. 12 is a block diagram illustrating details for the memory controller component of a memory system such as that illustrated in FIG. 1 in accordance with an embodiment of the invention.

FIG. 12 is a block diagram illustrating details for the memory controller component of a memory system such as that illustrated in FIG. 1 in accordance with an embodiment of the invention. The memory controller component 102 comprises PLLs 1202, 1203, 1204, and 1205, address/control transmit blocks 201, data transmit blocks 202, data receive blocks 203, and controller logic core 1234. PLL 1202 comprises phase comparator and VCO 1206. PLL 1202 receives ClkIn clock signal 1201 and provides ClkC clock signal 1215 to controller logic core 1234 and to buffer 1224, which outputs AClk clock signal 109.

PLL 1203 comprises prescaler 1207, phase comparator and VCO 1208, and divider 1209. Prescaler 1207 may be implemented as a frequency divider and provides a compensating delay with no frequency division necessary. Prescaler 1207 receives ClkIn clock signal 1201 and provides signal 1216 to phase comparator and VCO 1208. Divider 1209 provides feedback signal 1218 to phase comparator and VCO 1208, which provides ClkC2 clock output 1217 to address/control transmit blocks 201.

PLL 1204 comprises phase comparator and VCO 1210, dummy phase offset selector 1212, and divider 1211. Dummy phase offset selector 1212 inserts an amount of delay to mimic the delay inherent in a phase offset selector and provides signal 1220 to divider 1211, which provides feedback signal 1221 to phase comparator and VCO 1210. Phase comparator and VCO 1210 receives ClkIn clock input 1201 and provides ClkC8 clock output 1219 to data transmit blocks 202 and data receive blocks 203.

PLL 1205 comprises phase shifting circuit 1214 and phase comparator and VCO 1213. Phase shifting circuit 1214 provides feedback signal 1223 to phase comparator and VCO 1213. Phase comparator and VCO 1213 receives ClkIn clock signal 1201 and provides ClkCD clock signal 1222 to data transmit blocks 202 and data receive blocks 203.

Controller logic core 1234 provides TPhShB signals 1235 and TPhShA signals 1236 to data transmit blocks 202. Controller logic core 1234 provides RPhShB signals 1237 and RPhShA signals 1238 to data receive blocks 203. Controller logic core 1234 provides LoadSkip signal 1239 to data transmit blocks 202 and data receive blocks 203. Controller logic core 1234 comprises PhShC block 1240. Functionality of the controller logic 1234 is discussed in additional detail with respect to FIG. 17 below.

Controller logic core 1234 provides address/control information to address/control transmit blocks 201 via internal address bus 1231. Controller logic core 1234 provides write data to data transmit blocks 1232 via internal write data bus 1232. Controller logic core 1234 receives read data from data receive blocks 203 via internal read data bus 1233.

Address/control transmit blocks 201 are coupled via output 1228 to buffers 1225, which drive AC bus 107. Data transmit blocks 202 provide outputs 1229 to buffers 1226, which drive DQ bus 108. Buffers 1227 couple DQ bus 108 to inputs 1230 of data receive blocks 203.

Each of address/control transmit blocks 201 is connected to the AC bus, and each of blocks 202 and 203 is connected to the DQ bus. The serialized data on these external buses is converted to or from parallel from internal buses which connect to the rest of the controller logic. The rest of the controller is assumed to operate in the ClkC clock domain.

In the embodiment shown, the ClkIn signal is the master clock for the whole memory subsystem. It is received and used as a frequency and phase reference for all the clock signals used by the controller. The other clocks are ClkC2, ClkC8, ClkC, and ClkCD. These are, respectively, 2×, 8×, 1×, and 1× the frequency of ClkIn. C.lkC will have no phase offset relative to ClkIn, and ClkCD will be delayed by 90 degrees. ClkC2 has every other rising edge aligned with a rising edge of ClkIn.

Every eighth ClkC8 rising edge is aligned with a rising edge of ClkIn except for an offset which compensates for the delay of a frequency divider and phase offset selector in the transmit and receive blocks. There are "N" additional ClkC8 signals (ClkC8[N:1]) which are phase-shifted relative to the ClkC8 signal. These other ClkC8 phases are used to synthesize the transmit and receive clock domains needed to communicate with the memory components. system that phase alignment within the memory devices will possibly cause phase mismatching in other portions of the system due to the physical positioning of the memory devices with respect to the controller. Thus, a memory device positioned a first distance from the controller will have a different set of characteristic delays with respect to signals communicated with the controller than a second memory device positioned at a second position. As such, individual clock adjustment circuitry would be required for such memory devices within the controller such that the controller is assured of properly capturing read data provided by each of the memory devices and to allow for the controller to properly drive write data intended to be received by each of the memory devices.

Within the transmit block 202, data for transmission is received over the TD bus 1232 in parallel format. This data is loaded into the register 1310 based on the clock ClkC signal 1215. Once loaded in the register 1310, the data is either directly passed through the multiplexer 1312 to the register 1313 or caused to be delayed by a half clock cycle by traversing the path through the multiplexer 1312 that includes the register 1311 which is clocked by the falling edge of the ClkC signal. Such circuitry enables the data on the TD bus, which is in the ClkC clock domain, to be successfully transferred into the clock domain needed for its transmission. This clock domain is the TClkC1B clock domain, which has the same frequency as the ClkC clock, but is not necessarily phase aligned to the ClkC clock signal. Similar circuitry is included within the receive block 203 such that data received in the RClkC1B clock domain can be successfully transferred onto the RQ bus that operates in the ClkC clock domain.

Data transmit blocks 202 comprise PhShA block 1306, clock divider circuit 1307, registers 1308, 1309, 1310, 1311, and 1313, multiplexer 1312, and shift register 1314. TPhShA signals 1236 and ClkC8 clock signals 1219 are provided to PhShA block 1306. Additional detail regarding the PhShA block 1306 are provided with respect to FIG. 15 below. Clock divider circuit 1307 comprises 1/1 divider circuit 1324 and 1/8 divider circuit 1325. TPhShB signals 1235 are provided to 1/8 divider circuit 1325. An output of PhShA block 1306 is provided to inputs of 1/1 divider circuit 1324 and 1/8 divider circuit 1325. An output of 1/1 divider circuit 1324 is provided to clock shift register 1314. An output of 1/8 divider circuit 1325 is provided to clock register 1313 and as an input to register 1308.

Register 1308 is clocked by ClkCD clock signal 1222 and provides an output to register 1309. Register 1309 is clocked by ClkC clock signal 1215 and receives LoadSkip signal 1238 to provide an output to multiplexer 1312 and an output to clock registers 1310 and 1311. Register 1310 receives write data from write data bus 1232 and provides an output to register 1311 and multiplexer 1312. Register 1311 provides an output to multiplexer 1312. Multiplexer 1312 provides an output to register 1313. Register 1313 provides parallel outputs to shift register 1314. Shift register 1314 provides output 1229. As a result, the parallel information on the input 1232 is converted to serial form on the output 1229.

Data receive blocks 203 comprise PhShA block 1315, clock dividing circuit 1316, registers 1317, 1318, 1320, 1321, and 1323, shift register 1319, and multiplexer 1322. Clock dividing circuit 1316 comprises 1/1 divider circuit 1326 and 1/8 divider circuit 1327. RPhShA signals 1238 and ClkC8 clock signal 1219 are provided to PhShA block 1315, which provides an output to 1/1 divider circuit 1326 and 1/8 divider circuit 1327. RPhShB signal 1237 is provided to an input of 1/8 divider circuit 1327. The 1/1 divider circuit 1326 provides an output used to clock shift register 1319. The 1/8 divider circuit 1327 provides an output used to clock register 1320 and used as an input to register 1317. Register 1317 is clocked by ClkCD clock signal 1222 and provides an output to register 1318. Register 1318 receives LoadSkip signal 1238 and is clocked by ClkC clock signal 1215, providing an output to multiplexer 1322 and an output used to clock registers 1321 and 1323.

Shift register 1319 receives input 1230 and provides parallel outputs to register 1320. Register 1320 provides an output to register 1321 and to multiplexer 1322. Register 1321 provides an output to multiplexer 1322. Multiplexer 1322 provides an output to register 1323. Register 1323 provides an output to internal read data bus 1233. As a result, the serial information on the input 1230 is converted to parallel form on the output 1233.

Shown are the register and gating elements needed to drive address/control and write data, and to sample the read data. It is assumed in this example that two bits are transferred per address/control (AC[i]) wire in each $t_{CC}$ interval, and that eight bits are transferred per read data (Q[i]) wire or write data (D[i]) wire in each $t_{CC}$ interval. In addition to the primary clock ClkC (with a cycle time of $t_{CC}$), there are two other aligned clocks that are generated. There is ClkC2 (with a cycle time of $t_{CC}/2$) and ClkC8 (with a cycle time of $t_{CC}/8$). These higher frequency clocks shift information in to or out from the controller. Once in every $t_{CC}$ interval the serial data is transferred to or from a parallel register clocked by ClkC.

Note that in the controller, the ClkC2 or ClkC8 clocks can be replaced by two or eight clocks each with a cycle time of $t_{CC}$, but offset in phase in equal increments across the entire $t_{CC}$ interval. In such embodiments, the serial register is replaced by blocks of two or eight registers, where each register is loaded with a different clock signal so that the bit windows on the AC and DQ buses are properly sampled or driven. Another possibility is to use level-sensitive storage elements (latches) instead of edge sensitive storage elements (registers) so that the rising and falling edges of a clock signal cause different storage elements to be loaded.

Regardless of how the serialization is implemented, there will be multiple bit windows per $t_{CC}$ interval on each wire, and many embodiments utilize multiple clock edges per $t_{CC}$ interval in the controller in order to properly drive and sample these bit windows.

Figure 13:
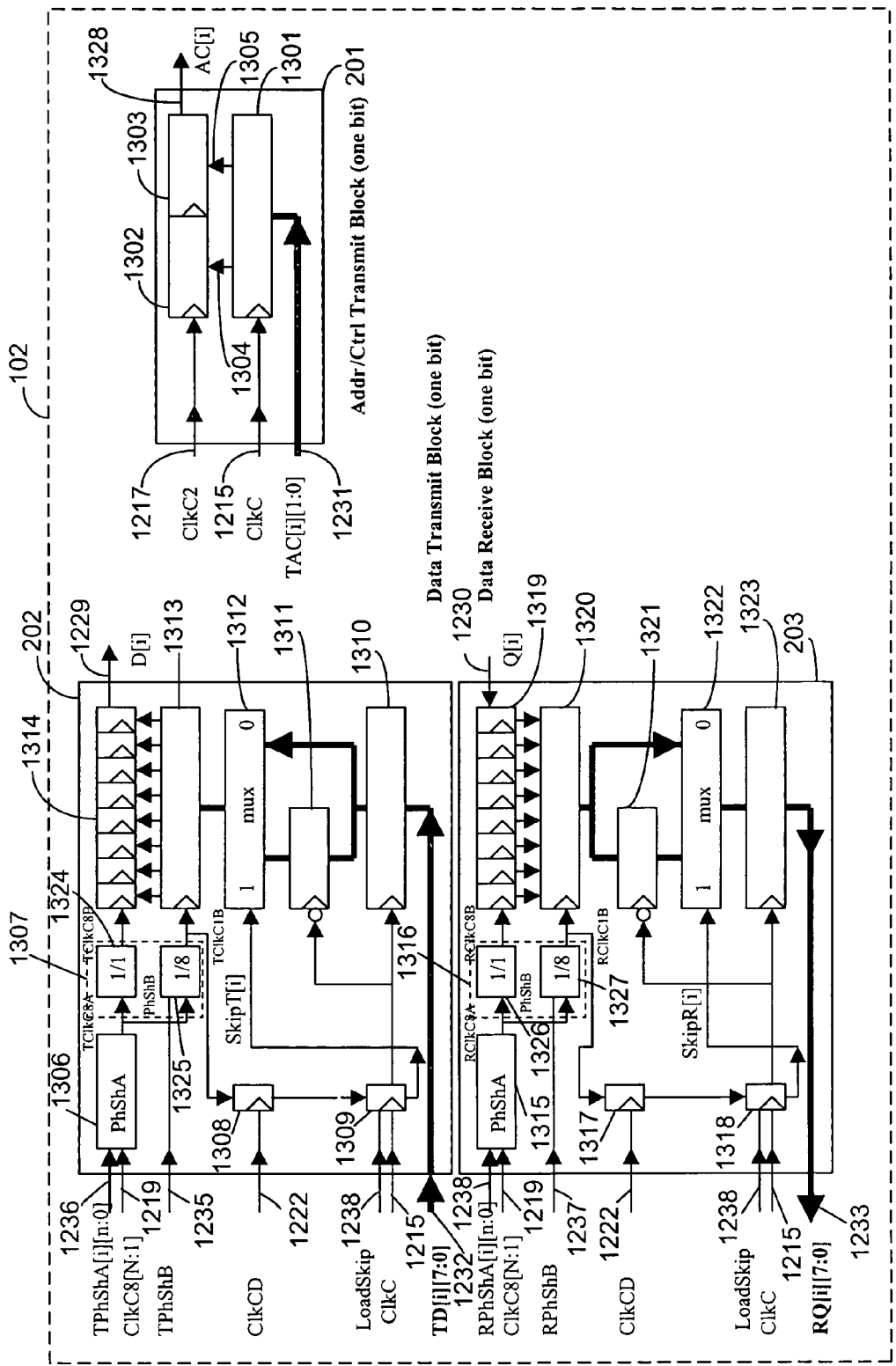
FIG. 13 is a block diagram illustrating the clocking elements of a memory controller component of a memory system such as that illustrated in FIG. 1 in accordance with an embodiment of the invention.

FIG. 13 also shows how the controller deals with the fact that the read and write data that is received and transmitted for each slice is in a different clock domain. Since a slice may be as narrow as a single bit, there can be 32 read clock domains and 32 write clock domains simultaneously present in the controller (this example assumes a DQ bus width of 32 bits). Remember that in this example no clocks are transferred with the read and write data, and such clocks are preferably synthesized from a frequency source. The problem of multiple clock domains would still be present even if a clock was transferred with the read and write data. This is because the memory component is the point in the system where all local clocks are preferably in-phase. Other system clocking topologies are described later in this description.

The transmit block for address/control bus (AC) in FIG. 13 uses the ClkC2 and ClkC clocks to perform two-to-one serialization. The ClkC2 clock shifts the serial register 1302, 1304 onto the AC wires 1328. Note the exact phase alignment of the ClkC2 clock depends upon the circuit implementation of the driver logic; there may be a small offset to account for driver delay. There may also be small offsets to account for the exact position of the bit drive window on the AC bus relative to the ClkC clock. For example, if the output drivers have a known delay, the phase of the ClkC2 clock signal may be adjusted such that a portion of the output circuitry begins providing data to the output drivers slightly earlier than the time at which the data is to actually be driven onto an external signal line. The shifting of the phase of the ClkC2 clock signal can thus be used to account for the inherent delay in the output driver such that data is actually presented on the external data line at the desired time. Similarly, adjustments to the phase of the ClkC2 clock signal may also be used to ensure that the positioning of the valid data window for data driven based on the ClkC2 clock signal is optimally placed.

In a similar fashion, the transmit block for write data bus (D) in FIG. 13 uses a phase-delayed ClkC8 clock to perform eight-to-one serialization. The phase-delayed ClkC8 clock shifts the serial register 1314 onto the DQ wires. Note the exact alignment of the phase-delayed ClkC8 clock will depend upon the circuit implementation of the driver logic; there may be a small offset to account for driver delay. There may also be small offsets to account for the exact position of the bit drive window on the DQ bus.

The TphShA[i][n:0] control signals 1236 select the appropriate phase offset relative to the input reference vectors ClkC8[N:1]. A phase offset selector may be implemented using a simple multiplexer, a more elaborate phase interpolator, or other phase offset selection techniques. In one example of a phase interpolator, a first reference vector of less-than-desired phase offset and a second reference vector of greater-than-desired phase offset are selected. A weighting value is applied to combine a portion of the first reference vector with a portion of the second reference vector to yield the desired output phase offset of the TClkC8A clock. Thus, the desired output phase offset of the TClkC8A clock is effectively interpolated from the first and second reference vectors. In one example of a phase multiplexer, the TphShA[i][n:0] control signals 1236 are used to select one of the ClkC8[N:1] clock signals 1219 to pass through to the TClkC8A clock (note that $2^{n+1}=N$). The phase that is used is, in general, different for each transmit slice on the controller. The phase for each slice on the controller is preferably selected during a calibration process during initialization. This process is described in detail later in this description.

The TClkC8A clock passes through 1/8 1325 and 1/1 1324 frequency dividers before clocking the parallel 1313 and serial 1314 registers. Note that the ClkC8[N:1] signals that are distributed have a small phase offset to compensate for the delay of the phase offset selection block (PhShA) 1306 and the frequency divider blocks 1324 and 1325. This offset is generated by a phase-locked-loop circuit and will track out supply voltage and temperature variations.

Even with the transmit phase shift value set correctly (so that the bit windows on the D bus 1229 are driven properly), the phase of the TClkC1B clock used for the parallel register 1313 could be misaligned (there are eight possible combinations of phase). There are several ways of dealing with the problem. The scheme that is used in the embodiment illustrated provides an input TPhShB 1235, such that when this input is pulsed, the phase of the TClkC1B clock will shift by $1/8^{th}$ of a cycle (45 degrees). The initialization software adjusts the phase of this clock until the parallel register loads the serial register at the proper time. This initialization process is described in detail later in this description.

Alternatively, it is also possible to perform the phase adjustment in the ClkC domain when preparing the TD bus 1232 for loading into the transmit block 202. To do so, multiplexers and registers may be used to rotate the write data across ClkC cycle boundaries. A calibration process may be provided at initialization to accommodate the phase of the TClkC1B clock during which the transmit block 202 is powered up.

After the phase shift controls are properly adjusted, the write data can be transmitted onto the D bus from the parallel register 1313. However, the write data still needs to be transferred from the TD bus 1232 in the ClkC 1215 domain into the parallel register 1313 in the TClkC1B domain. This is accomplished with the skip multiplexer 1312. The multiplexer selects between registers that are clocked on the rising 1310 and falling 1311 edges of ClkC. The SkipT value determines which of the multiplexer paths is selected. The SkipT value is determined by sampling the TClkC1B clock by the ClkCD clock 1222. The resulting value is loaded into a register 1309 by the LoadSkip signal 1238 during the initialization routine. This circuitry is described in detail later in this description.

The receive block 203 for the read data Q is shown at the bottom of FIG. 13. The receive block has essentially the same elements as the transmit block that was just discussed, except that the flow of data is reversed. However, the clock domain crossing issues are fundamentally similar.

The RPhShA[i][n:0] control signals 1238 select one of the ClkC8[N:1] clock signals 1219 to pass through to the RClkC8 clock. The phase that is used is, in general, different for each receive slice on the controller. The phase is selected during a calibration process during initialization. This process is described in detail later in this description.

The RClkC8A clock passes through 1/8 1327 and 1/1 1326 frequency dividers before clocking the parallel 1320 and serial 1319 registers. Note that the ClkC8[N:1] signals 1219 that are distributed have a small phase offset to compensate for the delay of the phase offset selection block (PhShA) 1315 and the frequency divider blocks 1326 and 1327. This offset is generated by a phase-locked-loop circuit and will track out supply voltage and temperature variations.

Even with the receive phase shift value set correctly (so that the bit windows on the Q bus are sampled properly), the phase of the RClkC1B clock used for the parallel register 1320 could be mismatched (there are eight possible combinations of phase). There are several ways of dealing with the problem. The scheme that is used in the embodiment illustrated provides an input RPhShB 1237, such that when this input is pulsed, the phase of the RClkC1B clock will shift by $1/8^{th}$ of a cycle (45 degrees). The initialization software adjusts the phase of this clock until the parallel register 1320 loads the serial register 1319 at the proper time. This initialization process is described in detail later in this description.

A skip multiplexer similar to that described for the transmit circuit is used to move between the RClkC1B clock domain and the ClkC clock domain. After the phase shift controls are properly adjusted, the read data can be received from the Q bus 1230 and loaded into the parallel register 1320. However, the read data still needs to be transferred from the parallel register 1320 in the RClkC 1 B domain into the register 1323 in the ClkC 1215 domain. This is accomplished with the skip multiplexer 1322. The multiplexer can insert or not insert a register 1321 that is clocked on the negative edge of ClkC in between registers that are clocked on the rising edges of RClkC1B 1320 and ClkC 1323. The SkipR value determines which of the multiplexer paths is selected. The SkipR value is determined by sampling the RClkC1B clock by the ClkCD clock 1222. The resulting value is loaded into a register 1318 by the LoadSkip signal 1238 during the initialization routine. This circuitry is described in detail later in this description.

Figure 14:
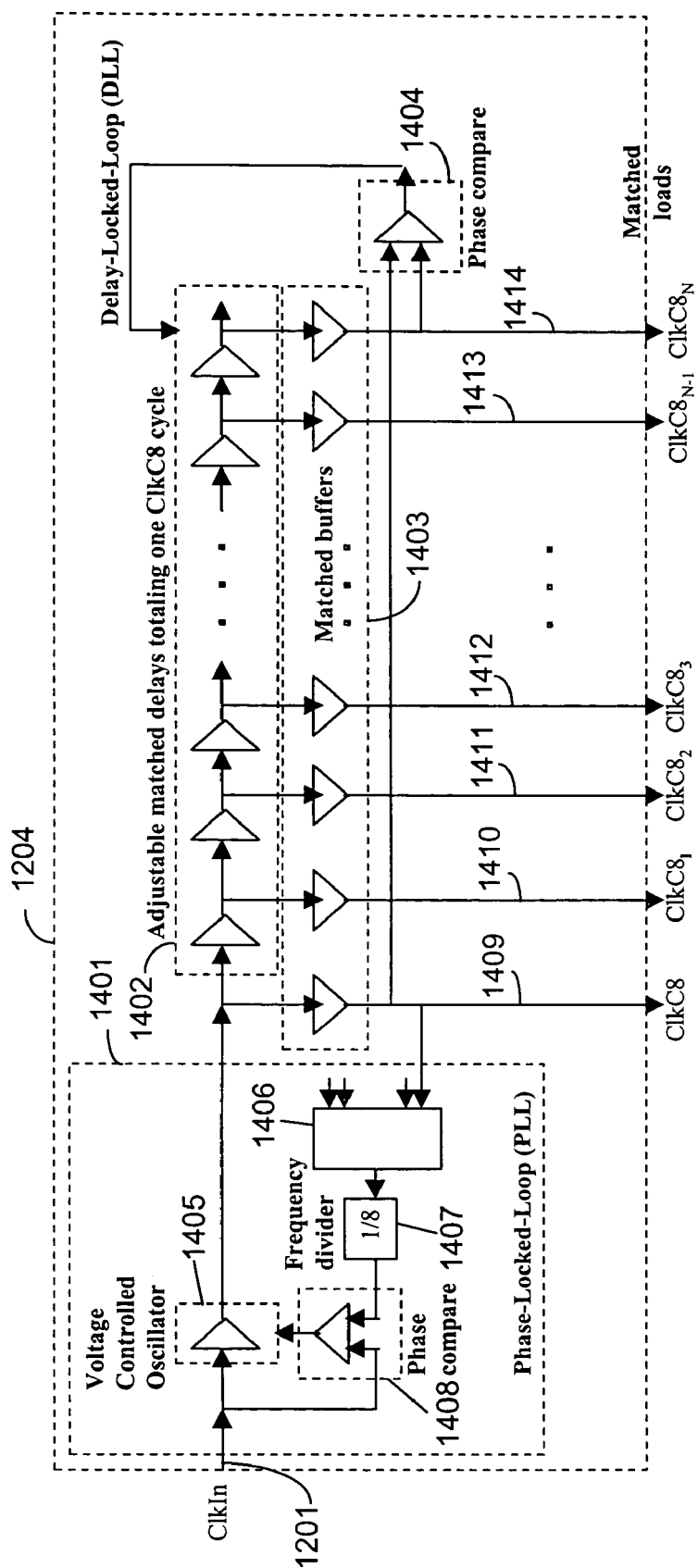
FIG. 14 is a logic diagram illustrating details of the ClkC8 block of the memory controller component such as that illustrated in FIG. 12 in accordance with an embodiment of the invention.

FIG. 14 is a logic diagram illustrating details of the PLL used to generate the ClkC8 signal as illustrated in FIG. 12 in accordance with an embodiment of the invention. PLL 1204 comprises PLL circuit 1401, adjustable matched delays 1402, matched buffers 1403, and phase comparator 1404. PLL circuit 1401 comprises VCO 1405, durably phase offset selector 1406, frequency divider 1407, and phase comparator 1408. CLkIn clock signal 1201 is provided to VCO 1405 and phase comparator 1408. VCO 1405 provides an output to adjustable matched delays 1402 and matched buffers 1403. Adjustable matched delays 1402 provide a plurality of incrementally delayed outputs to matched buffers 1403.

Figure 15:
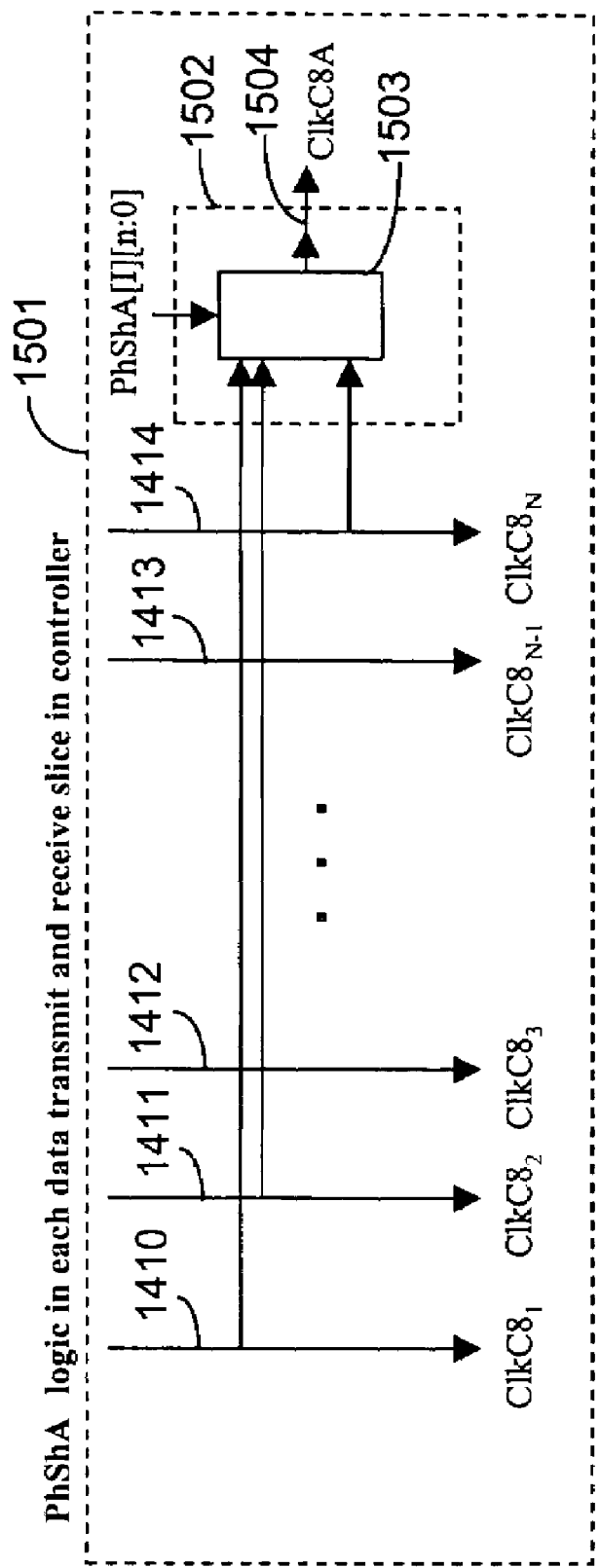
FIG. 15 is a block diagram illustrating how the ClkC8[N:1] signals are used in the transmit and receive blocks of the memory controller component such as that illustrated in FIG. 12 in accordance with an embodiment of the invention.

The PLL circuit 1401 generates a clock signal that is 8 times the frequency of the input clock signal ClkIn 1201, and the generated signal is also phase-shifted to account for delay expected to exist in the paths of the clock signals produced by the circuit in FIG. 14. As such, expected delays are compensated for during the clock generation process such that the clock signals that appear at the point of actual use are correctly phase adjusted. The remaining portion of the block 1204 outside of the PLL circuit 1401 is used to generate equally phase-spaced versions of the clock produced by the PLL circuit 1401. This is accomplished through well-known delay locked loop techniques where the delay locked loop provides the mechanism for generating the equally spaced clock signals. The clock signals produced as a result of the block 1204 in FIG. 14 are provided to the phase shifting logic described below with respect to FIG. 15. The results of the clock generation performed by the circuits of FIGS. 14 and 15 are used to perform the serial-to-parallel or parallel-to-serial conversion as described in FIG. 13 above.

Output 1409 of matched buffers 1403, which is not delayed by adjustable matched delays 1402, is provided to an input of dummy phase offset selector 1406 and an input of phase comparator 1404 and provides the ClkC8 clock signal. Delayed output 1410 provides the $ClkC8_1$ clock signal. Delayed output 1411 provides the $ClkC8_2$ clock signal. Delayed output 1412 provides the $ClkC8_3$ clock signal. Delayed output 1413 provides the $ClkC8_{N-1}$ clock signal. Delayed output 1414 provides the $ClkC8_N$ clock signal, which is provided to an input of phase comparator 1404. Phase comparator 1404 provides a feedback signal to adjustable matched delays 1402, thereby providing a delay-locked loop (DLL). Each of the matched buffers 1403 has a substantially similar propagation delay, thereby providing a buffered output without introducing unintended timing skew among output 1409 and delayed outputs 1410-1414.

The ClkIn reference clock 1201 is received and is frequency-multiplied by 8× by the PLL 1204. Several delays are included with the PLL feedback loop of PLL 1204, including a buffer delay introduced by matched buffers 1403, a dummy phase offset selection delay introduced by dummy phase offset selector 1406, and a frequency divider delay introduced by frequency divider 1407. By including these delays in the feedback loop, the clock that is used for sampling and driving bits on the DQ will be matched to the ClkIn reference, and any delay variations caused by slow drift of temperature and supply voltage will be tracked out.

The output of the PLL circuit 1401 is then passed through a delay line 1402 with N taps. The delay of each element is identical, and can be adjusted over an appropriate range so that the total delay of N elements can equal one ClkC8 cycle ($t_{CC}/8$). There is a feedback loop 1404 that compares the phase of the undelayed ClkC8 to the clock with maximum delay ClkC8[N]. The delay elements are adjusted until their signals are phase aligned, meaning there is $t_{CC}/8$ of delay across the entire delay line.

The ClkC8[N:1] signals pass through identical buffers 1403 and see identical loads from the transmit and receive slices to which they connect. The ClkC8 reference signal 1409 also has a buffer and a matched dummy load to mimic the delay.

FIG. 15 is a block diagram illustrating how the ClkC8[N:1] signals are used in the transmit and receive blocks of the memory controller component such as that illustrated in FIG. 13 in accordance with an embodiment of the invention. PhShA logic block 1501 comprises phase offset selection circuit 1502, which comprises phase offset selector 1503. Phase offset selector 1503 receives $ClkC8_1$ clock signal 1410, $ClkC8_2$ clock signal 1411, $ClkC8_3$ clock signal 1412, $ClkC8_{N-1}$ clock signal 1413, and $ClkC8_N$ clock signal 1414 (i.e., N variants of the ClkC8 clock signal) and selects and provides ClkC8A clock signal 1504. This is accomplished using the N-to-1 multiplexer 1503 which selects one of the signals depending upon the setting of the control signals PhShA[i][n:0], where $N=2^{n+1}$. This allows the phase of the ClkC8A output clock for slice [i] to be varied across one ClkC8 cycle ($t_{CC}/8$) in increments of $t_{CC}/8N$.

At initialization, a calibration procedure is performed with software and/or hardware in which test bits are sampled and driven under each combination of the control signals PhShA[i][n:0]. The combination which yields the best margin is selected for each slice. This static value compensates for the flight time of the DQ and AC signals between the controller and the memory components. This flight time is mainly a factor of trace length and propagation velocity on printed wiring boards, and does not vary much during system operation. Other delay variations due to supply voltage and temperature are automatically tracked out by the feedback loops of the PLLs in the system.

Figure 16:
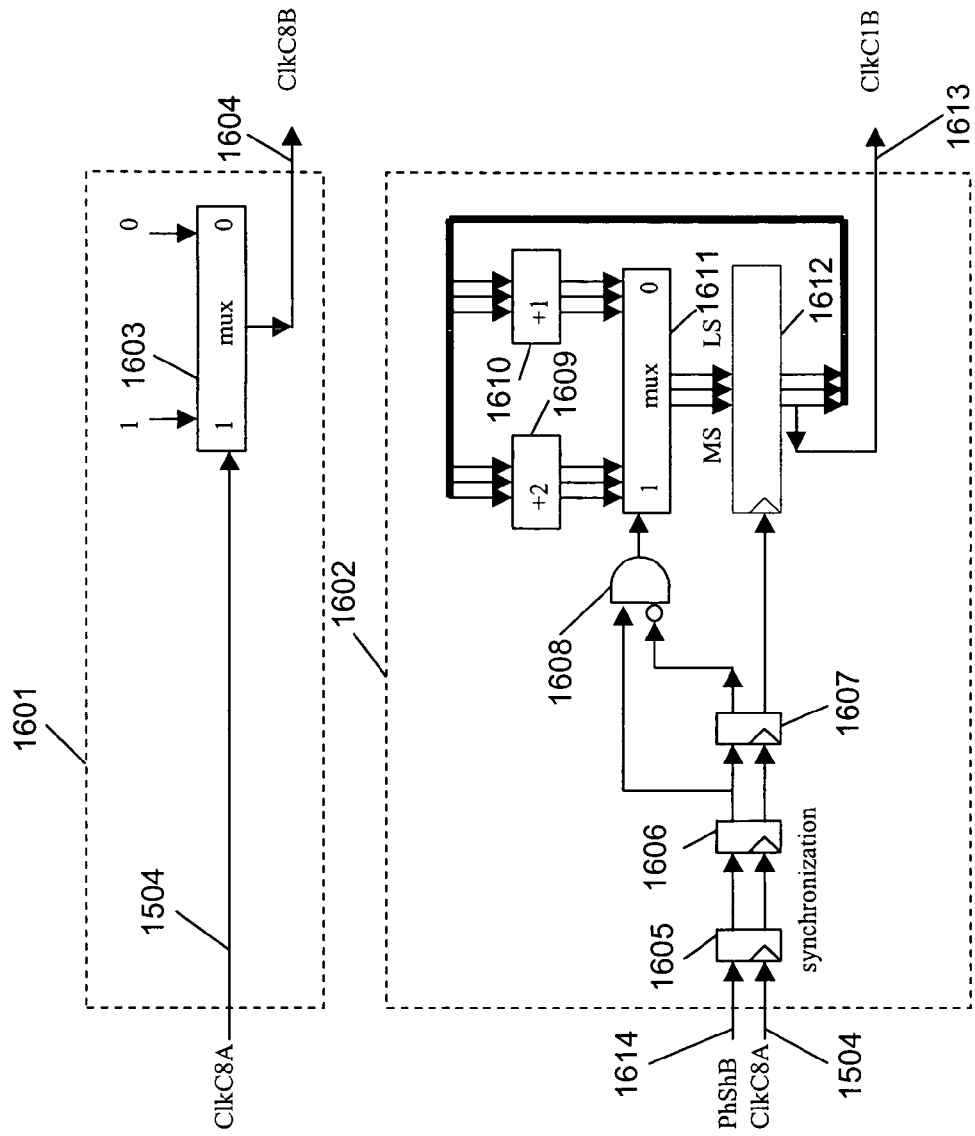
FIG. 16 is a block diagram illustrating a circuit for producing a ClkC8B clock and a ClkC1B clock based on the ClkC8A clock in accordance with an embodiment of the invention.

FIG. 16 is a block diagram illustrating the PhShB circuit 1307 and 1316 of FIG. 13. Clock conversion circuit 1601 of FIG. 16 preferably corresponds to 1/1 divider circuit 1324 and 1/1 divider circuit 1326 of FIG. 13. Similarly, clock conversion circuit 1602 of FIG. 16 preferably corresponds to 1/8 divider circuit 1325 and 1/8 divider circuit 1327 of FIG. 13. It produces a ClkC8B clock and a ClkC1B clock based on the ClkC8A clock in accordance with an embodiment of the invention. Clock conversion circuit 1601 comprises a multiplexer 1603, which receives ClkC8A signal 1504 and provides ClkC8B signal 1604. Clock conversion circuit 1602 comprises registers 1605, 1606, 1607, and 1612, logic gate 1608, multiplexer 1611, and incrementing circuits 1609 and 1610. PhShB signal 1614 is applied to register 1605, and ClkC8A clock signal 1504 is used to clock register 1605. Outputs of register 1605 are applied as an input and a clock input to register 1606. An output of register 1606 is applied as an input to register 1607 and logic gate 1608. An output of register 1606 is used to clock register 1607. An output of register 1607 is applied to logic gate 1608. An output of register 1607 is used to clock register 1612. An output of logic gate 1608 is applied to multiplexer 1611.

Incrementing circuit 1609 increments an incoming three-bit value by two. Incrementing circuit 1610 increments the incoming three-bit value by one in a binary manner such that it wraps from 111 to 000. Multiplexer 1611 selects among the three-bit outputs of incrementing circuits 1609 and 1610 and provides a three-bit output to register 1612. Register 1612 provides a three-bit output to be used as the incoming three-bit value for incrementing circuits 1609 and 1610. The most significant bit (MSB) of the three-bit output is used to provide ClkC1B clock signal 1613.

In FIG. 16, the ClkC8A clock that is produced by the PhShA (1306 and 1315 of FIG. 13) block is then used to produce a ClkC8B clock at the same frequency and to produce a ClkC1B clock at $\frac{1}{8}^{th}$ the frequency. These two clocks are phase aligned with one another (each rising edge of ClkC1B is aligned with a rising edge of ClkC8B.

ClkC1B 1613 is produced by passing it through a divide-by-eight counter 1602. ClkC8A clocks a three bit register 1612 which increments on each clock edge. The most-significant bit will be ClkC1B, which is $\frac{1}{8}^{th}$ the frequency of ClkC8A. The ClkC8B 1604 clock is produced by a multiplexer which mimics the clock-to-output delay of the three bit register, so that ClkC1B and ClkC8B are aligned. As is apparent to one of ordinary skill in the art, other delaying means can be used in place of the multiplexer shown in block 1601 to accomplish the task of matching the delay through the divide-by-8 counter.

As described with respect to FIG. 13, it is necessary to adjust the phase of ClkC1B 1613 so that the parallel register is loaded from/to the serial register in the transmit and receive blocks at the proper time. At initialization, a calibration procedure will transmit and receive test bits to determine the proper phasing of the ClkC1B clock. This procedure will use the PhShB control input 1614. When this input has a rising edge, the three bit counter will increment by +2 instead of +1 on one of the following ClkC8A edges (after synchronization). The phase of the ClkC1B clock will shift $\frac{1}{8}^{th}$ of a cycle earlier. The calibration procedure will continue to advance the phase of the ClkC1B clock and check the position of test bits on the TD[i][7:0] and RQ[i][7:0] buses. When the test bits are in the proper position, the ClkC1B phase will be frozen.

Figure 17:
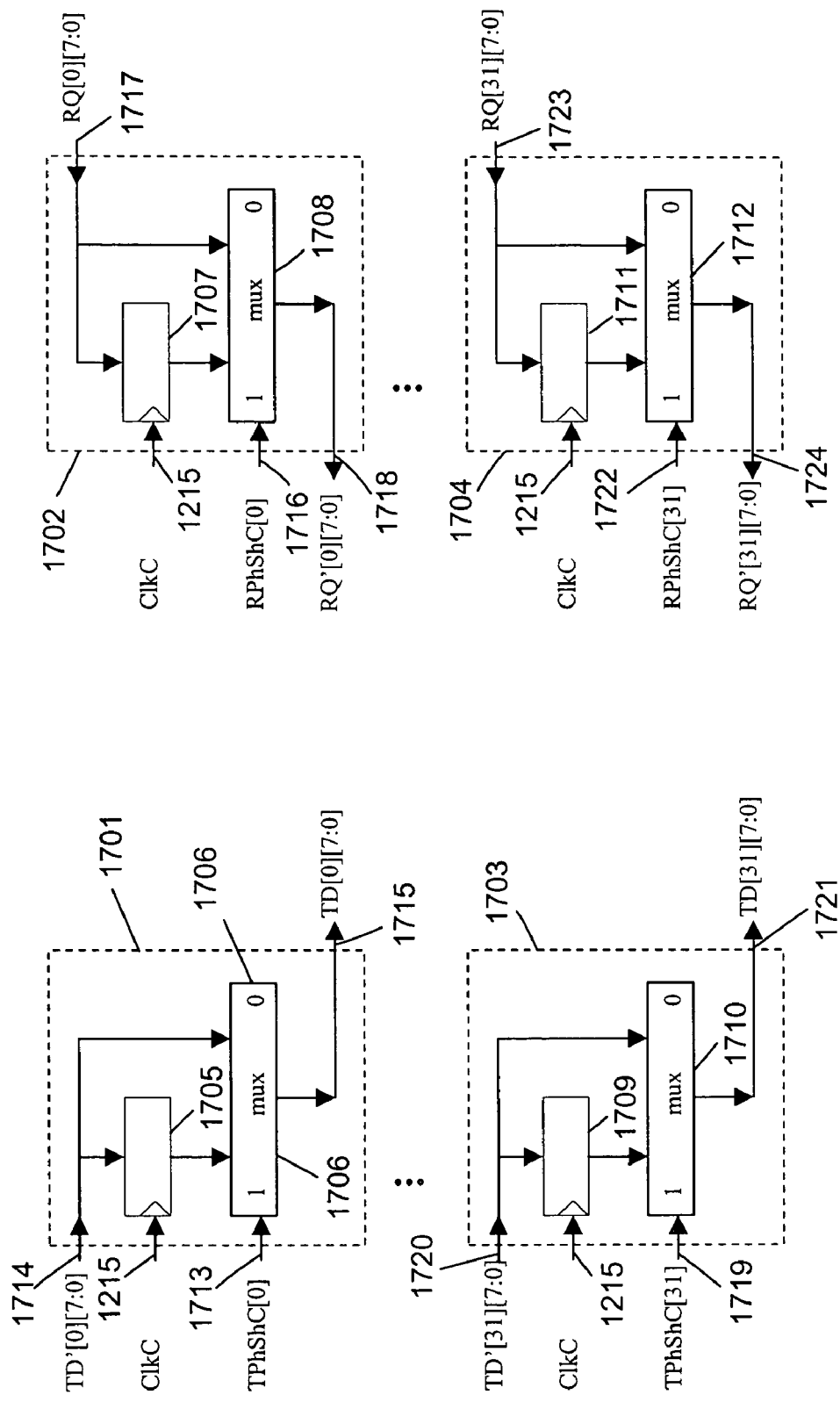
FIG. 17 is a block diagram illustrating details of the PhShC block in accordance with an embodiment of the invention.

FIG. 17 is a block diagram illustrating details of the PhShC block (1240 in FIG. 12) in accordance with an embodiment of the invention. PhShC block 1240 includes blocks 1701-1704. Block 1701 comprises register 1705 and multiplexer 1706. Write data input 1714 is provided to register 1705 and multiplexer 1706. Register 1705 is clocked by ClkC clock signal 1215 and provides an output to multiplexer 1706. Multiplexer 1706 receives TPhShC[0] selection input 1713 and provides write data output 1715. Block 1702 comprises register 1707 and multiplexer 1708. Read data input 1717 is provided to register 1707 and multiplexer 1708. Register 1707 is clocked by ClkC clock signal 1215 and provides an output to multiplexer 1708. Multiplexer 1708 receives RPhShC[0] selection input 1716 and provides read data output 1718. Block 1703 comprises register 1709 and multiplexer 1710. Write data input 1720 is provided to register 1709 and multiplexer 1710. Register 1709 is clocked by ClkC clock signal 1215 and provides an output to multiplexer 1710. Multiplexer 1710 receives TPhShC[31] selection input 1719 and provides write data output 1721. Block 1704 comprises register 1711 and multiplexer 1712. Read data input 1723 is provided to register 1711 and multiplexer 1712. Register 1711 is clocked by ClkC clock signal 1215 and provides an output to multiplexer 1712. Multiplexer 1712 receives RPhShC[31] selection input 1722 and provides read data output 1724. While only two instances of the blocks for the write data and only two instances of the blocks for the read data are illustrated, it is understood that the blocks may be replicated for each bit of write data and each bit of read data.

The PhShC block 1240 is the final logic block that is used to adjust the delay of the 32×8 read data bits and the 32×8 write data bits so that all are driven or sampled from/to the same ClkC clock edge in the controller logic block. This is accomplished with an eight bit register which can be inserted into the path of the read and write data for each slice. The insertion of the delay is determined by the two control buses TPhShC[31:0] and RPhShC[31:0] There is one control bit for each slice, since the propagation delay of the read and write data may cross a ClkC boundary at any memory slice position. Some systems with larger skews in the read and write data across the memory slices may need more than one ClkC of adjustment. The PhShC cells shown can be easily extended to provide additional delay by adding more registers and more multiplexer inputs.

The two control buses TPhShC[31:0] and RPhShC[31:0] are configured during initialization with a calibration procedure. As with the other phase-adjusting steps, test bits are read and written to each memory slice, and the control bits are set to the values that, in the example embodiment, allow all 256 read data bits to be sampled in one ClkC cycle and all 256 write data bits to be driven in one ClkC cycle by the controller logic.

Figure 18:
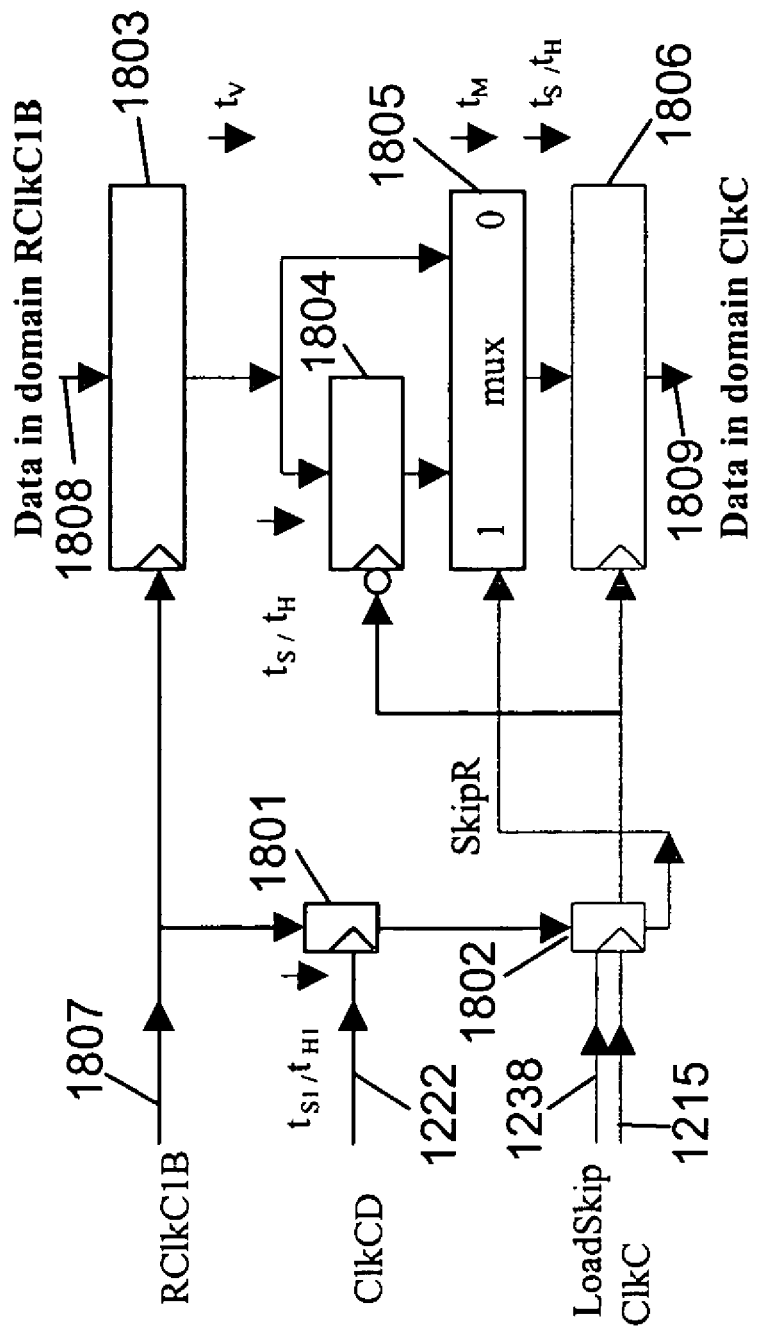
FIG. 18 is a block diagram illustrating the logic details of the skip logic in a controller slice of the receive block of a memory controller component in accordance with an embodiment of the invention.

FIG. 18 is a block diagram illustrating the logic details of the skip logic from the transmit block 203 (in FIG. 13) of a memory controller component in accordance with an embodiment of the invention. The skip logic comprises registers 1801, 1802, 1803, 1804, and 1806, and multiplexer 1805. RClkC1B clock input 1807 is provided to register 1801 and is used to clock register 1803. ClkCD clock input 1222 is used to clock register 1801, which provides an output to register 1802. Register 1802 receives LoadSkip signal 1238 and is clocked by ClkC clock signal 1215, providing an output to multiplexer 1805 and an output used to clock registers 1804 and 1806. Register 1803 receives data in domain RClkC1B at input 1808 and provides an output to register 1804 and multiplexer 1805. Register 1804 provides an output to multiplexer 1805. Multiplexer 1805 provides an output to register 1806. Register 1806 provides data in domain ClkC at output 1809.

The circuit transfers the data in the RClkC1B clock domain to the ClkC domain. These two clocks have the same frequency, but may have any phase alignment. The solution is to sample RClkC1B with a delayed version of ClkC called ClkCD (the limits on the amount of delay can be determined by the system, but in one embodiment, the nominal delay is ¼ of a ClkC cycle). This sampled value is called SkipR, and it determines whether the data in an RClkC1B register may be transferred directly to a ClkC register, or whether the data must first pass through a negative-edge-triggered ClkC register.

Regarding FIG. 18, the following worst case setup constraints can be assumed:

Case B0

$$T_{D,MAX} + t_{H1,MIN} + t_{CL,MIN} + t_{V,MAX} + t_{M,MAX} + t_{S,MIN} <= t_{CYCLE}$$

or $$t_{D,MAX} <= t_{CH,MIN} - t_{H1,MIN} - t_{V,MAX} - t_{M,MAX} - t_{S,MIN} \quad \text{constraint S}$$

Case D1

$$t_{D,MAX} + t_{H1,MIN} + t_{CYCLE} + t_{V,MAX} + t_{S,MIN} <= t_{CYCLE} + t_{CL,MIN}$$

or $$t_{D,MAX} <= t_{CL,MIN} - t_{H1,MIN} - t_{V,MAX} - t_{S,MIN}$$

The following worst case hold constraints can be assumed:

Case A1

$$t_{D,MIN} - t_{S1,MIN} + t_{V,MIN} \geq t_{H,MIN}$$

or $$t_{D,MIN} \geq t_{H,MIN} + t_{S1,MIN} - t_{V,MIN} \quad \text{constraint H}$$

Case C0

$$t_{D,MIN} - t_{S,MIN} + t_{V,MIN} + t_{M,MIN} \geq t_{H,MIN}$$

or $$t_{D,MIN} \geq t_{H,MIN} + t_{S1,MIN} - t_{V,MIN} - t_{M,MIN}$$

The timing parameters used above are defined as follow:
$t_{S1}$—Setup time for clock sampler
$t_{H1}$—Hold time for clock sampler
$t_S$—Setup time for data registers
$t_H$—Hold time for data registers
$t_V$—Valid delay (clock-to-output) of data registers
$t_M$—Propagation delay of data multiplexer
$t_{CYCLE}$—Clock cycle time (RClkC1B, ClkC, ClkCD)
$t_{CH}$—Clock high time (RClkC1B, ClkC, ClkCD)
$t_{CL}$—Clock low time (RClkC1B, ClkC, ClkCD)
$t_D$—Offset between ClkC and ClkCD (ClkCD is later)

Figure 19:
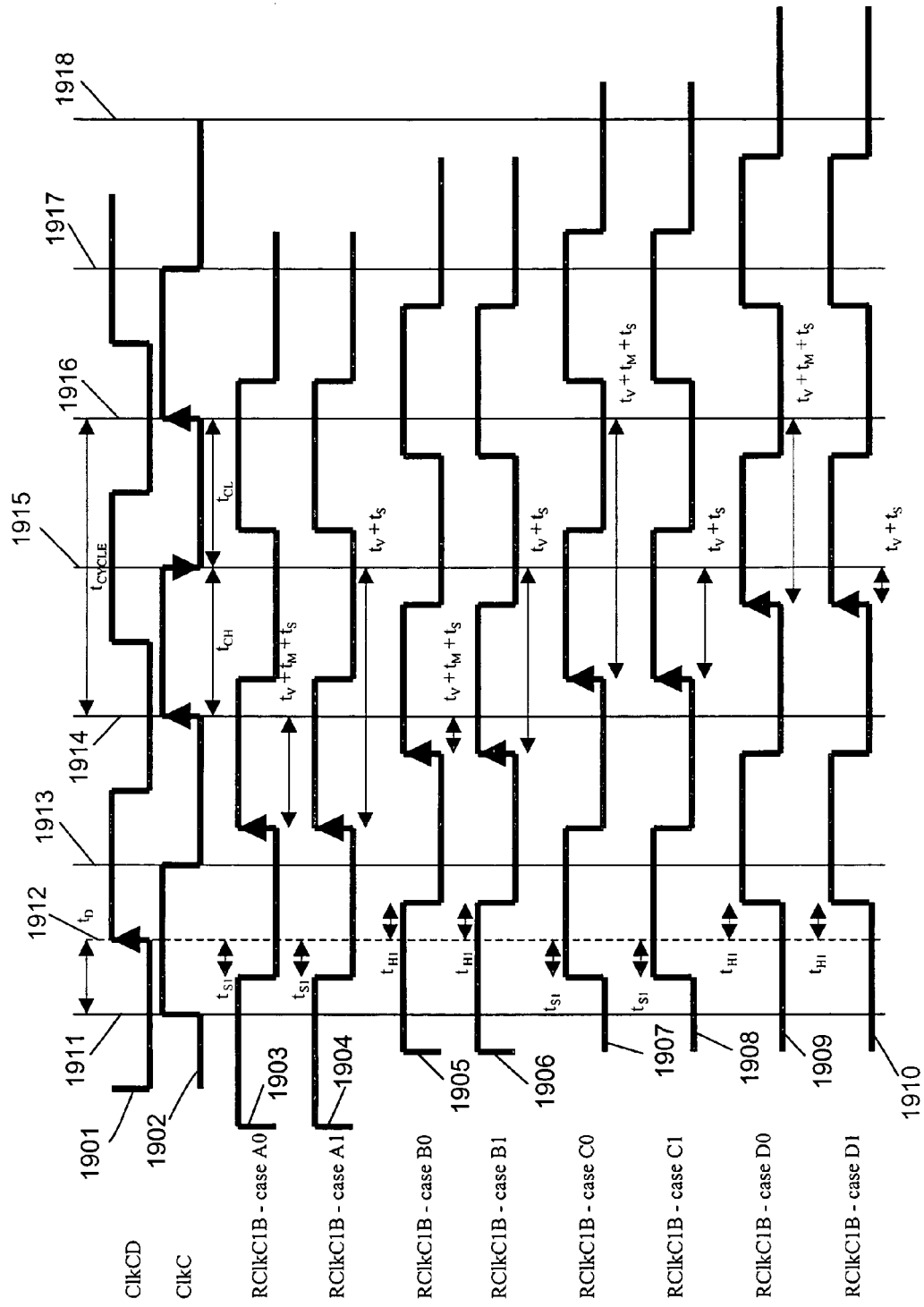
FIG. 19 is a timing diagram illustrating the timing details of the skip logic in a controller slice of the receive block of a memory controller component in accordance with an embodiment of the invention.

Note:
$t_{D,NOM} \sim t_{CYCLE}/4$
$t_{CH,NOM} \sim t_{CYCLE}/2$
$t_{CL,NOM} \sim t_{CYCLE}/2$ FIG. 19 is a timing diagram illustrating the timing details of the skip logic of the receive block 203 (illustrated in FIG. 13) in accordance with an embodiment of the invention. FIG. 19 illustrates waveforms of ClkCD clock signal 1901, ClkC clock signal 1902, RClkC1B (case A0) clock signal 1903, RClkC1B (case A1) clock signal 1904, RClkC1B (case B0) clock signal 1905, RClkC1B (case B1) clock signal 1906, RClkC1B (case C0) clock signal 1907, RClkC1B (case C1) clock signal 1908, RClkC1B (case D0) clock signal 1909, and RClkC1B (case D1) clock signal 1910. Times 1911, 1912, 1913, 1914, 1915, 1916, 1917, and 1918, at intervals of one clock cycle, are illustrated to indicate the timing differences between the clock signals.

FIG. 19 generally summarizes the possible phase alignments of RClkC1B and ClkC as eight cases labeled A0 through D1. These cases are distinguished by the position of the RClkC1B rising and falling edge relative to the set/hold window of the rising edge of ClkCD which samples RClkC1B to determine the SkipR value. Clearly, if the RClkC1B rising or falling edge is outside of this window, it will be correctly sampled. If it is at the edge of the window or inside the window, then it can be sampled as either a zero or one (i.e., the validity of the sample cannot be ensured). The skip logic has been designed such that it functions properly in either case, and this then determines the limits on the delay of the ClkCD clock $t_D$.

For the receive block, case B0 1905 has the worst case setup constraint, and case A1 1904 has the worst case hold constraint:

$$t_{D,MAX} \leq t_{CH,MIN} - t_{H1,MIN} - t_{V,MAX} - t_{M,MAX} - t_{S,MIN} \quad \text{constraint S}$$

$$t_{D,MIN} \geq t_{H,MIN} + t_{S1,MIN} - t_{V,MIN} \quad \text{constraint H}$$

As mentioned earlier, the nominal value of $t_D$ (the delay of ClkCD relative to ClkC) is expected to be ¼ of a ClkC cycle. The value of $t_D$ can vary up to the $t_{D,MAX}$ value shown above, or down to the $t_{D,MIN}$ value, also shown above. If the setup (e.g., $t_{S1}$, $t_S$), hold (e.g., $t_{H1}$, $t_H$), multiplexer propagation delay (e.g., $t_M$), and valid (e.g., $t_V$) times all went to zero, then the $t_D$ value could vary up to $t_{CH,MIN}$ (the minimum high time of ClkC) and down to zero. However, the finite set/hold window of registers, and the finite clock-to-output (valid time) delay and multiplexer delay combine to reduce the permissible variation of the $t_D$ value.

Note that it would be possible to change some of the elements of the skip logic without changing its basic function. For example, a sampling clock ClkCD may be used that is earlier rather than later (the constraint equations are changed, but there is a similar dependency of the timing skew range of ClkC to ClkCD upon the various set, hold, and valid timing parameters). In other embodiments, a negative-edge-triggered RClkC1B register is used instead of a ClkC register into the domain-crossing path (again, the constraint equations are changed, but a similar dependency of the timing skew range of ClkC to ClkCD upon the various set, hold, and valid timing parameters remains).

Finally, it should be noted that the skip value that is used is preferably generated once during initialization and then loaded (with the LoadSkip control signal) into a register. Such a static value is preferable to rather than one that is sampled on every ClkCD edge because if the alignment of RClkC1B is such that it has a transition in the set/hold window of the ClkCD sampling register, it may generate different skip values each time it is sampled. This would not affect the reliability of the clock domain crossing (the RClkC1B date would be correctly transferred to the ClkC register), but it would affect the apparent latency of the read data as measured in ClkC cycles in the controller. That is, sometimes the read data would take a ClkC cycle longer than at other times. Sampling the skip value and using it for all domain crossings solves this problem. Also note that during calibration, every time the RClkC1B phase is adjusted, the LoadSkip control is pulsed in case the skip value changes.

Figure 20:
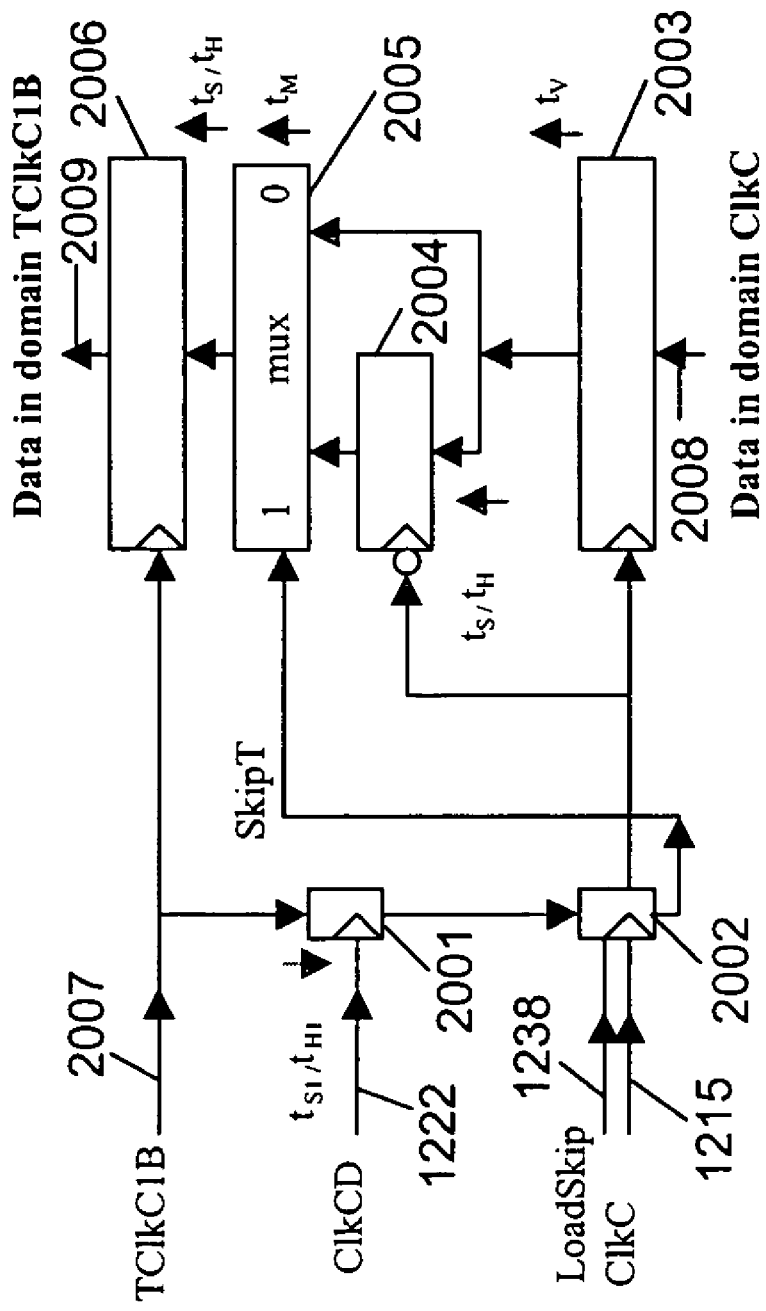
FIG. 20 is a block diagram illustrating the logic details of the skip logic in a controller slice of the transmit block of a memory controller component in accordance with an embodiment of the invention.

FIG. 20 is a block diagram illustrating the logic details of the skip logic of the transmit block 202 of FIG. 13 in accordance with an embodiment of the invention. The skip logic comprises registers 2001, 2002, 2003, 2004, and 2006, and multiplexer 2005. TClkC1B clock input 2007 is provided to register 2001 and is used to clock register 2006. ClkCD clock input 1222 is used to clock register 2001, which provides an output to register 2002. Register 2002 receives LoadSkip signal 1238 and is clocked by ClkC clock signal 1215, providing an output to multiplexer 2005 and an output used to clock registers 2003 and 2004. Register 2003 receives data in domain ClkC at input 2008 and provides an output to register 2004 and multiplexer 2005. Register 2004 provides an output to multiplexer 2005. Multiplexer 2005 provides an output to register 2006. Register 2006 provides data in domain TClkC1B at output 2009.

The circuit of FIG. 20 is used in the transfer of data in the ClkC clock domain to the TClkC1B domain. The two clocks ClkC and TClkC1B have the same frequency, but may be phase mismatched. One technique that can be used in the clock domain crossing is to sample TClkC1B with a delayed version of ClkC called ClkCD (the limits on the amount of delay can vary, but in one embodiment, the delay selected is ¼ of a ClkC cycle). The sampled value, SkipT, determines whether the data in a ClkC register is transferred directly to a TClkC 1 B register, or whether the data first passes through a negative-edge-triggered ClkC register.

Regarding FIG. 20, the following worst case setup constraints can be assumed:

Case C0

$$t_{D,MIN} - t_{S,MIN} >= t_{V,MAX} + t_{M,MAX} + t_{S,MIN}$$

or $$t_{D,MIN} >= t_{S1,MIN} + t_{V,MAX} + t_{M,MAX} + t_{S,MIN} \quad \text{constraint S}$$

Case A1

$$t_{D,MIN} - t_{S1,MIN} >= t_{V,MAX} + t_{S,MIN}$$

or $$t_{D,MIN} >= t_{S1,MIN} + t_{V,MAX} + t_{S,MIN}$$

The following worst case hold constraints can be assumed:

Case D1

$$t_{H,MIN} <= t_{CH,MIN} - t_{D,MAX} - t_{H1,MIN} - t_{V,MIN}$$

or $$t_{D,MAX} <= t_{CH,MIN} - t_{H1,MIN} - t_{V,MIN} - t_{H,MIN}$$

or $$t_{D,MAX} <= t_{CL,MIN} - t_{H1,MIN} - t_{V,MIN} - t_{M,,MIN} - t_{H,MIN}$$

Case B0

$$t_{H,MIN} <= t_{CL,MIN} - t_{D,MAX} - t_{H1,MIN} - t_{V,MIN} - t_{M,MIN}$$

or $$t_{D,MAX} <= t_{CL,MIN} - t_{H1,MIN} - t_{V,MIN} - t_{M,MIN} - t_{H,MIN} \quad \text{constraint H}$$

Definitions for the timing parameters used above may be found in the discussion of FIG. 18 above.

Figure 21:
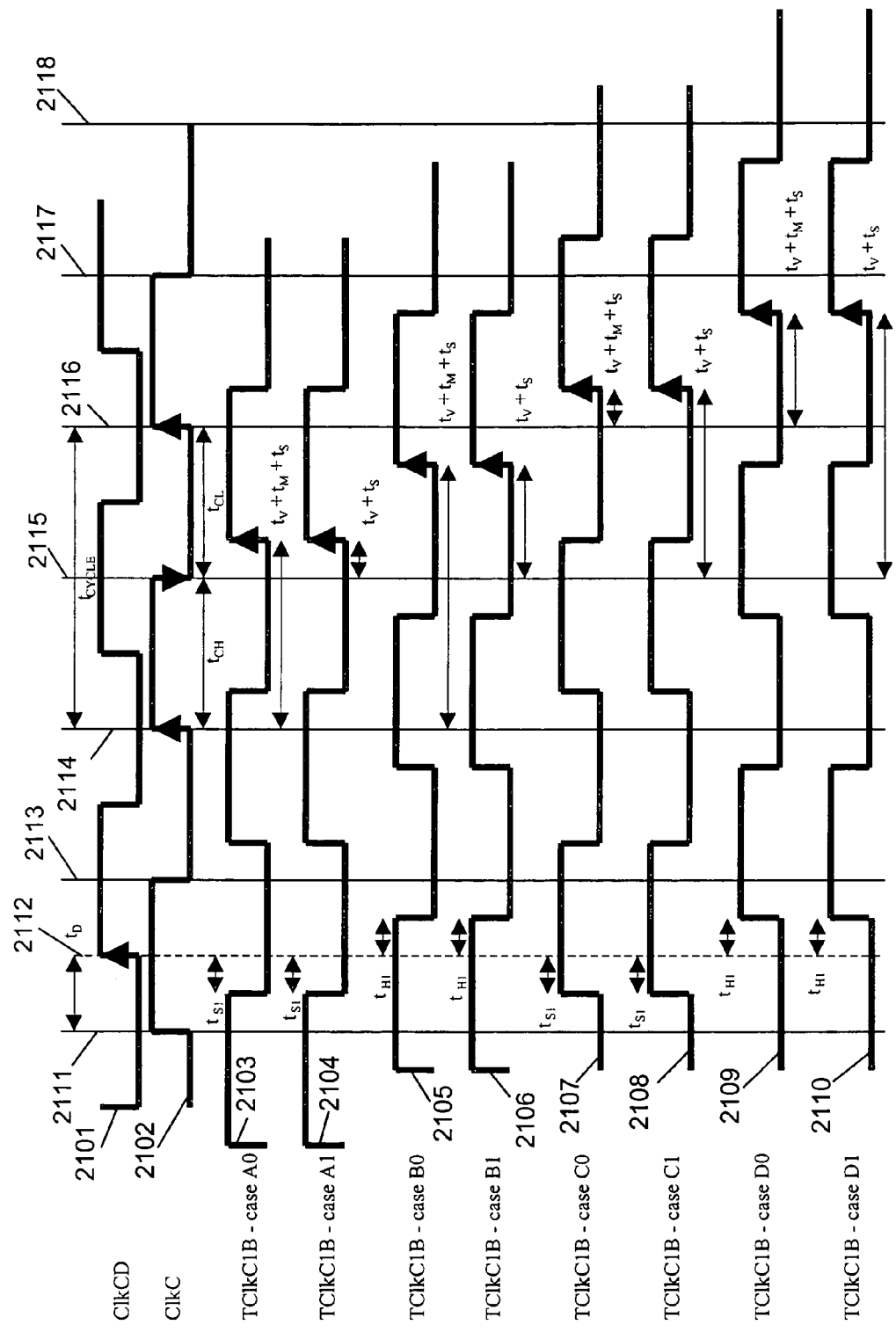
FIG. 21 is a timing diagram illustrating the timing details of the skip logic in a controller slice of the transmit block of a memory controller component in accordance with an embodiment of the invention.

FIG. 21 is a timing diagram illustrating the timing details of the skip logic of the transmit block 202 of FIG. 13 in accordance with an embodiment of the invention. FIG. 21 illustrates waveforms of ClkCD clock signal 2101, ClkC clock signal 2102, TClkC1B (case A0) clock signal 2103, TClkC1B (case A1) clock signal 2104, TClkC1B (case B0) clock signal 2105, TClkC1B (case B1) clock signal 2106, TClkC1B (case C0) clock signal 2107, TClkC1B (case C1) clock signal 2108, TClkC1B (case D0) clock signal 2109, and TClkC1B (case D1) clock signal 2110. Times 2111, 2112, 2113, 2114, 2115, 2116, 2117, and 2118, at intervals of one clock cycle, are illustrated to indicate the timing differences between the clock signals.

FIG. 21 generally summarizes the possible phase alignments of TClkC1B and ClkC as eight cases labeled A0 through D1. These cases are distinguished by the position of the TClkC1B rising and falling edge relative to the set/hold window of the rising edge of ClkCD which samples TClkC1B to determine the SkipR value. Clearly, if the TClkC1B rising or falling edge is outside of this window, it will be correctly sampled. If it is at the edge of the window or inside the window, then it can be sampled as either a zero or one (i.e., the validity of the sample cannot be ensured). The skip logic has been designed such that it functions properly in either case, and this then determines the limits on the delay of the ClkCD clock $t_D$.

For the transmit block, case C0 2107 has the worst case setup constraint, and case B0 2105 has the worst case hold constraint:

$$t_{D,MIN} >= t_{S1,MIN} + t_{V,MAX} + t_{M,MAX} + t_{S,MIN} \quad \text{constraint S}$$

$$t_{D,MAX} <= t_{CL,MIN} - t_{H1,MIN} - t_{V,MIN} - t_{M,MIN} - t_{H,MIN} \quad \text{constraint H}$$

As mentioned earlier, the nominal value of $t_D$ (the delay of ClkCD relative to ClkC) will by ¼ of a ClkC cycle. This can vary up to the $t_{D,MAX}$ value shown above, or down to the $t_{D,MIN}$ value. If the set, hold, mux (i.e., multiplexer), and valid times all went to zero, then the $t_D$ value could vary up to $t_{CH,MIN}$ (the minimum high time of ClkC) and down to zero. However, the finite set/hold window of registers, and the finite clock-to-output (valid time) delay and multiplexer delay combine to reduce the permissible variation of the $t_D$ value.

As described with respect to FIG. 19 above, some elements of the skip logic can be changed for different embodiments while preserving its general functionality. Similarly, as described with respect to the skip logic of FIG. 19, the skip value that is used is preferably generated during initialization and then loaded (with the LoadSkip control signal) into a register.

Figure 22:
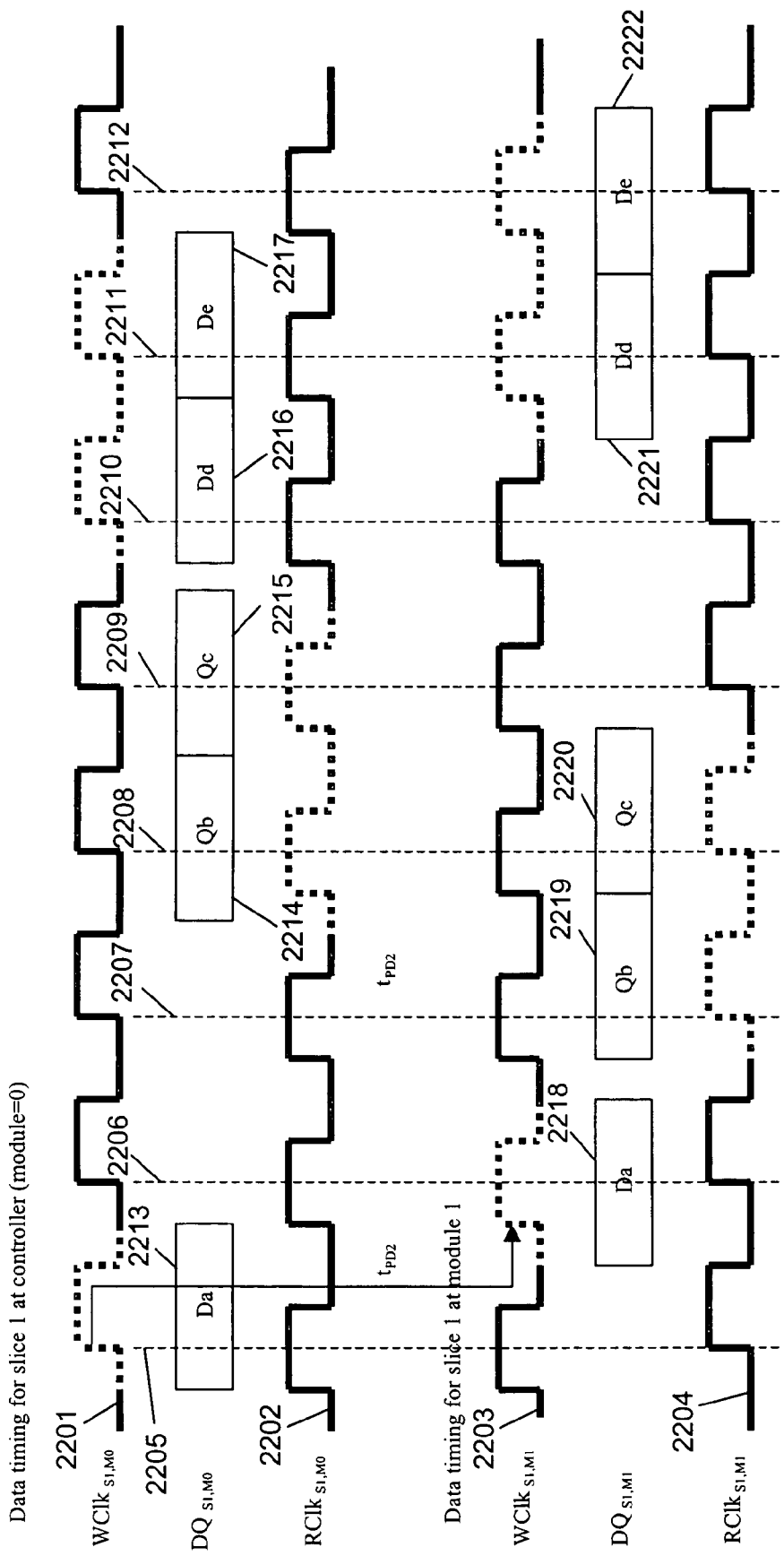
FIG. 22 is a timing diagram illustrating an example of a data clocking arrangement in accordance with an embodiment of the invention.

FIG. 22 is a timing diagram illustrating an example of a data clocking arrangement in accordance with an embodiment of the invention. However, in this example, the clock phases in the memory controller and memory components have been adjusted to a different set of values than in the example illustrated in FIGS. 5 though 21. The waveforms of WClk$_{S1,M0}$ clock signal 2201 and RClk$_{S1,M0}$ clock signal 2202 are illustrated to show the data timing for slice 1 from the perspective of the memory controller component at slice 0. The rising edges of sequential cycles of WClk$_{S1,M0}$ clock signal 2201 occur at times 2205, 2206, 2207, 2208, 2209, 2210, 2211, and 2212, respectively. Write datum information Da 2213 is present on the data lines at the controller at time 2205. Read datum information Qb 2204 is present at time 2208. Read datum information Qc 2215 is present at time 2209. Write datum information Dd 2216 is present at time 2210. Write datum information De 2217 is present at time 2211.

The waveforms of WClk$_{S1,M1}$ clock signal 2203 and RClk$_{S1,M1}$ clock signal 2204 are illustrated to show the data timing for slice 1 from the perspective of the memory component at slice 1. Write datum information Da 2218 is present on the data lines at the memory component at time 2206. Read datum information Qb 2219 is present at time 2207. Read datum information Qc 2220 is present at time 2208. Write datum information Dd 2221 is present at time 2211. Write datum information De 2222 is present at time 2212.

The exemplary system illustrated in FIGS. 5 through 21 assumed that the clock for the read and write data were in phase at each memory component. FIG. 22 assumes that for each slice the read clock at each memory component is in phase with the write clock at the controller (RClk$_{Si,M0}$=WClk$_{Si,M1}$), and because the propagation delay $t_{PD2}$ is the same in each direction, the write clock at each memory component is in phase with the read clock at the controller (WClk$_{Si,M0}$=RClk$_{Si,M1}$). This phase relationship shifts the timing slots for the read and write data relative to FIG. 6, but does not change the fact that two idle cycles are inserted during a write-read-read-write sequence. The phase relationship alters the positions within the system where domain crossings occur (some domain crossing logic moves from the controller into the memory components).

FIGS. 23 through 26 are timing diagrams illustrating an example of a data clocking arrangement in accordance with an embodiment of the invention. However, in this example the clock phases in the memory controller and memory components have been adjusted to a different set of values than those in the example illustrated in FIGS. 5 though 21. The example in FIGS. 23 through 26 also uses a different set of clock phase values than the example in FIG. 22.

Figure 23:
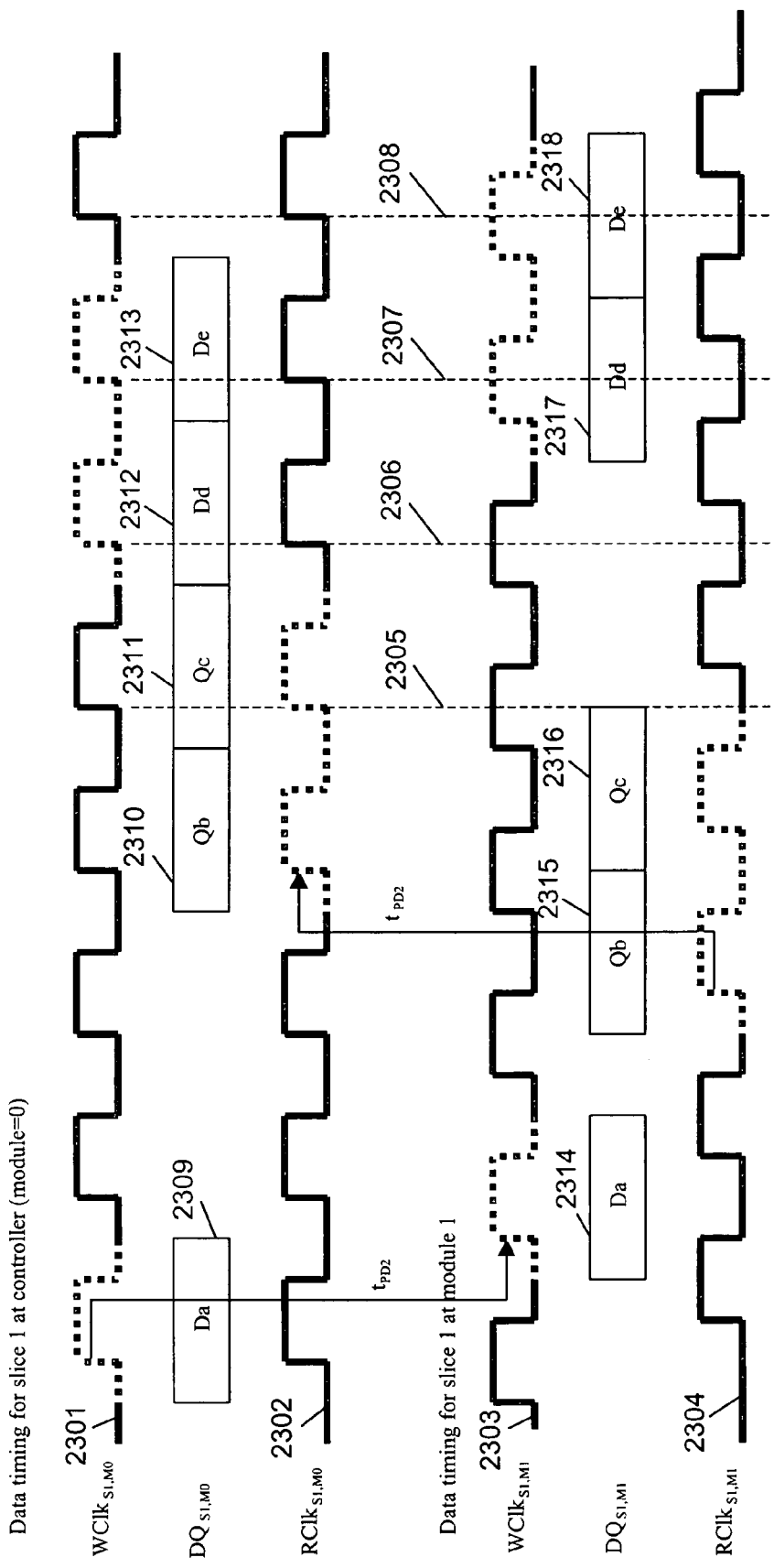
FIG. 23 is a timing diagram illustrating an example of a data clocking arrangement in accordance with an embodiment of the invention.

FIG. 23 is a timing diagram illustrating an example of a data clocking arrangement in accordance with an embodiment of the invention. The waveforms of $WClk_{S1,M0}$ clock signal 2301 and $RClk_{S1,M0}$ clock signal 2302 are illustrated to show the data timing for slice 1 from the perspective of the memory controller component at slice 0. Rising edges of sequential cycles of $WClk_{S1,M0}$ clock signal 2301 occur at times 2305, 2306, 2307, and 2308, respectively. Write datum information Da 2309 is present on the data bus at the controller during a first cycle of $WClk_{S1,M0}$ clock signal 2301. Read datum information Qb 2310 is present at a fourth cycle of $WClk_{S1,M0}$ clock signal 2301. Read datum information Qc 2311 is present at time 2305. Write datum information Dd 2312 is present at time 2306. Write datum information De 2313 is present at time 2307.

The waveforms of $WClk_{S1,M1}$ clock signal 2303 and $RClk_{S1,M1}$ clock signal 2304 are illustrated to show the data timing for slice 1 from the perspective of the memory component at slice 1. Write datum information Da 2314 is advanced one clock cycle relative to its position from the perspective of the memory controller component at slice 0. In other words, the write data appears on the data bus at the memory device approximately one clock cycle later than when it appears on the data bus at the controller. Read datum information Qb 2315 is delayed one clock cycle relative to its position from the perspective of the memory controller component at slice 0. Read datum information Qc 2316 is also delayed one clock cycle relative to its position from the perspective of the memory controller component at slice 0. Write datum information Dd 2317 is present at time 2317. Write datum information De 2318 is present at time 2308.

The example system assumes that the clock for the read and write data are in phase at each memory component. FIG. 23 assumes that for each slice the read clock and write clock are in phase at the controller ($RClk_{Si,M0}=WClk_{Si,M0}$), and also that each slice is in phase with every other slice at the controller ($WClk_{Si,M0}=WClk_{Sj,M0}$). This shifts the timing slots for the read and write data relative to FIG. 6 and FIG. 22, but it does not change the fact that two idle cycles are used during a write-read-read-write sequence. The phase relationship alters the positions within the system where domain crossings occur (all the domain crossing logic moves from the controller into the memory components).

FIG. 6 represents the case in which all three clock phases (address, read data, and write data) are made the same at each memory component, FIG. 23 represents the case in which all three clock phases (address, read data, and write data) are made the same at the memory controller, and FIG. 22 represents one possible intermediate case. This range of cases is shown to emphasize that various embodiments of the invention may be implemented with various phasing. The memory controller and memory components can be readily configured to support any combination of clock phasing.

Figure 24:
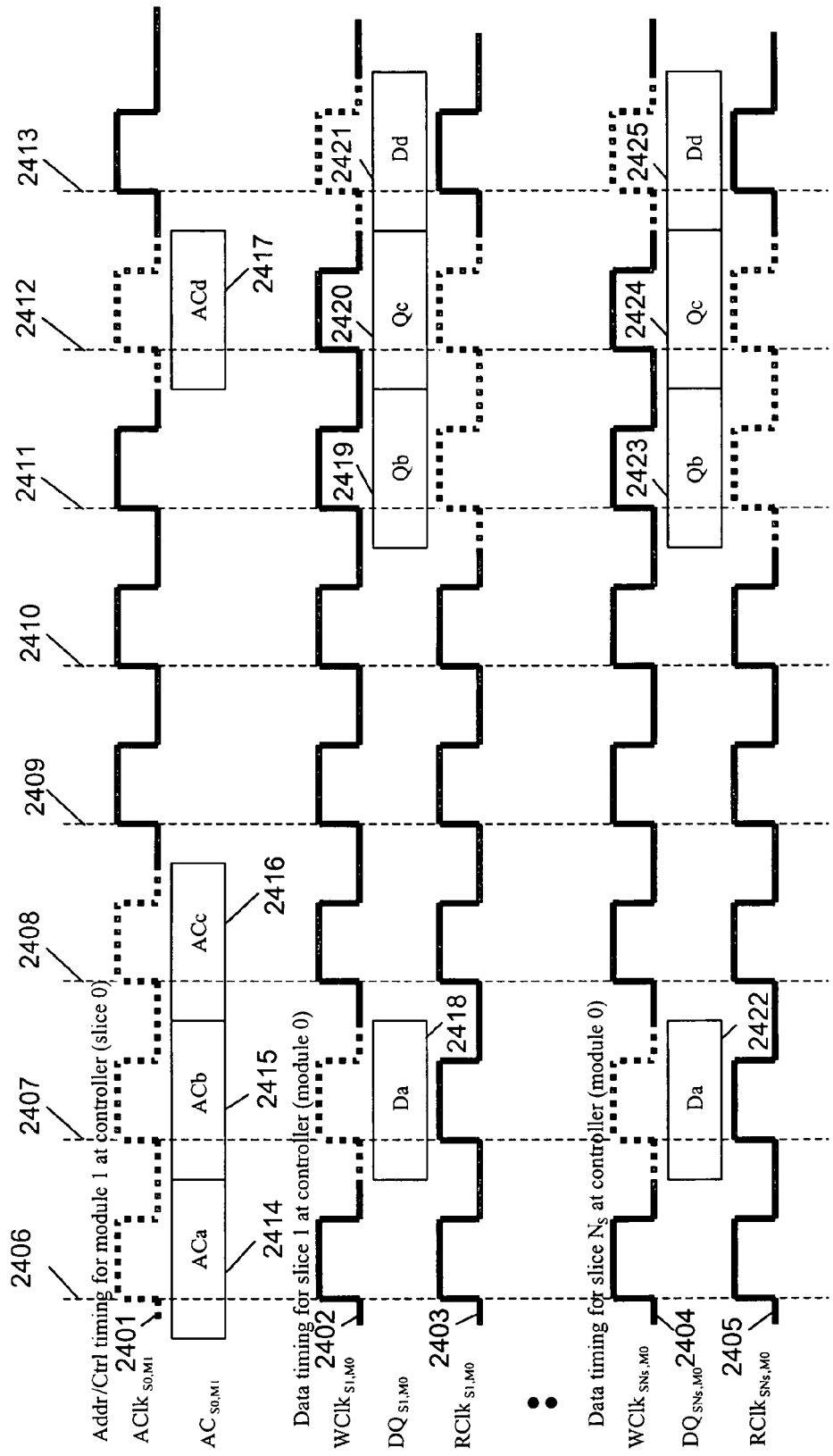
FIG. 24 is a timing diagram illustrating timing at the memory controller component for the example of the data clocking arrangement illustrated in FIG. 23 in accordance with an embodiment of the invention.
Figure 25:
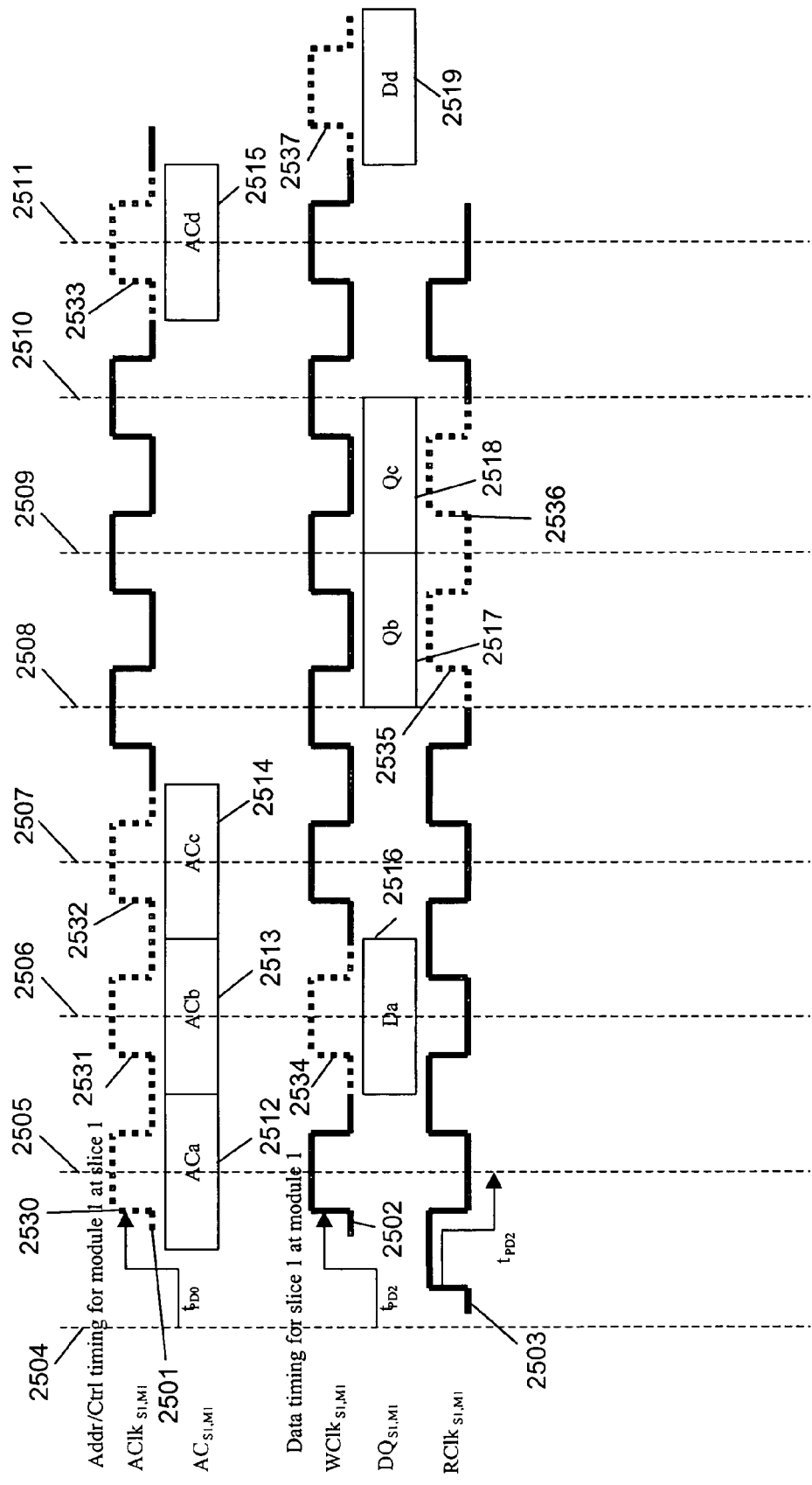
FIG. 25 is a timing diagram illustrating timing at a first slice of a rank of memory components for the example of the data clocking arrangement illustrated in FIG. 23 in accordance with an embodiment of the invention.
Figure 26:
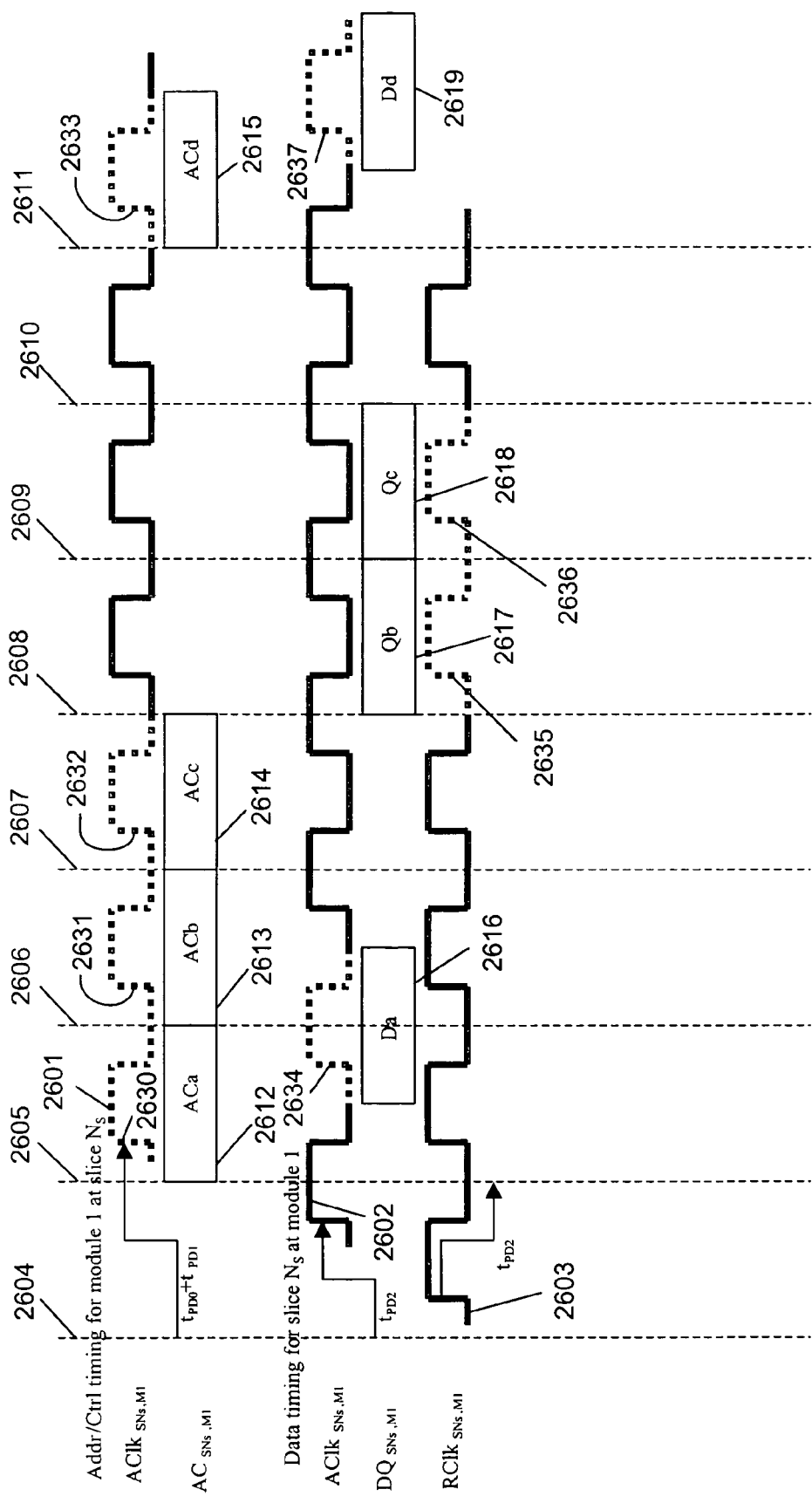
FIG. 26 is a timing diagram illustrating timing a last slice of a rank of memory components for the example of the data clocking arrangement illustrated in FIG. 23 in accordance with an embodiment of the invention.

The one extreme case in which all three clock phases (address, read data, and write data) are made the same at each memory component (illustrated in FIGS. 5 through 21) is important because there is a single clock domain within each memory component. The other extreme case in which all three clock phases (address, read data, and write data) are made the same at the memory controller (FIG. 23) is also important because there is a single clock domain within the controller. FIGS. 24 through 26 further illustrate this case.

FIG. 24 is a timing diagram illustrating timing at the memory controller component for the example of the data clocking arrangement illustrated in FIG. 23 in accordance with an embodiment of the invention. The waveforms of $AClk_{S0,M1}$ clock signal 2401 are illustrated to show the address/control timing for memory module one from the perspective of the memory controller component at slice 0. The rising edges of sequential cycles of $AClk_{S0,M1}$ clock signal 2401 occur at times 2406, 2407, 2408, 2409, 2410, 2411, 2412, and 2413, respectively. Address information ACa 2414 is present on the address signal lines at the controller at time 2406. Address information ACb 2415 is present at time 2407. Address information ACc 2416 is present at time 2408. Address information ACd 2417 is present at time 2412.

The waveforms of $WClk_{S1,M0}$ clock signal 2402 and $RClk_{S1,M0}$ clock signal 2403 are illustrated to show the data timing for slice 1 from the perspective of the memory controller component at module 0. Write datum information Da 2418 is present on the data lines at the controller at time 2407. Read datum information Qb 2419 is present at time 2411. Read datum information Qc 2420 is present at time 2412. Write datum information Dd 2421 is present at time 2413.

The waveforms of $WClk_{SNs,M0}$ clock signal 2404 and $RClk_{SNs,M0}$ clock signal 2405 are illustrated to show the data timing for slice $N_S$ from the perspective of the memory controller component at module 0. Write datum information Da 2422 is present on the data lines at the controller at time 2407. Read datum information Qb 2423 is present at time 2411. Read datum information Qc 2424 is present at time 2412. Write datum information Dd 2425 is present at time 2413.

FIGS. 24 through 26 show the overall system timing for the case in which all clock phases are aligned at the controller. FIG. 24 is the timing at the controller, and is analogous to FIG. 7, except for the fact that the clocks are all common at the controller instead of at each memory slice. As a result, the clocks are all aligned in FIG. 24, and the two-cycle gap that the controller inserts into the write-read-read-write sequence is apparent between address packets ACc and ACd.

FIG. 25 is a timing diagram illustrating timing at a first slice of a rank of memory components for the example of the data clocking arrangement illustrated in FIG. 23 in accordance with an embodiment of the invention. The waveforms of $AClk_{S1,M1}$ clock signal 2501 is illustrated to show the address/control timing for memory module one from the perspective of the memory component at slice 1. Times 2504, 2505, 2506, 2507, 2508, 2509, 2510, and 2511 correspond to times 2406, 2407, 2408, 2409, 2410, 2411, 2412, and 2413, respectively, of FIG. 24. Signal $AClk_{S1,M1}$ 2501 is delayed by a delay of $t_{PD0}$ relative to signal $AClk_{S0,M1}$ 2401 in FIG. 24. In other words, the AClk signal takes a time period $t_{PD0}$ to propagate from the controller to the memory component. Address information ACa 2512 is associated with edge 2530 of signal 2501. Address information ACb 2513 is associated with edge 2531 of signal 2501. Address information ACc 2514 is associated with edge 2532 of signal 2501. Address information ACd 2515 is associated with edge 2533 of signal 2501.

The waveforms of $WClk_{S1,M1}$ clock signal 2502 and $RClk_{S1,M1}$ clock signal 2503 are illustrated to show the data timing for slice 1 from the perspective of the memory component at module 1. FIG. 25 shows the timing at the first memory component (slice 1), and the clocks have become misaligned because of the propagation delays $t_{PD2}$ and $t_{PD0}$. Signal $WClk_{S1,M1}$ 2502 is delayed by a delay of $t_{PD2}$ relative to signal $WClk_{S1,M0}$ 2402 of FIG. 24. Write datum information Da 2516 is associated with edge 2534 of signal 2502.

Write datum information Dd 2519 is associated with edge 2537 of signal 2502. Signal RClk$_{S1,M1}$ 2503 precedes by t$_{PD2}$ signal RClk$_{S1,M0}$ 2403 of FIG. 24. Read datum information Qb 2517 is associated with edge 2535 of signal 2503. Read datum information Qc 2518 is associated with edge 2536 of signal 2503.

FIG. 26 is a timing diagram illustrating timing a last slice of a rank of memory components for the example of the data clocking arrangement illustrated in FIG. 23 in accordance with an embodiment of the invention. The waveforms of AClk$_{SNs,M1}$ clock signal 2601 are illustrated to show the address/control timing for memory module one from the perspective of the memory component at slice N$_S$. Times 2604, 2605, 2606, 2607, 2608, 2609, 2610, and 2611 correspond to times 2406, 2407, 2408, 2409, 2410, 2411, 2412, and 2413, respectively, of FIG. 24. Signal AClk$_{SNs,M1}$ 2601 is delayed by a delay of t$_{PD0}$+t$_{PD1}$ relative to signal AClk$_{S0,M1}$ 2401 of FIG. 24. In other words, address information ACa 2612 is associated with edge 2630 of signal 2601. Address information ACb 2613 is associated with edge 2631 of signal 2601. Address information ACc 2614 is associated with edge 2632 of signal 2601. Address information ACd 2615 is associated with edge 2633 of signal 2601.

The waveforms of WClk$_{SNs,M1}$ clock signal 2602 and RClk$_{SNs,M1}$ clock signal 2603 are illustrated to show the data timing for slice N$_S$ from the perspective of the memory component at module 1. Signal WClk$_{SNs,M1}$ 2602 is delayed by a delay of t$_{PD2}$ relative to signal WClk$_{S1,M0}$ 2402 of FIG. 24. Write datum information Da 2616 is associated with edge 2634 of signal 2602 (e.g., the write datum information Da 2616 is present on the data bus at the memory component when edge 2634 of signal 2602 is present on the AClk clock conductor at the memory component). Write datum information Dd 2619 is associated with edge 2637 of signal 2602. Signal RClk$_{SNs,M1}$ 2603 precedes by t$_{PD2}$ signal RClk$_{S1,M0}$ 2603 of FIG. 24. Read datum information Qb 2617 is associated with edge 2635 of signal 2603. Read datum information Qc 2618 is associated with edge 2636 of signal 2603.

FIG. 26 shows the timing at the last memory component (slice N$_S$), and the clocks have become further misaligned because of the propagation delays t$_{PD1}$. As a result, each memory component will have domain crossing hardware similar to that which is in the controller, as described with respect to FIGS. 12-21.

As a reminder, the example system described in FIG. 2 included single memory module, a single rank of memory components on that module, a common address and control bus (so that each controller pin connects to a pin on each of two or more memory components), and a sliced data bus (wherein each controller pin connects to a pin on exactly one memory component). These characteristics were chosen for the example embodiment in order to simplify the discussion of the details and because this configuration is an illustrative special case. However, the clocking methods that have been discussed can be extended to a wider range of system topologies. Thus, it should be understood that embodiments of the invention may be practiced with systems having features that differ from the features of the example system of FIG. 2.

The rest of this discussion focuses on systems with multiple memory modules or multiple memory ranks per module (or both). In these systems, each data bus wire connects to one controller pin and to one pin on each of two or more memory components. Since the t$_{PD2}$ propagation delay between the controller and each of the memory components will be different, the clock domain crossing issue in the controller becomes more complicated. I. f the choice is made to align all clocks in each memory component, then the controller will need a set of domain crossing hardware for each rank or module of memory components in a slice. This suffers from a drawback in that it requires a large amount of controller area and that it adversely affects critical timing paths. As such, in a multiple module or multiple rank system, it may be preferable to keep all of the clocks aligned in the controller, and to place the domain crossing logic in the memory components.

Figure 27:
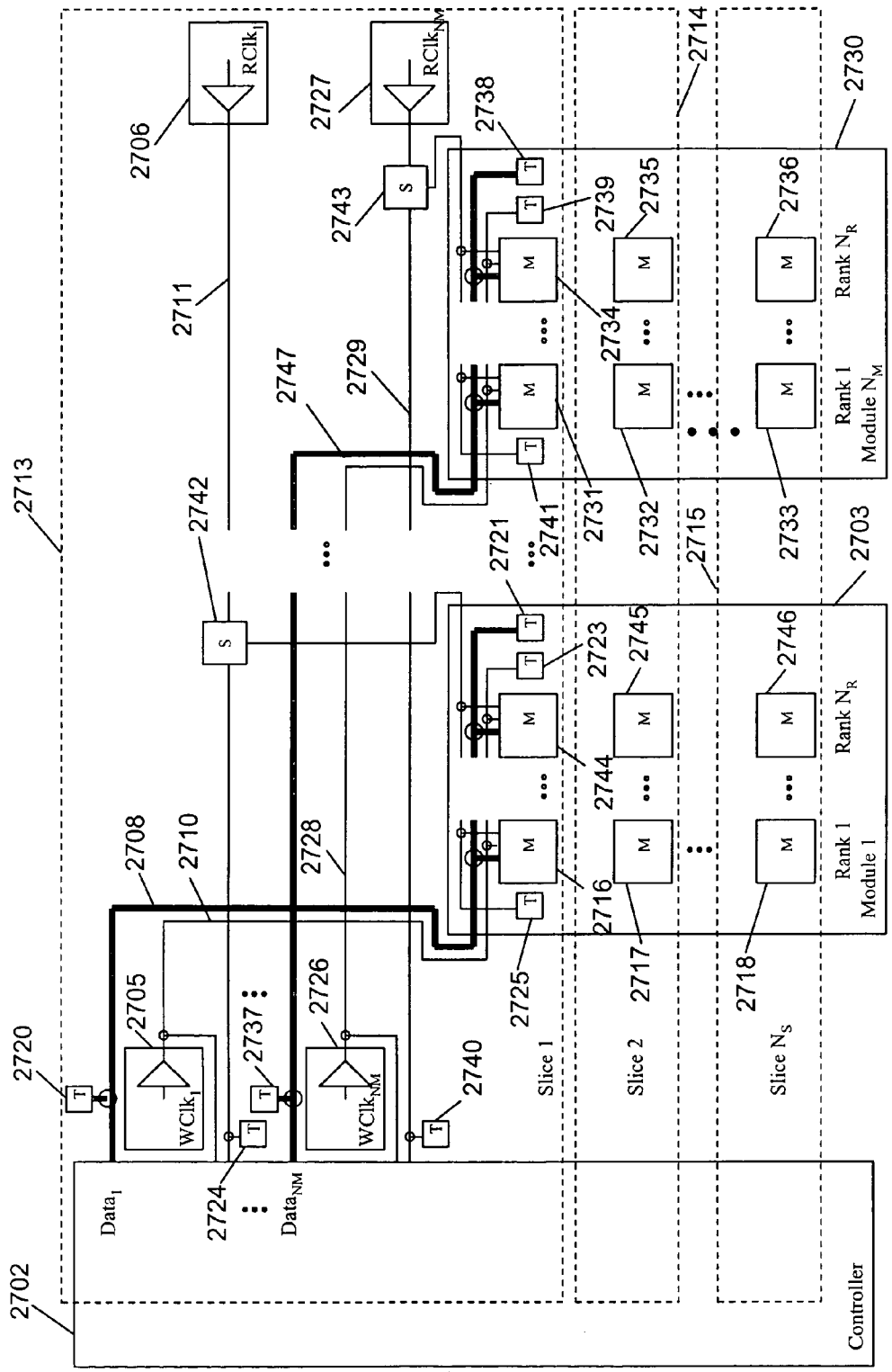
FIG. 27 is a block diagram illustrating a memory system that may comprise multiple ranks of memory components and multiple memory modules in accordance with an embodiment of the invention.

FIG. 27 is a block diagram illustrating a memory system that includes multiple ranks of memory components and multiple memory modules in accordance with an embodiment of the invention. The memory system comprises memory controller component 2702, memory module 2703, memory module 2730, write clock 2705, read clock 2706, write clock 2726, read clock 2727, splitting component 2742, splitting component 2743, termination component 2720, termination component 2724, termination component 2737, and termination component 2740. It should be understood that there is at least one write clock per slice in the example system shown.

Within each memory module, memory components are organized in ranks. A first rank of memory module 2703 includes memory components 2716, 2717, and 2718. 1S A second rank of memory module 2703 includes memory components 2744, 2745, and 2746. A first rank of memory module 2730 includes memory components 2731, 2732, and 2733. A second rank of memory module 2730 includes memory components 2734, 2735, and 2736.

The memory system is organized into slices across the memory controller component and the memory modules. Examples of these slices include slice 2713, slice 2714, and slice 2715. Each slice comprises one memory component of each rank. In this embodiment, each slice within each memory module is provided with its own data bus 2708, write clock conductor 2710, and read clock conductor 2711. Data bus 2708 is coupled to memory controller component 2702, memory component 2716, and memory component 2744. A termination component 2720 is coupled to data bus 2708 near memory controller component 2702, and may, for example, be incorporated into memory controller component 2702. A termination component 2721 is coupled near an opposite terminus of data bus 2708, and is preferably provided within memory module 2703. Write clock 2705 is coupled to write clock conductor 2710, which is coupled to memory controller component 2702 and to memory components 2716 and 2744. A termination component 2723 is coupled near a terminus of write clock conductor 2710 near memory components 2716 and 2744, preferably within memory module 2703. Read clock 2706 is coupled to read clock conductor 2711, which is coupled through splitting component 2742 to memory controller component 2702 and memory components 2716 and 2744. Splitting components are described in additional detail below. A termination component 2724 is coupled near memory controller component 2702, and may, for example, be incorporated into memory controller component 2702. A termination component 2725 is coupled near a terminus of read clock conductor 2711 near memory components 2716 and 2744, preferably within memory module 2703.

Slice 2713 of memory module 2730 is provided with data bus 2747, write clock conductor 2728, read clock conductor 2729. Data bus 2747 is coupled to memory controller component 2702, memory component 2731, and memory component 2734. A termination component 2737 is coupled to data bus 2747 near memory controller component 2702, and may, for example, be incorporated into memory controller component 2702. A termination component 2738 is coupled near an opposite terminus of data bus 2747, and is preferably provided within memory module 2730. Write clock 2726 is coupled to write clock conductor 2728, which is coupled to memory controller component 2702 and to memory components 2731 and 2734. A termination component 2739 is coupled near a terminus of write clock conductor 2728 near memory components 2731 and 2734, preferably within memory module 2730. Read clock 2727 is coupled to read clock conductor 2729, which is coupled through splitting component 2743 to memory controller component 2702 and memory components 2731 and 2734. A termination component 2740 is coupled near memory controller component 2702, and may, for example, be incorporated into memory controller component 2702. A termination component 2741 is coupled near a terminus of read clock conductor 2729 near memory components 2731 and 2734, preferably within memory module 2730.

The sliced data bus can be extended to multiple ranks of memory component and multiple memory components in a memory system. In this example, there is a dedicated data bus for each slice of each module. Each data bus is shared by the ranks of memory devices on each module. It is preferable to match the impedances of the wires as they transition from the main printed wiring board onto the modules so that they do not differ to an extent that impairs performance. In some embodiments, the termination components are on each module. A dedicated read and write clock that travels with the data is shown for each data bus, although these could be regarded as virtual clocks; i.e. the read and write clocks could be synthesized from the address/control clock as in the example system that has already been described.

Figure 28:
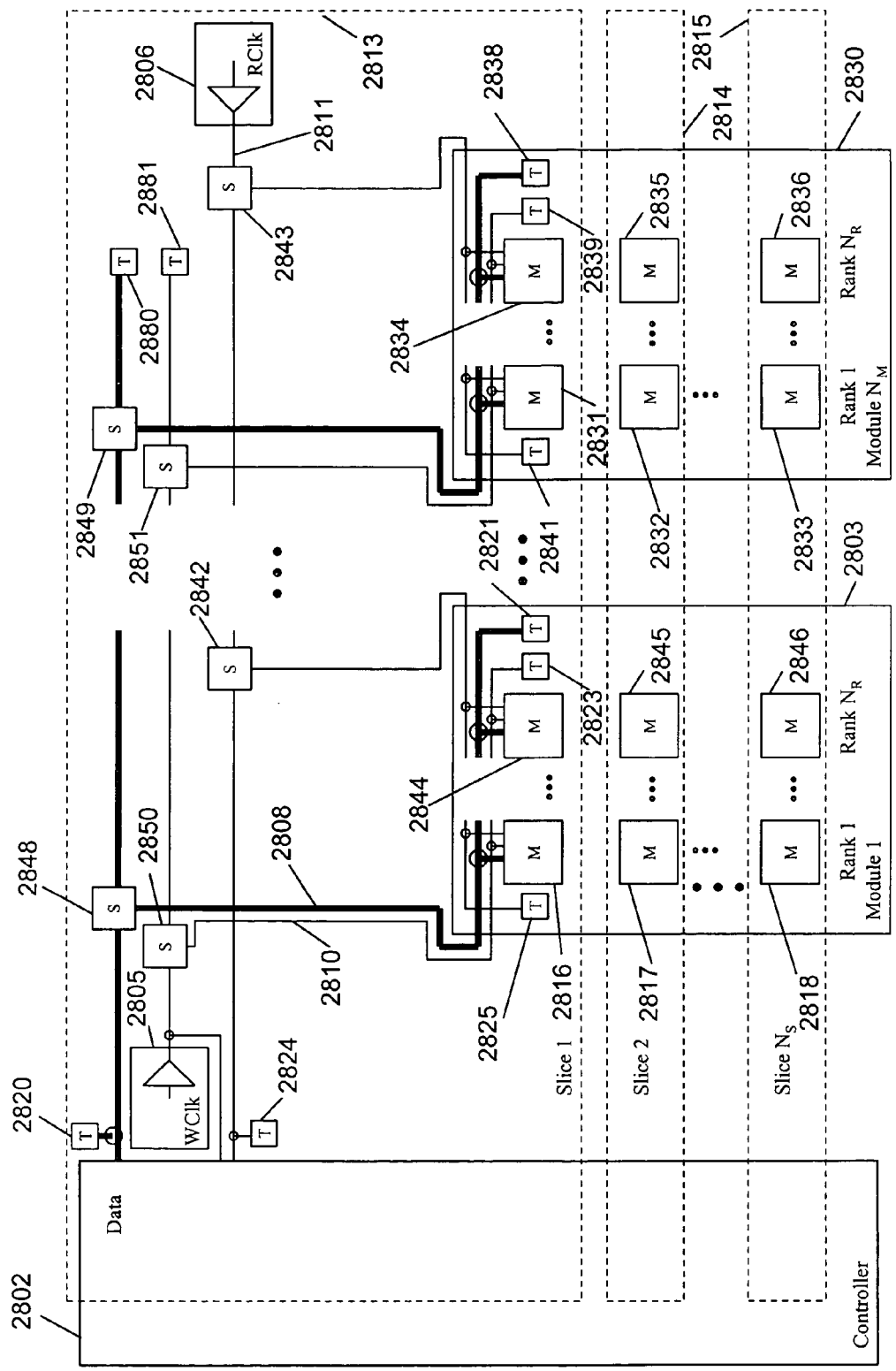
FIG. 28 is a block diagram illustrating a memory system that may comprise multiple ranks of memory components and multiple memory modules in accordance with an embodiment of the invention.

FIG. 28 is a block diagram illustrating a memory system that includes multiple ranks of memory components and multiple memory modules in accordance with an embodiment of the invention. The memory system comprises memory controller component 2802, memory module 2803, memory module 2830, write clock 2805, read clock 2806, splitting component 2842, splitting component 2843, splitting component 2428, splitting component 2849, splitting component 2850, splitting component 2851, termination component 2820, termination component 2824, termination component 2880, and termination component 2881.

Within each memory module, memory components are organized in ranks. A first rank of memory module 2803 includes memory components 2816, 2817, and 2818. A second rank of memory module 2803 includes memory components 2844, 2845, and 2846. A first rank of memory module 2830 includes memory components 2831, 2832, and 2833. A second rank of memory module 2830 includes memory components 2834, 2835, and 2836.

The memory system is organized into slices across the memory controller component and the memory modules. Examples of these slices include slice 2813, slice 2814, and slice 2815. Each slice comprises one memory component of each rank. In this embodiment, each slice across multiple memory modules is provided with a data bus 2808, write clock conductor 2810, and read clock conductor 2811. Data bus 2808 is coupled to memory controller component 2802, via splitter 2848 to memory components 2816 and 2844, and via splitter 2849 to memory components 2831 and 2834. A termination component 2820 is coupled to data bus 2808 near memory controller component 2802, and may, for example, be incorporated into memory controller component 2802. A termination component 2880 is coupled near an opposite terminus of data bus 2808, near splitter 2849. A termination component 2821 is coupled near memory components 2816 and 2844 and is preferably provided within memory module 2803. A termination component 2838 is coupled near memory components 2831 and 2834 and is preferably provided within memory module 2830.

Write clock 2805 is coupled to write clock conductor 2810, which is coupled to memory controller component 2802, via splitter 2850 to memory components 2816 and 2844, and via splitter 2851 to memory components 2831 and 2834. A termination component 2881 is coupled near a terminus of write clock conductor 2810, near splitter 2851. A termination component 2823 is coupled near memory components 2816 and 2844, preferably within memory module 2803. A termination component 2839 is coupled near memory components 2831 and 2834, preferably within memory module 2830.

Read clock 2806 is coupled to read clock conductor 2811, which is coupled through splitting component 2843 to memory components 2831 and 2834 and through splitting component 2842 to memory controller component 2802 and memory components 2816 and 2844. A termination component 2824 is coupled near memory controller component 2802, and may, for example, be incorporated into memory controller component 2802. A termination component 2825 is coupled near a terminus of read clock conductor 2811 near memory components 2816 and 2844, preferably within memory module 2803. A termination component 2841 is coupled near a terminus of read clock conductor 2811 near memory components 2831 and 2834, preferably within memory module 2830.

As illustrated, this example utilizes a single data bus per data slice that is shared by all the memory modules, as in FIG. 28. In this example, each data wire is tapped using some form of splitting component S. This splitter could be a passive impedance matcher (three resistors in a delta- or y-configuration) or some form of active buffer or switch element. In either case, the electrical impedance of each wire is maintained down its length (within manufacturing limits) so that signal integrity is kept high. As in the previous configuration, each split-off data bus is routed onto a memory module, past all the memory components in the slice, and into a termination component.

Figure 29:
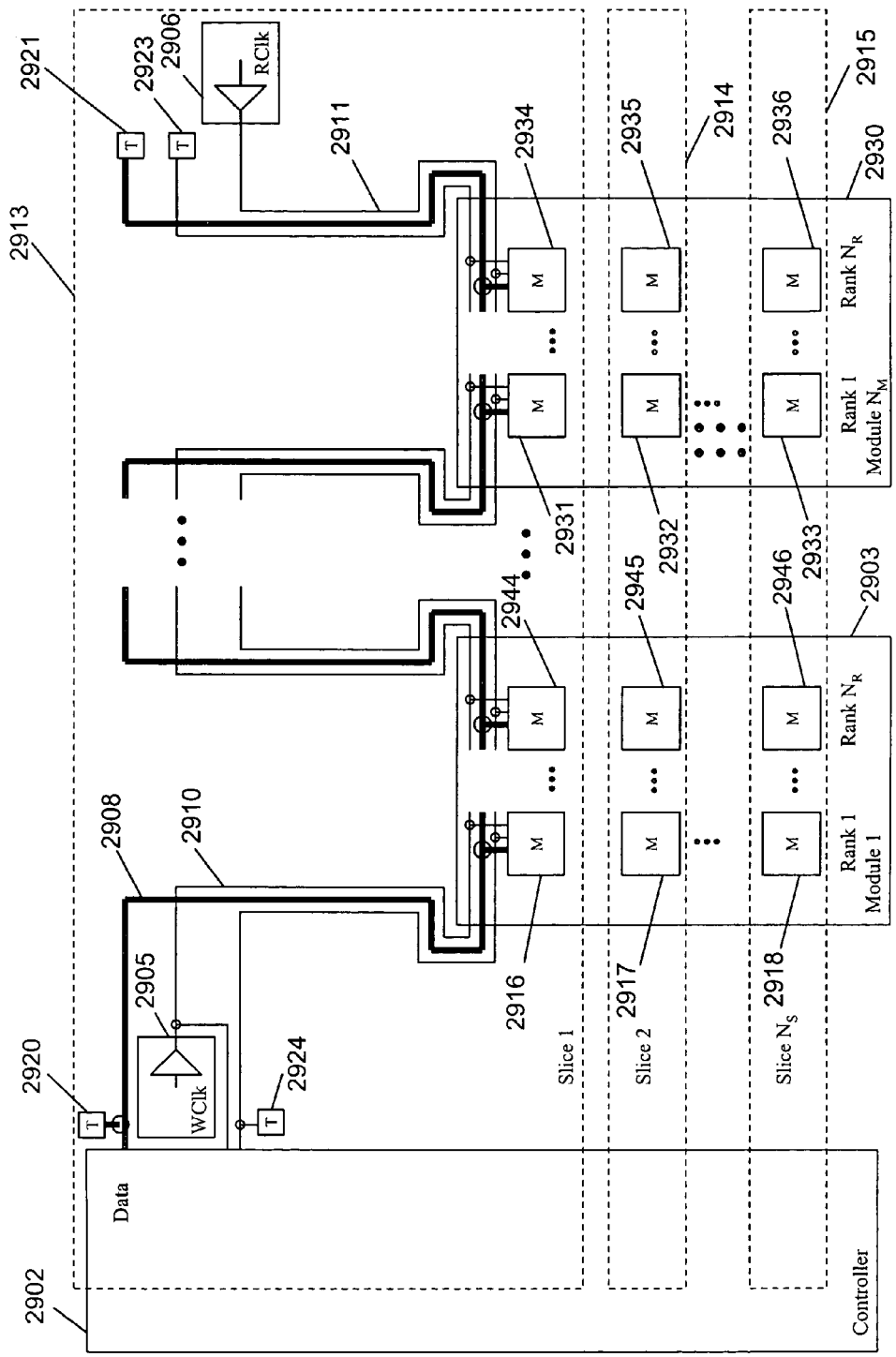
FIG. 29 is a block diagram illustrating a memory system that comprises multiple ranks of memory components and multiple memory modules in accordance with an embodiment of the invention.

FIG. 29 is a block diagram illustrating a memory system that comprises multiple ranks of memory components and multiple memory modules in accordance with an embodiment of the invention. The memory system comprises memory controller component 2902, memory module 2903, memory module 2930, write clock 2905, read clock 2906, termination component 2920, termination component 2921, termination component 2923, and termination component 2924.

Within each memory module, memory components are organized in ranks. A first rank of memory module 2903 includes memory components 2916, 2917, and 2918. A second rank of memory module 2903 includes memory components 2944, 2945, and 2946. A firs t rank of memory module 2930 includes memory components 2931, 2932, and 2933. A second rank of memory module 2930 includes memory components 2934, 2935, and 2936.

The memory system is organized into slices across the memory controller component and the memory modules. Examples of these slices include slice 2913, slice 2914, and slice 2915. Each slice comprises one memory component of each rank. In this embodiment, each slice across memory modules shares a common daisy-chained data bus 2908, a common daisy-chained write clock conductor 2910, and a common daisy-chained read clock conductor 2911. Data bus 2908 is coupled to memory controller component 2902, memory component 2916, memory component 2944, memory component 2931, and memory component 2934. A termination component 2920 is coupled to data bus 2908 near memory controller component 2902, and may, for example, be incorporated into memory controller component 2902. A termination component 2921 is coupled near an opposite terminus of data bus 2908.

Write clock 2905 is coupled to write clock conductor 2910, which is coupled to memory controller component 2902 and to memory components 2916, 2944, 2931, and 2934. A termination component 2923 is coupled near a terminus of write clock conductor 2910. Read clock 2906 is coupled to read clock conductor 2911, which is coupled to memory controller component 2902 and memory components 2916, 2944, 2931, and 2934. A termination component 2924 is coupled near memory controller component 2902, and may, for example, be incorporated into memory controller component 2902.

In this embodiment, there is a single data bus per data slice, but instead of using splitting components, each data wire is routed onto a memory module, past all the memory components of the slice, and back off the module and onto the main board to "chain" through another memory module or to pass into a termination component. The same three configuration alternatives described above with respect to the data bus are also applicable to a common control/address bus in a multi-module, multi-rank memory system.

Figure 30:
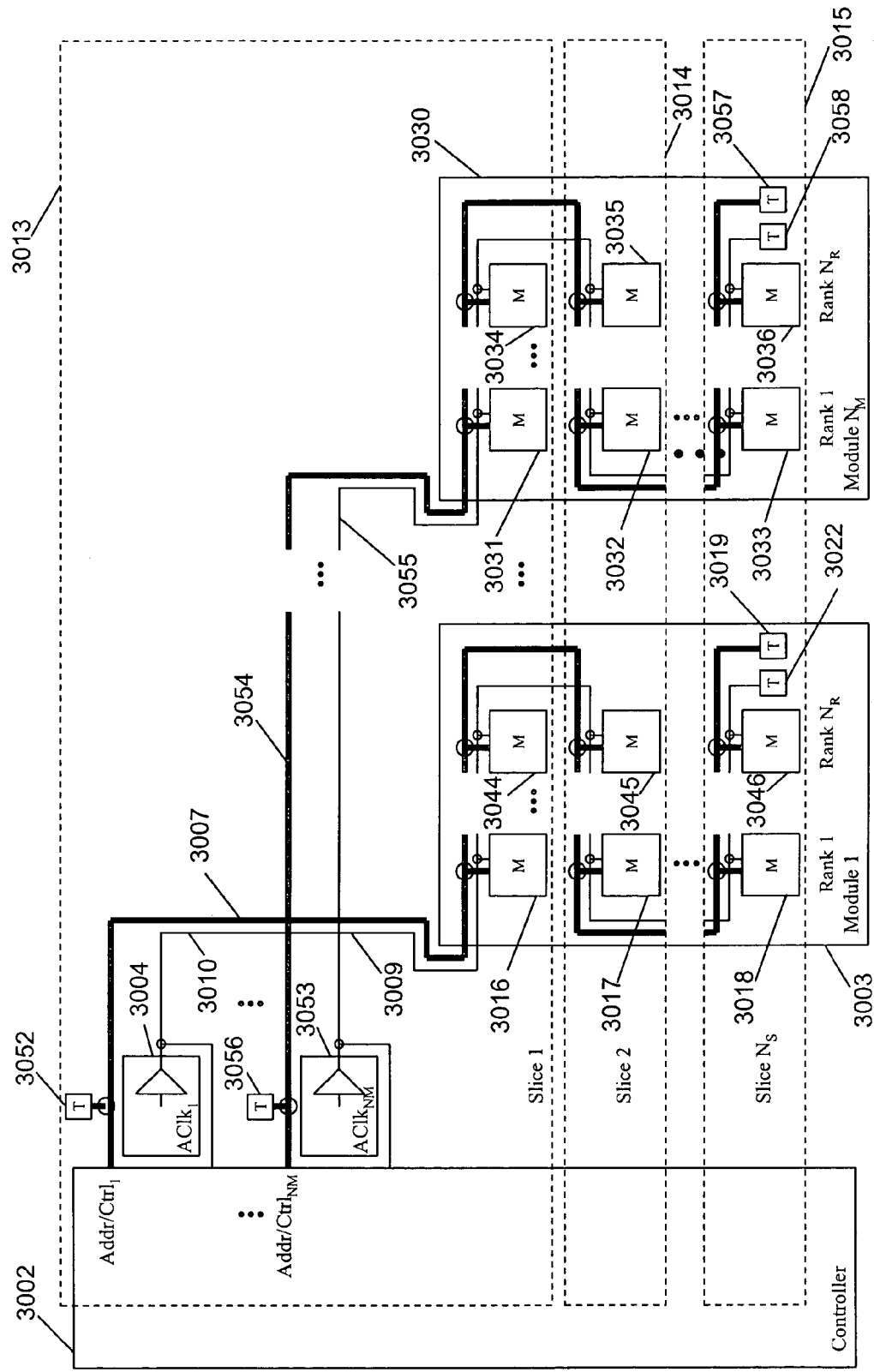
FIG. 30 is a block diagram illustrating a memory system that comprises multiple ranks of memory components and multiple memory modules with a dedicated control/address bus per memory module in accordance with an embodiment of the invention.

FIG. 30 is a block diagram illustrating a memory system that comprises multiple ranks of memory components and multiple memory modules with a dedicated control/address bus per memory module in accordance with an embodiment of the invention. The memory system comprises memory controller component 3002, memory module 3003, memory module 3030, address/control clock 3004, address/control clock 3053, termination component 3052, and termination component 3056.

Within each memory module, memory components are organized in ranks. A first rank of memory module 3003 includes memory components 3016, 3017, and 3018. A second rank of memory module 3003 includes memory components 3044, 3045, and 3046. A first rank of memory module 3030 includes memory components 3031, 3032, and 3033. A second rank of memory module 3030 includes memory components 3034, 3035, and 3036.

The memory system is organized into slices across the memory controller component and the memory modules. Examples of these slices include slice 3013, slice 3014, and slice 3015. Each slice comprises one memory component of each rank. In this embodiment, each memory module is provided with its own address bus 3007 and address/control clock conductor 3010. Address bus 3007 is coupled to memory controller component 3002 and memory components 3016, 3017, 3018, 3044, 3045, and 3046. A termination component 3052 is coupled to address bus 3007 near memory controller component 3002, and may, for example, be incorporated into memory controller component 3002. A termination component 3019 is coupled near an opposite terminus of address bus 3007, and is preferably provided within memory module 3003. Address/control clock 3004 is coupled to address/control clock conductor 3009, which is coupled to memory controller component 3002 and to memory components 3016, 3017, 3018, 3044, 3045, and 3046. A termination component 3022 is coupled near a terminus of address/control clock conductor 3009, preferably within memory module 3003.

Memory module 3030 is provided with address bus 3054 and address/control clock conductor 3055. Address bus 3054 is coupled to memory controller component 3002 and to memory components, 3031, 3032, 3033, 3034, 3035, and 3036. A termination component 3056 is coupled to address bus 3054 near memory controller component 3002, and may, for example, be incorporated into memory controller component 3002. A termination component 3057 is coupled near an opposite terminus of address bus 3054 and is preferably provided within memory module 3030. Address/control clock 3053 is coupled to address/control clock conductor 3055, which is coupled to memory controller component 3002 and to memory components 3031, 3032, 3033, 3034, 3035, and 3036. A termination component 3058 is coupled near a terminus of address/control clock conductor 3055, preferably within memory module 3030.

Each control/address wire is routed onto a memory module, past all the memory components, and into a termination component. The wire routing is shown in the direction of the ranks on the module, but it could also be routed in the direction of slices.

Figure 31:
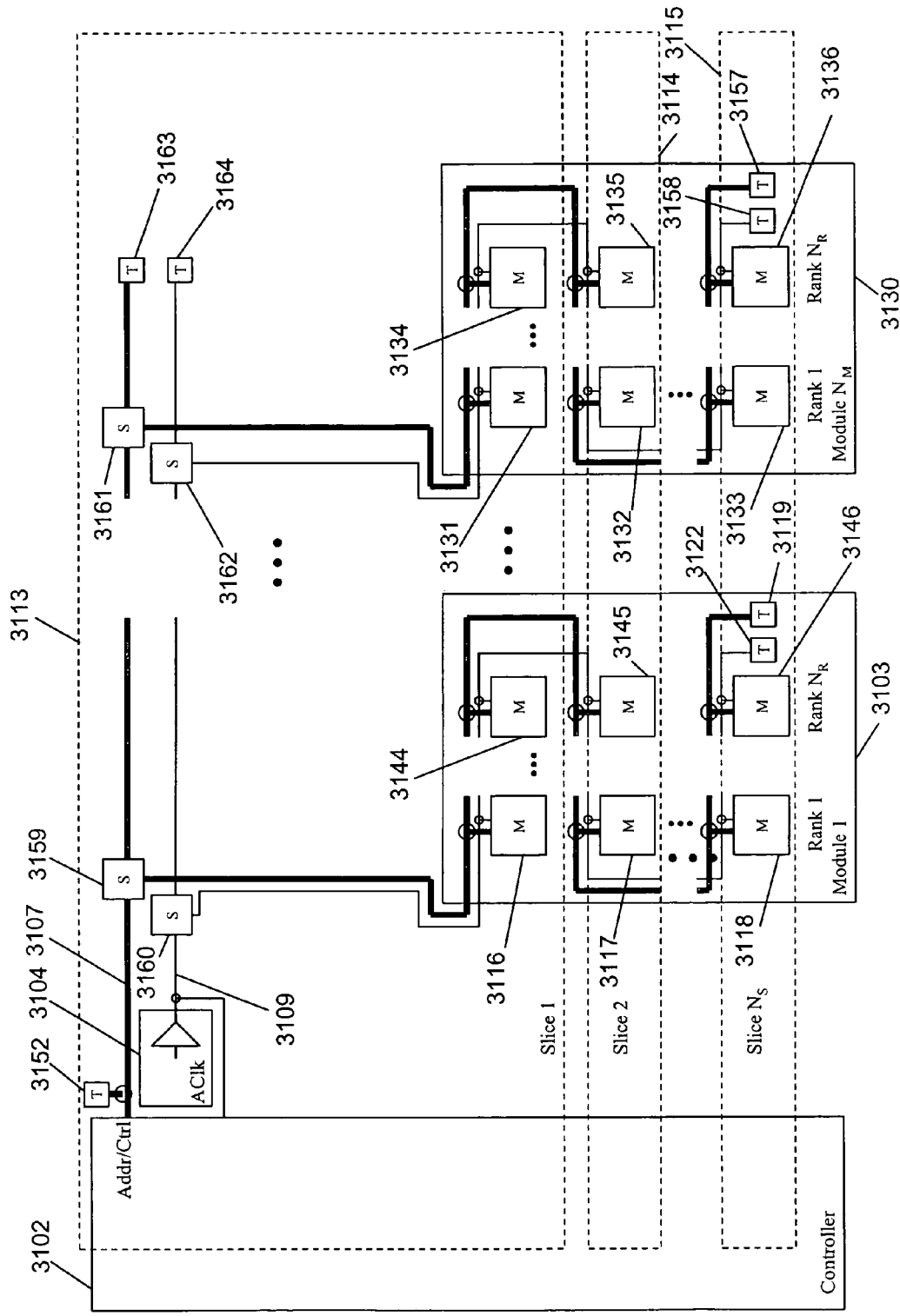
FIG. 31 is a block diagram illustrating a memory system that comprises multiple ranks of memory components and multiple memory modules with a single control/address bus that is shared among the memory modules in accordance with an embodiment of the invention.

FIG. 31 is a block diagram illustrating a memory system that comprises multiple ranks of memory components and multiple memory modules with a single control/address bus that is shared among the memory modules in accordance with an embodiment of the invention. The memory system comprises memory controller component 3102, memory module 3103, memory module 3130, address/control clock 3104, splitting component 3159, splitting component 3160, splitting component 3161, splitting component 3162, termination component 3163, and termination component 3164.

Within each memory module, memory components are organized in ranks. A first rank of memory module 3103 includes memory components 3116, 3117, and 31. A second rank of memory module 3103 includes memory components 3144, 3145, and 3146. A firs t rank of memory module 3130 includes memory components 3131, 3132, and 3133. A second rank of memory module 3130 includes memory components 3134, 3135, and 3136.

The memory system is organized into slices across the memory controller component and the memory modules. Examples of these slices include slice 3113, slice 3114, and slice 3115. Each slice comprises one memory component of each rank. In this embodiment, an address bus 3107 and an address/control clock conductor 3109 are coupled to each memory component among multiple memory modules. Address bus 3107 is coupled to memory controller component 3102, via splitter 3159 to memory components 3116, 3117, 3118, 3144, 3145, and 3146, and via splitter 3161 to memory components 3131, 3132, 3133, 3134, 3135, and 3136. A termination component 3152 is coupled to address bus 3107 near memory controller component 3102, and may, for example, be incorporated into memory controller component 3102. A termination component 3163 is coupled near an opposite terminus of address bus 3107, near splitter 3161. A termination component 3119 is coupled to address bus 3107, preferably within memory module 3103. A termination component 3157 is coupled to address bus 3107, preferably within memory module 3130.

Address/control clock 3104 is coupled to address/control clock conductor 3109, which is coupled to memory controller component 3102, via splitter 3160 to memory components 3116, 3117, 3118, 3144, 3145, and 3146, and via splitter 3162 to memory components 3131, 3132, 3133, 3134, 3135, and 3136. A termination component 3164 is coupled near a terminus of address/control clock conductor 3109, near splitter 3162. A termination component 3122 is coupled to the address/control clock conductor 3109, preferably within memory module 3103. A termination component 3158 is coupled to the address/control clock conductor 3109, preferably within memory module 3130.

In this example, each control/address wire is tapped using some form of splitting component S. This splitter could be a passive impedance matcher (three resistors in a delta- or y-configuration) or some form of active buffer or switch element. In either case, the electrical impedance of each wire is maintained down its length (within manufacturing limits) so that signal integrity is kept high. As in the previous configuration, each split-off control/address bus is routed onto a memory module, past all the memory components, and into a termination component.

Figure 32:
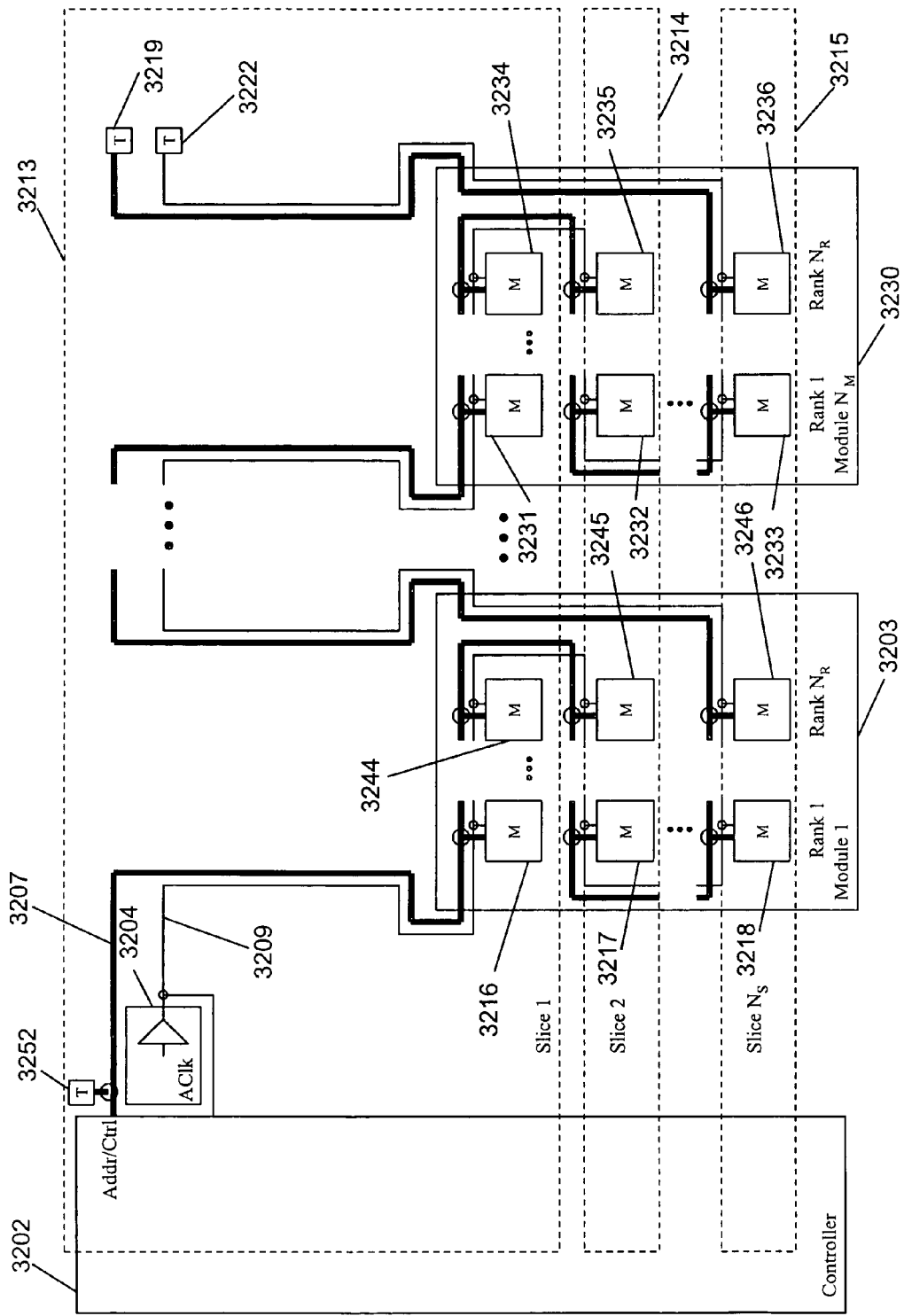
FIG. 32 is a block diagram illustrating a memory system that comprises multiple ranks of memory components and multiple memory modules with a single control/address bus that is shared by all the memory modules in accordance with an embodiment of the invention.

FIG. 32 is a block diagram illustrating a memory system that comprises multiple ranks of memory components and multiple memory modules with a single control/address bus that is shared by all the memory modules in accordance with an embodiment of the invention. The memory system comprises memory controller component 3202, memory module 3203, memory module 3230, address/control clock 3204, termination component 3219, and termination component 3222.

Within each memory module, memory components are organized in ranks. A first rank of memory module 3203 includes memory components 3216, 3217, and 3218. A second rank of memory module 3203 includes memory components 3244, 3245, and 3246. A first rank of memory module 3230 includes memory components 3231, 3232, and 3233. A second rank of memory module 3230 includes memory components 3234, 3235, and 3236.

The memory system is organized into slices across the memory controller component and the memory modules. Examples of these slices include slice 3213, slice 3214, and slice 3215. Each slice comprises one memory component of each rank. In this embodiment, the memory components of the memory modules share a common daisy-chained address bus 3207 and a common daisy-chained address/control clock conductor 3209. Address bus 3207 is coupled to memory controller component 3202 and memory components 3216, 3217, 3218, 3244, 3245, 3246, 3231, 3232, 3233, 3234, 3235, and 3236. A termination component 3252 is coupled to address bus 3207 near memory controller component 3202, and may, for example, be incorporated into memory controller component 3202. A termination component 3219 is coupled near an opposite terminus of address bus 3207.

Address/control clock 3204 is coupled to address/control clock conductor 3209, which is coupled to memory controller component 3202 and to memory components 3216, 3217, 3218, 3244, 3245, 3246, 3231, 3232, 3233, 3234, 3235, and 3236. A termination component 3222 is coupled near a terminus of address/control clock conductor 3209.

Unlike the memory system of FIG. 31, instead of using some kind of splitting component, each control/address wire is routed onto a memory module, past all the memory components, and back off the module and onto the main board to chain through another memory module or to pass into a termination component.

The same three configuration alternatives are possible for a sliced control/address bus in a multi-module, multi-rank memory system. This represents a departure from the systems that have been discussed up to this point—the previous systems all had a control/address bus that was common across the memory slices. It is also possible to instead provide an address/control bus per slice. Each bus is preferably routed along with the data bus for each slice, and preferably has the same topological characteristics as a data bus which only performs write operations.

Figure 33:
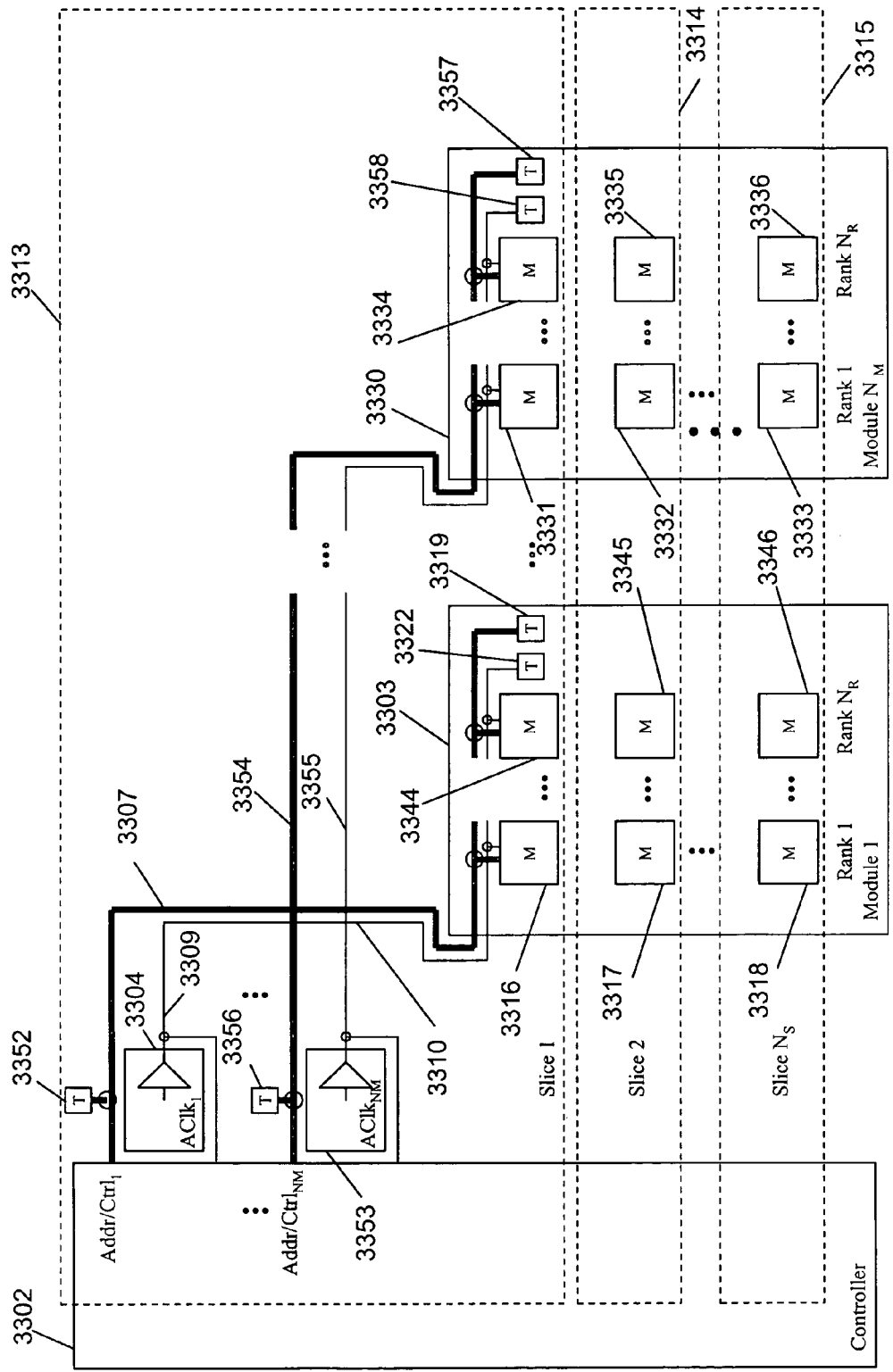
FIG. 33 is a block diagram illustrating a memory system that comprises multiple ranks of memory components and multiple memory modules with a dedicated, sliced control/address bus per memory module in accordance with an embodiment of the invention.

FIG. 33 is a block diagram illustrating a memory system that comprises multiple ranks of memory components and multiple memory modules with a dedicated, sliced control/address bus per memory module in accordance with an embodiment of the invention. The memory system comprises memory controller component 3302, memory module 3303, memory module 3330, address/control clock 3304, address/control clock 3353, termination component 3352, and termination component 3356.

Within each memory module, memory components are organized in ranks. A first rank of memory module 3303 includes memory components 3316, 3317, and 3318. A second rank of memory module 3303 includes memory components 3344, 3345, and 3346. A first rank of memory module 3330 includes memory components 3331, 3332, and 3333. A second rank of memory module 3330 includes memory components 3334, 3335, and 3336.

The memory system is organized into slices across the memory controller component and the memory modules. Examples of these slices include slice 3313, slice 3314, and slice 3315. Each slice comprises one memory component of each rank. In this embodiment, each slice within each memory module is provided with its own address bus 3307 and address/control clock conductor 3310. Address bus 3307 is coupled to memory controller component 3302 and memory components 3316 and 3344. A termination component 3352 is coupled to address bus 3307 near memory controller component 3302, and may, for example, be incorporated into memory controller component 3302. A termination component 3319 is coupled near an opposite terminus of address bus 3307, and is preferably provided within memory module 3303. Address/control clock 3304 is coupled to address/control clock conductor 3309, which is coupled to memory controller component 3302 and to memory components 3316 and 3344. A termination component 3322 is coupled near a terminus of address/control clock conductor 3309, preferably within memory module 3303.

Memory module 3330 is provided with address bus 3354 and address/control clock conductor 3355. Address bus 3354 is coupled to memory controller component 3302 and to memory components, 3331 and 3334. A termination component 3356 is coupled to address bus 3354 near memory controller component 3302, and may, for example, be incorporated into memory controller component 3302. A termination component 3357 is coupled near an opposite terminus of address bus 3354 and is preferably provided within memory module 3330. Address/control clock 3353 is coupled to address/control clock conductor 3355, which is coupled to memory controller component 3302 and to memory components 3331 and 3334. A termination component 3358 is coupled near a terminus of address/control clock conductor 3355, preferably within memory module 3330. Each control/address wire is routed onto a memory module, past all the memory components in the slice, and into a termination component.

Figure 34:
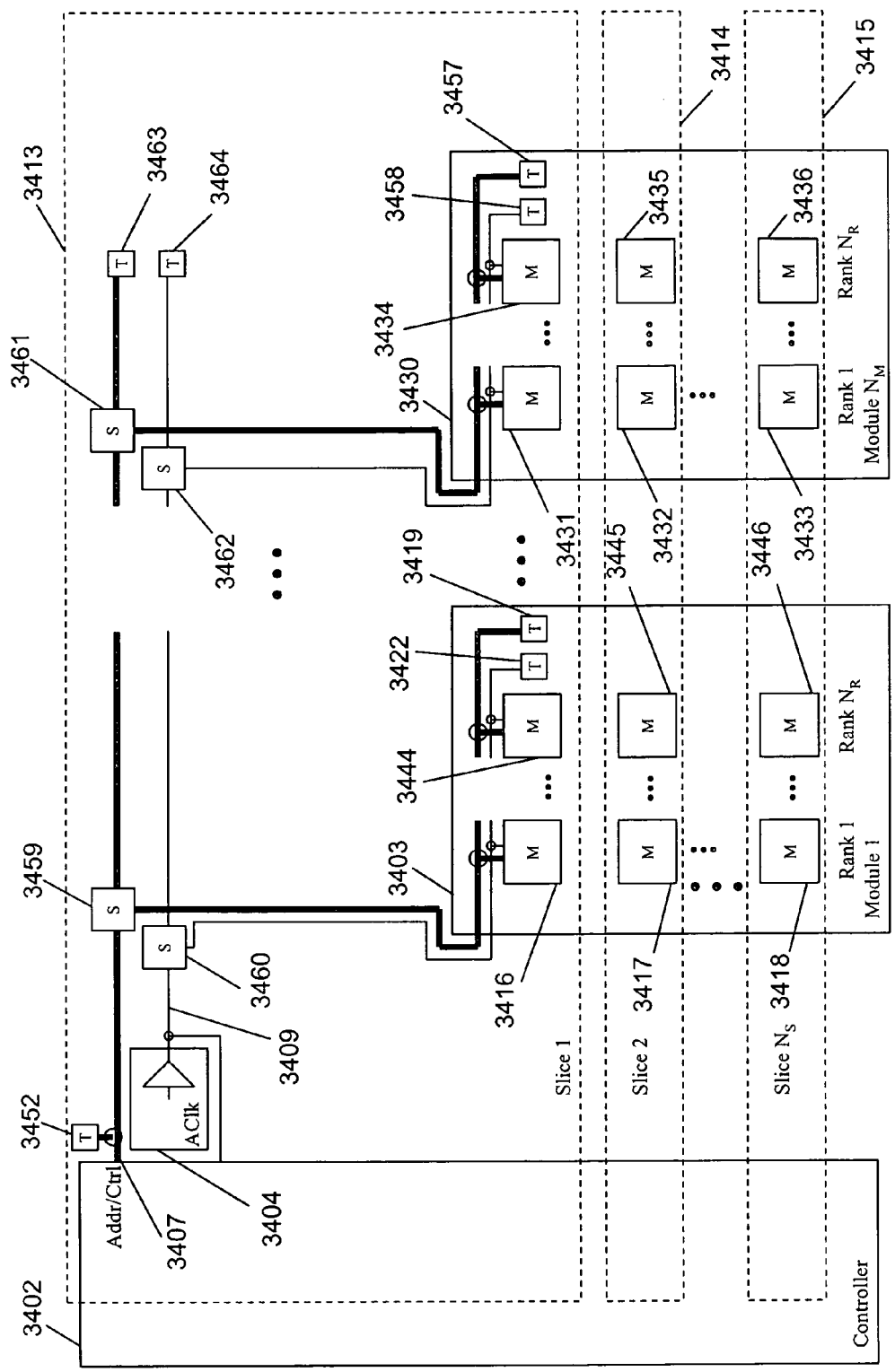
FIG. 34 is a block diagram illustrating a memory system that comprises multiple ranks of memory components and multiple memory modules with a single control/address bus that is shared by all the memory modules in accordance with an embodiment of the invention.

FIG. 34 is a block diagram illustrating a memory system that comprises multiple ranks of memory components and multiple memory modules with a single control/address bus that is shared by all the memory modules in accordance with an embodiment of the invention. The memory system comprises memory controller component 3402, memory module 3403, memory module 3430, address/control clock 3404, splitting component 3459, splitting component 3460, splitting component 3461, splitting component 3462, termination component 3463, and termination component 3464.

Within each memory module, memory components are organized in ranks. A first rank of memory module 3403 includes memory components 3416, 3417, and 3418. A second rank of memory module 3403 includes memory components 3444, 3445, and 3446. A first rank of memory module 3130 includes memory components 3431, 3432, and 3433. A second rank of memory module 3430 includes memory components 3434, 3435, and 3436.

The memory system is organized into slices across the memory controller component and the memory modules. Examples of these slices include slice 3413, slice 3414, and slice 3415. Each slice comprises one memory component of each rank. In this embodiment, an address bus 3407 and an address/control clock conductor 3409 are coupled to each memory component in a slice among multiple memory modules. Address bus 3407 is coupled to memory controller component 3402, via splitter 3459 to memory components 3416 and 3444, and via splitter 3461 to memory components 3431 and 3434. A termination component 3452 is coupled to address bus 3407 near memory controller component 3402, and may, for example, be incorporated into memory controller component 3402. A termination component 3463 is coupled near an opposite terminus of address bus 3407, near splitter 3461. A termination component 3419 is coupled to address bus 3407, preferably within memory module 3403. A termination component 3457 is coupled to address bus 3407, preferably within memory module 3430.

Address/control clock 3404 is coupled to address/control clock conductor 3409, which is coupled to memory controller component 3402, via splitter 3460 to memory components 3416 and 3444, and via splitter 3462 to memory components 3431 and 3434. A termination component 3464 is coupled near a terminus of address/control clock conductor 3409, near splitter 3462. A termination component 3422 is coupled to the address/control clock conductor 3409, preferably within memory module 3403. A termination component 3458 is coupled to the address/control clock conductor 3409, preferably within memory module 3430.

In this example, each control/address wire is tapped using some form of splitting component S. This splitter could be a passive impedance matcher (three resistors in a delta- or y-configuration) or some form of active buffer or switch element. In either case, the electrical impedance of each wire is maintained down its length (within manufacturing limits) so that signal integrity is kept high. As in the previous configuration, each split-off control/address bus is routed onto a memory module, past all the memory components, and into a termination component.

Figure 35:
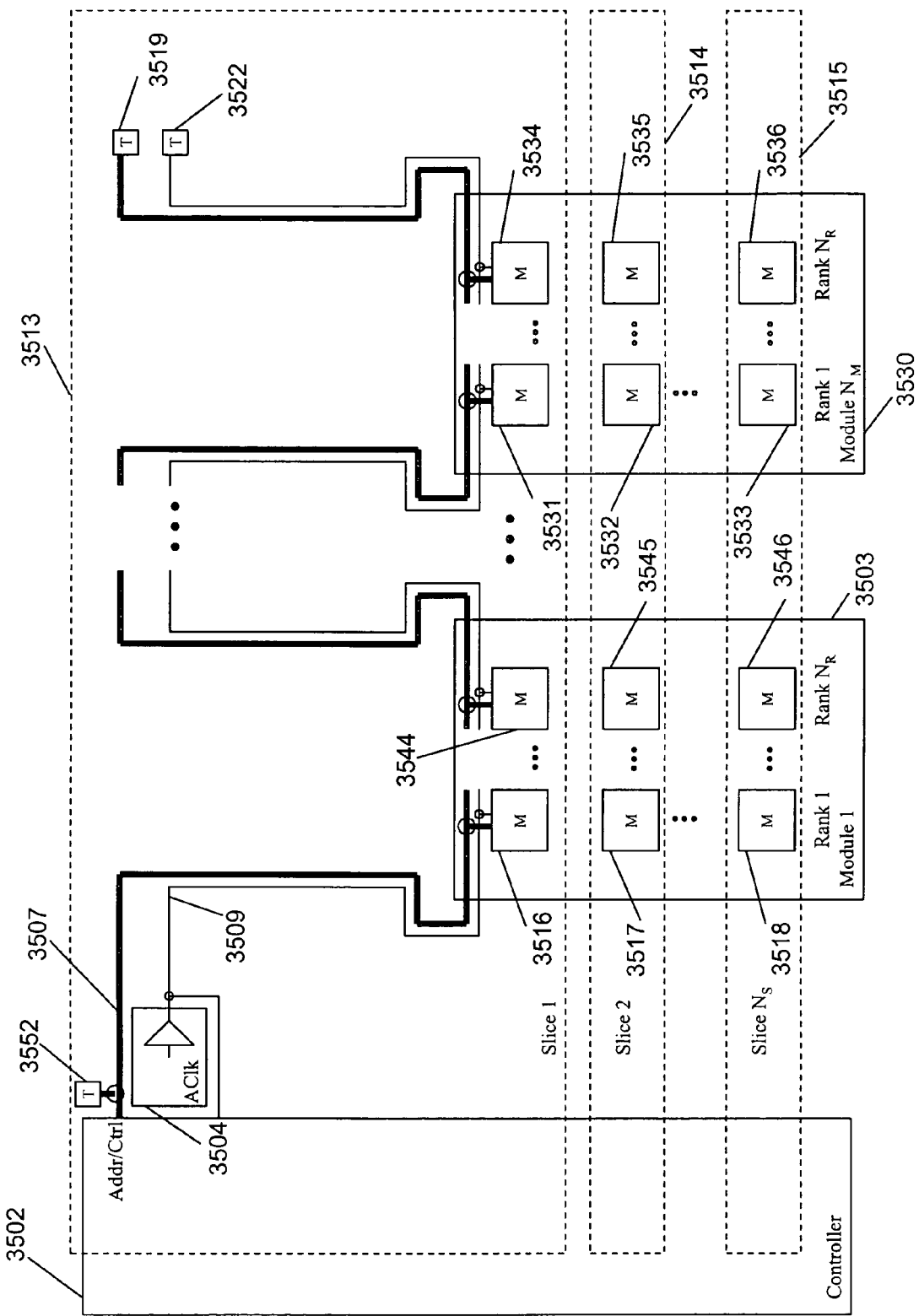
FIG. 35 is a block diagram illustrating a memory system that comprises multiple ranks of memory components and multiple memory modules with a single control/address bus that is shared by all the memory modules in accordance with an embodiment of the invention.

FIG. 35 is a block diagram illustrating a memory system that comprises multiple ranks of memory components and multiple memory modules with a single control/address bus that is shared by all the memory modules in accordance with an embodiment of the invention. The memory system comprises memory controller component 3502, memory module 3503, memory module 3530, address/control clock 3504, termination component 3519, and termination component 3522.

Within each memory module, memory components are organized in ranks. A first rank of memory module 3503 includes memory components 3516, 3517, and 3518. A second rank of memory module 2903 includes memory components 3544, 3545, and 3546. A first rank of memory module 3530 includes memory components 3531, 3532, and 3533. A second rank of memory module 3530 includes memory components 3534, 3535, and 3536.

The memory system is organized into slices across the memory controller component and the memory modules. Examples of these slices include slice 3513, slice 3514, and slice 3515. Each slice comprises one memory component of each rank. In this embodiment, each slice across memory modules shares a common daisy-chained address bus 3507 and a common daisy-chained address/control clock conductor 3509. Address bus 3507 is coupled to memory controller component 3502 and memory components 3516, 3544, 3531, and 3534. A termination component 3552 is coupled to address bus 3507 near memory controller component 3502, and may, for example, be incorporated into memory controller component 3502. A termination component 3519 is coupled near an opposite terminus of address bus 3507.

Address/control clock 3504 is coupled to address/control clock conductor 3509, which is coupled to memory controller component 3502 and to memory components 3516, 3544, 3531, and 3534. A termination component 3522 is coupled near a terminus of address/control clock conductor 3509.

Unlike the memory system of FIG. 34, instead of using some kind of splitting component, each control/address wire is routed onto a memory module, past all the memory components, and back off the module and onto the main board to chain through another memory module or to pass into a termination component.

As can be seen with reference to the Figures described above, embodiments of the invention allow implementation of a memory system, a memory component, and/or a memory controller component. Within these embodiments skew may be measured according to bit time and/or according to a timing signal. In some embodiments, logic in the memory controller component accommodates skew, while in other embodiments, logic in a memory component accommodates skew. The skew may be greater than a bit time or greater than a cycle time.

One embodiment of the invention provides a memory module with a first wire carrying a first signal. The first wire is connected to a first module contact pin. The first wire is connected to a first pin of a first memory component. The first wire is connected to a first termination device. The first wire maintains an approximately constant first impedance value along its full length on the memory module. The termination component approximately matches this first impedance value. Optionally, there is a second memory component to which the first wire does not connect. Optionally, the first signal carries principally information selected from control information, address information, and data information during normal operation. Optionally, the termination device is a component separate from the first memory component on the memory module. Optionally, the termination device is integrated into first memory component on the memory module. Such a memory module may be connected to a memory controller component and may be used in a memory system.

One embodiment of the invention provides a memory module with a first wire carrying a first signal and a second wire carrying a second signal. The first wire connects to a first module contact pin. The second wire connects to a second module contact pin. The first wire connects to a first pin of a first memory component. The second wire connects to a second pin of the first memory component. The first wire connects to a third pin of a second memory component. The second wire does not connect to a pin of One embodiment of the invention provides a method for coordinating memory operations among a first memory component and a second memory component. The method includes the step of applying a first address signal relating to the first memory component to a common address bus over a first time interval. The common address bus is coupled to the first memory component and the second memory component. The method also includes the step of applying a second address signal relating to the second memory component to the common address bus over a second time interval. The first time interval is shorter than a propagation delay of the common address bus, and the second time interval is shorter than a common address bus propagation delay of the common address bus. The method also includes the step of controlling a first memory operation of the first memory component using a first memory component timing signal. The first memory component timing signal is dependent upon a first relationship between the common address bus propagation delay and a first data bus propagation delay of a first data bus coupled to the first memory component. The method also includes the step of controlling a second memory operation of the second memory component using a second memory component timing signal. The second memory component timing signal is dependent upon a second relationship between the common address bus propagation delay and a second data bus propagation delay of a second data bus coupled to the second memory component.

One embodiment of the invention (referred to as description B) provides a memory system with a memory controller component, a single rank of memory components on a single memory module, a common address bus connecting controller to all memory components of the rank in succession, separate data buses connecting controller to each memory component (slice) of the rank, an address bus carrying control and address signals from controller past each memory component in succession, data buses carrying read data signals from each memory component (slice) of the rank to the controller, data buses carrying write data signals from controller to each memory component (slice) of the rank, data buses carrying write mask signals from controller to each memory component (slice) of the rank, the read data and write data signals of each slice sharing the same data bus wires (bidirectional), the buses designed so that successive pieces of information transmitted on a wire do not interfere, a periodic clock signal accompanying the control and address signals and used by the controller to transmit information and by the memory components to receive information, a periodic clock signal accompanying each slice of write data signals and optional write mask signals and which is used by the controller to transmit information and by a memory component to receive information, and a periodic clock signal accompanying each slice of read data signals and which is used by a memory component to transmit information and by the controller to receive information.

One embodiment of the invention (referred to as description A) provides a memory system with features taken from the above description (description B) and also a timing signal associated with control and address signals which duplicates the propagation delay of these signals and which is used by the controller to transmit information and by the memory components to receive information, a timing signal associated with each slice of write data signals and optional write mask signals which duplicates the propagation delay of these signals and which is used by the controller to transmit information and by a memory component to receive information, a timing signal associated with each slice of read data signals which duplicates the propagation delay of these signals and which is used by a memory component to transmit information and by the controller to receive information, wherein a propagation delay of a wire carrying control and address signals from the controller to the last memory component is longer than the length of time that a piece of information is transmitted on the wire by the controller.

One embodiment of the invention provides a memory system with features taken from the above description (description A) wherein a propagation delay of a wire carrying write data signals and optional write mask signals from the controller to a memory component is longer than the length of time that a piece of information is transmitted on the wire by the controller.

One embodiment of the invention provides a memory system with features taken from the above description (description A) wherein a propagation delay of a wire carrying read data signals from a memory component to the controller is longer than the length of time that a piece of information is transmitted on the wire by the memory component.

One embodiment of the invention provides a memory system with features taken from the above description (description A) wherein the alignments of the timing signals of the write data transmitter slices of the controller are adjusted to be approximately the same regardless of the number of slices in the rank, wherein the alignments of timing signals of the read data receiver slices of the controller are adjusted to be approximately the same regardless of the number of slices in the rank, and the alignments of timing signals of the read data receiver slices of the controller are adjusted to be approximately the same as the timing signals of the write data transmitter slices.

One embodiment of the invention provides a memory system with features taken from the above description (description A) wherein the alignments of the timing signals of the write data transmitter slices of the controller are adjusted to be mostly different from one another.

One embodiment of the invention provides a memory system with features taken from the above description (description A) wherein the alignments of timing signals of the read data receiver slices of the controller are adjusted to be mostly different from one another.

One embodiment of the invention provides a memory system with features taken from the above description (description A) wherein the alignments of the timing signals of the read data transmitter of each memory component is adjusted to be the approximately the same as the timing signals of the write data receiver in the same memory component and wherein the alignments of the timing signals will be different for each memory component slice in the rank.

One embodiment of the invention provides a memory system with features taken from the above description (description A) wherein the alignments of the timing signals of the write data transmitter of each memory component is adjusted to be different from the timing signals of the read data receiver in the same memory component.

Embodiments of the invention may be practiced with various system topologies, and various signaling technologies may be used among these various system topologies.

For example, referring back to FIG. 2, a system topology having a common address/control (AC) bus and a sliced data bus is illustrated. Such AC and data buses have different characteristics. Thus, different signaling technologies may be used for the AC and data buses.

In FIG. 2, the information on the AC bus is transmitted by the memory controller to a module, where it is received by each memory component (slice) in succession. The clock signal for this bus (AClk) has a nearly identical routing topology.

The data bus (DQ) carries both write data (D) and read data (Q). Write data is transmitted by the memory controller to a module, where it is received by a memory component in the corresponding slice. Read data is transmitted by a memory component of the module, and is received by the corresponding slice of the memory controller. Again, the clock signals for the write data (WClk) and the read data (RClk) have nearly-identical routing topologies to the bus with which they are associated.

Termination components may be used to minimize interference between successive transmitted symbols on each wire. These termination components can be present within a memory controller or memory component, or they can be separate components that are individually attached to the module or main wiring board.

The clock signals that are used can also be generated by the memory controller or the memory components, or they can be generated by separate components that are individually attached to the module or main wiring board. As another example, any of the three types of clock signals shown (AClk, WClk, and RClk) can be generated from either of the other two. In such a system, it is not necessary that physical wires be allocated for a clock signal that is synthesized from another clock signal.

Another example can be seen by referring back to FIG. 3. It shows some of the possible arrangements between the AC and DQ buses and their associated clock signals. The parameter tCC represents the column-cycle time of the memory component. Each clock signal has at least one timing event (e.g., edge) in each tCC interval. In the example shown in FIG. 3, there are two timing events (a rising and falling edge) on each clock signal in each tCC interval.

Other systems might have more clock events per tCC interval. This has a potential drawback, however. The clock signal will contain higher-frequency components, requiring a higher-bandwidth connection technology. Thus, any clock signal that is physically distributed with a bus should operate at the lowest possible frequency that is consistent with desired performance, for example, 1/tCC.

It is also possible for more than one symbol (bit) to be transferred in each tCC interval on each wire of a bus. FIG. 3 shows four examples for each type of information (address/control on the AC bus and read data and write data on the DQ bus). The four examples include 1, 2, 4, and 8 bits transferred per tCC interval.

The alignment of the bit windows (bit eyes) relative to the associated clock is usually not critical; a static offset between the bit and the clock can be easily managed with present-day circuit techniques. Some degree of freedom in choosing a particular alignment is possible, which can be used advantageously to simplify other aspects of the overall design.

Different amounts of information need to transferred between the memory controller and memory component in each tCC interval. For example, 32 to 64 bits of information might be sent across the AC bus from controller to all memory components in each tCC interval. This information would manage the (overlapped) row and column accesses that take place in a modern memory system.

The amount of information that is transferred on the DQ bus is typically much larger—perhaps as much as 512 bits per tCC interval. This might be split across several memory components (slices), but there will usually be more bits transferred per wire per tCC interval on the DQ bus than on the AC bus.

FIGS. 36 through 39 show circuit details for exemplary signaling technologies. The differences due to the different connection topologies of the Data (DQ) and Addr/Ctrl (AC) buses are also shown.

Figure 36:
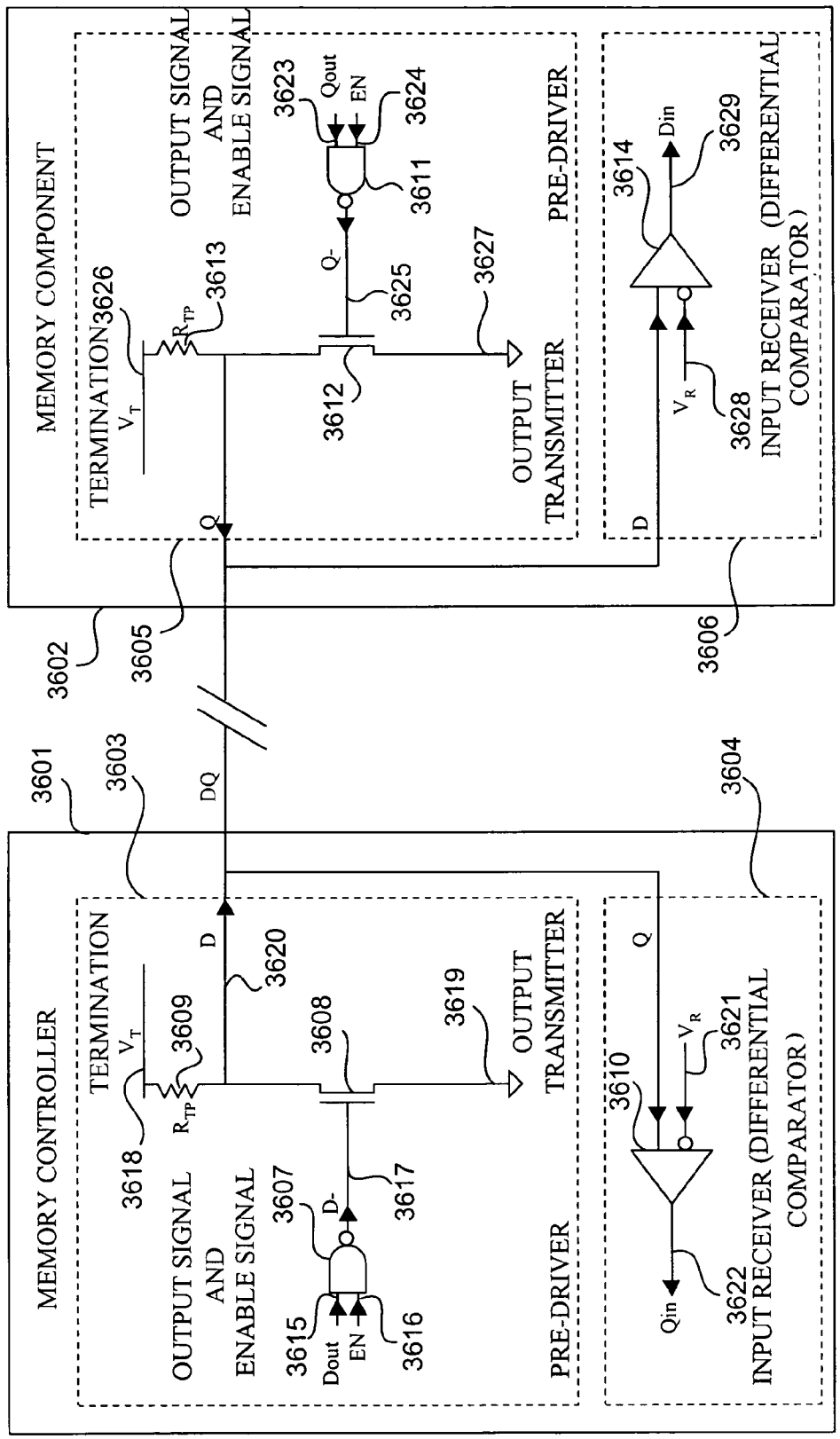
FIG. 36 is a schematic diagram illustrating an example of interface circuits to be used for non-differential signaling on a data bus in accordance with an embodiment of the invention.

FIG. 36 is a schematic diagram illustrating an example of interface circuits to be used for non-differential signaling on a data bus in accordance with an embodiment of the invention. Non-differential signaling implies that one wire is used to transfer one bit during each bit-time interval. Note that there can be one or more bit-time intervals in each tCC interval.

Memory controller 3601 includes output transmitter 3603 and input receiver 3604. Memory component 3602 includes output transmitter 3605 and input receiver 3606. Signals transmitted by output transmitter 3603 via data bus 3620 are received by input receiver 3606. Signals transmitted by output transmitter 3605 via data bus 3620 are received by input receiver 3604.

Output transmitter 3603 includes NAND gate 3607, transistor 3608, and a termination comprising resistor 3609. Data input 3615 is coupled to an input of NAND gate 3607. Enable input 3616 is coupled to an input of NAND gate 3607. Output 3617 of NAND gate 3607 is coupled to a gate of transistor 3608, which is preferably an n-channel MOSFET. A source of transistor 3608 is coupled to ground 3619. A drain of transistor 3608 is coupled to data bus 3620 and to a first terminal of resistor 3609. A second terminal of resistor 3609 is coupled to termination voltage 3618.

Data bus 3620 is coupled to an input of differential comparator 3610 of input receiver 3604. A reference voltage 3621 is applied to a second input of differential comparator 3610. Differential comparator 3610 provides an output signal at output 3622.

Output transmitter 3605 includes NAND gate 3611, transistor 3612, and a termination comprising resistor 3613. Data input 3623 is coupled to an input of NAND gate 3611. Enable input 3624 is coupled to an input of NAND gate 3611. Output 3625 of NAND gate 3611 is coupled to a gate of transistor 3612, which is preferably an n-channel MOSFET. A source of transistor 3612 is coupled to ground 3627. A drain of transistor 3612 is coupled to data bus 3620 and to a first terminal of resistor 3613. A second terminal of resistor 3613 is coupled to termination voltage 3626.

Data bus 3620 is coupled to an input of differential comparator 3614 of input receiver 3606. A reference voltage 3628 is applied to a second input of differential comparator 3614. Differential comparator 3614 provides an output signal at output 3629.

In memory controller 3601, write data signal Dout at data input 3615 passes through the pre-driver logic exemplified by NAND gate 3607 to give the signal D-, which is present at output 3617 and which controls the gate of NMOS transistor 3608. The NMOS transistor 3608 is used in a open-drain configuration, with the load provided by two termination structures, one of which is in memory controller 3601 and one of which is in memory component 3602.

Each termination structure comprises a termination resistor $R_{TP}$ connected to a termination voltage $V_T$. The termination structures (and the memory controller and memory component) are connected by a transmission line DQ of data bus 3620. This transmission line is preferably one wire of a multi-wire bus. It has a characteristic possible and may be implemented with a periodic calibration process similar to what has been described.

Although FIG. 36 shows a single memory component 3602 attached to the DQ wire, there could be more than one memory component in some systems. In such a case, the wire would connect to each memory component in succession, and the termination structure would reside on the module or main wiring board near the farthest memory component. Thus, termination resistor 3613 could be omitted from all of the memory components. Alternatively, the termination structure may be integrated in only the memory component farthest from the memory controller 3601 The pre-driver for the write data in the memory controller 3601, exemplified by NAND gate 3607, also receives an enable signal EN at enable input 3616 which permits the driver, exemplified by transistor 3608, to turn off (e.g., transition to a high impedance state). The EN signal is used to drive write data at selected times and to disable the driver at other selected times so read data may be driven onto data bus 3620 by a memory component, for example, memory component 3602. The pre-driver may also include circuitry that controls the slew rate of the driver. The driver may include circuitry that controls its transfer characteristic; for example, it may include circuitry to control its gate voltage such that it appears to be a current source with a relatively high source impedance. This circuitry that controls the slew rate or transfer characteristic may use a calibration process to keep the slew rate or transfer characteristic near an optimal point. During such a calibration process, a value (such as a voltage) that represents the present slew rate or transfer characteristic is first measured, and then another value (such as the contents of a configuration register) is adjusted to move the slew rate or transfer characteristic closer to its optimal point. This calibration process is repeated periodically to ensure that variations in temperature, voltage, and process (e.g., variations arising during manufacture) have a minimal effect upon the effective slew rate or transfer characteristic.

Control of the slew rate refers to the ability to constrain the slew rate of the output signal being transmitted by a component. The slew rate is a measure of the transition time of the output signal; that is, the rise time or the fall time of the signal between the valid high and low output voltage levels. Constraining this transition time between a minimum and maximum value is important if signaling bandwidth is to be maximized.

One way of controlling the transition time is to adjust the strength of the predriver transistors. This can be done with parallel predriver circuits with different weights (for example, binary weights may be used). This permits a set of discrete strengths of monotonically increasing value to enabled selectively. A periodic calibration process controls this selection, first measuring a value that is indicative of the present slew rate, and then adjusting the strength of the pre-driver to move it closer to the optimal value. Other techniques for controlling the slew rate are also possible and may be implemented with a periodic calibration process similar to what has been described.

There are two termination structures, one on each end of the DQ transmission line. These provide termination of signals traveling along data bus 3620 in either direction, since write data travels from memory controller 3601 to memory component 3602 and read data travels in the opposite direction. The termination structure at either end ensures that a wavefront is effectively absorbed after propagating down the transmission line once. As a result, there is negligible interference generated during a later wavefront. This allows the signaling rate of the wire to be maximized.

On the memory component 3602, the read data Qout is passed to a pre-driver, exemplified by NAND gate 3611, and a driver, exemplified by transistor 3612, for transmission from memory component 3602 to memory controller 3601. The pre-driver and driver may be similar to those of memory controller 3601. They operate in a complementary fashion with the other pre-driver and driver; write data is transmitted by memory controller 3601 and received by memory component 3602 at selected times, and at other selected times read data is transmitted by memory component 3602 and received by memory controller 3601.

The write data is received at memory component 3602 by differential comparator 3614 of input receiver 3606. This circuit compares the voltage on the DQ wire of data bus 3620 to a reference voltage $V_R$ at input 3628. An input receiver 3604, which may be similar, is provided on the memory controller 3601 to receive read data from memory component 3602.

Figure 37:
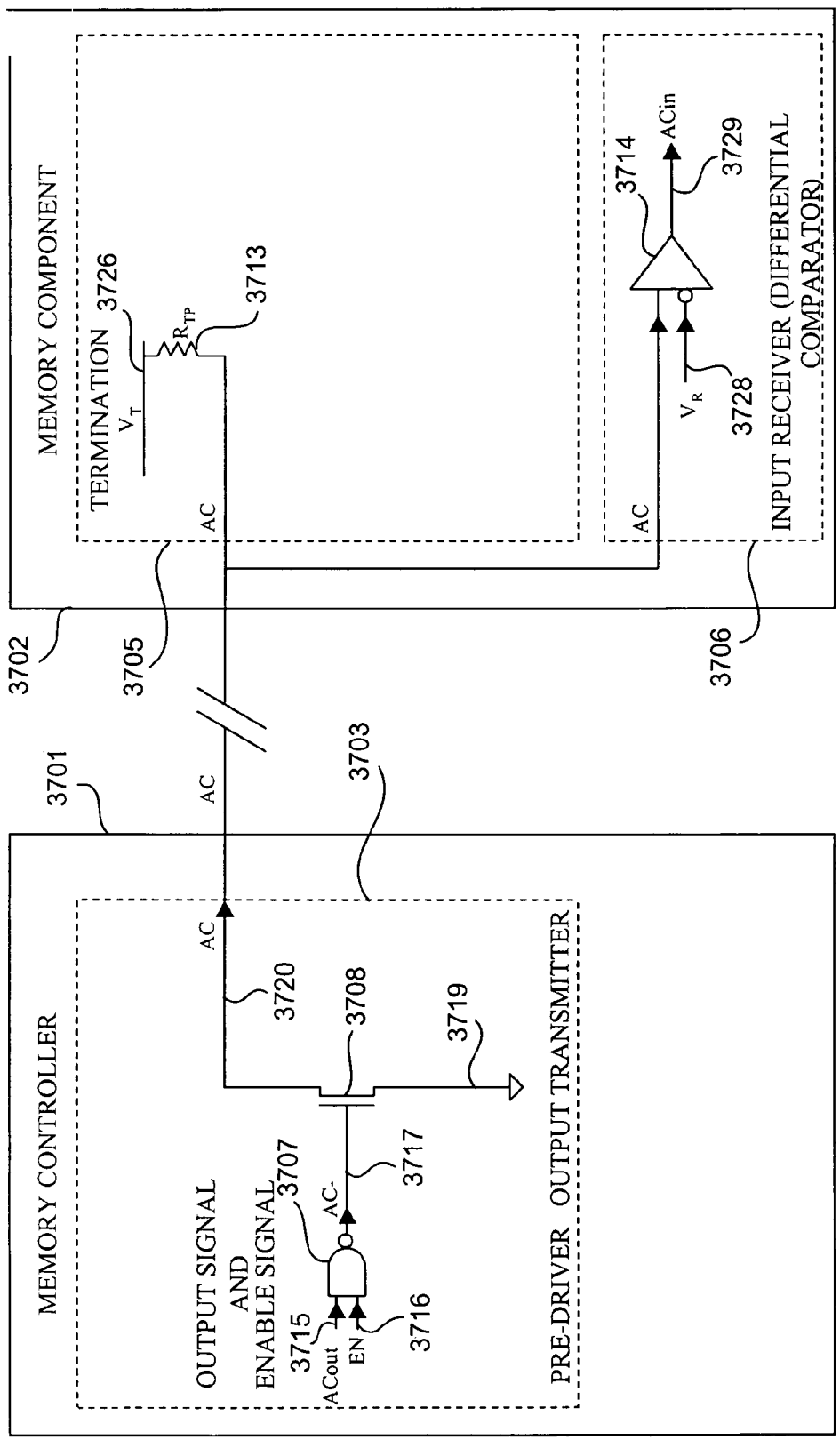
FIG. 37 is a schematic diagram illustrating an example of interface circuits to be used for non-differential signaling on an AC bus in accordance with an embodiment of the invention.

FIG. 37 is a schematic diagram illustrating an example of interface circuits to be used for non-differential signaling on an AC bus in accordance with an embodiment of the invention. Non-differential signaling implies that one wire is used to transfer one bit during each bit-time interval. Note that there can be one or more bit-time intervals in each tCC interval.

Memory controller 3701 includes output transmitter 3703. Memory component 3702 includes termination 3705 and input receiver 3706. Signals transmitted by output transmitter 3703 via data bus 3720 are received by input receiver 3706.

Output transmitter 3703 includes NAND gate 3707 and transistor 3708. Address/control input 3715 is coupled to an input of NAND gate 3707. Enable input 3716 is coupled to an input of NAND gate 3707. Output 3717 of NAND gate 3707 is coupled to a gate of transistor 3708, which is preferably an n-channel MOSFET. A source of transistor 3708 is coupled to ground 3719. A drain of transistor 3708 is coupled to data bus 3720.

Termination 3705 comprises resistor 3713. Address and control bus 3720 is coupled to a first terminal of resistor 3713. A second terminal of resistor 3713 is coupled to termination voltage 3726.

Address and control bus 3720 is coupled to an input of differential comparator 3714 of input receiver 3706. A reference voltage 3728 is applied to a second input of differential comparator 3714. Differential comparator 3714 provides an output signal at output 3729.

In memory controller 3701, AC signal ACout passes through the pre-driver logic exemplified by NAND gate 3707 to give the signal AC-, which is present at output 3717 and which controls the gate of NMOS transistor 3708. The NMOS transistor 3708 is used in a open-drain configuration, with the load provided by a termination structure on the memory component 3702 at the far end of the AC wire of AC bus 3720.

The termination structure comprises a termination resistor $R_{TP}$ connected to a termination voltage $V_T$. The termination structure (and the memory controller and memory component) are connected by a transmission line AC of AC bus 3720. This transmission line is preferably one wire of a multi-wire bus. It has a characteristic impedance which approximately matches an impedance of the termination resistor 3713.

The termination structure may reside on the memory component 3702, or it may be placed separately on the module or main wiring board near the memory component 3702. The termination resistor 3713 can be a passive device (for example, a discrete resistor component) or it may be an active device (for example, a transistor with circuitry to control its gate voltage such that it has a resistor-like transfer characteristic).). This circuitry that controls the transfer characteristic may use a calibration process to keep the transfer characteristic near an optimal point. During such a calibration process, a value (such as a voltage) that represents the present transfer characteristic is first measured, and then another value (such as the contents of a configuration register) is adjusted to move the transfer characteristic closer to its optimal point. This calibration process is repeated periodically to ensure that variations in temperature, voltage, and process (e.g., variations arising during manufacture) have a minimal effect upon the effective transfer characteristic.

Although FIG. 37 shows a single memory component 3702 attached to the AC wire, there could be more than one memory component in some systems. In such a case, the wire would connect to each memory component in succession, and the termination structure would reside on the module or main wiring board near the farthest memory component. Thus, termination resistor 3713 could be omitted from all of the memory components. Alternatively, the termination structure may be integrated in only the memory component farthest from the memory controller 3701.

The pre-driver for the AC signal in memory controller 3701, exemplified by NAND gate 3707, also receives an enable signal EN at enable input 3716 which permits the driver, exemplified by transistor 3708, to turn off (e.g., transition to a high impedance state). The pre-driver may also include circuitry that controls the slew rate of the driver. The driver may include circuitry that controls its transfer characteristic; for example, it may include circuitry to control its gate voltage such that it appears to be a current source with a relatively high source impedance. This circuitry that controls the slew rate or transfer characteristic may use a calibration process to keep the slew rate or transfer characteristic near an optimal point. During such a calibration process, a value (such as a voltage) that represents the present slew rate or transfer characteristic is first measured, and then another value (such as the contents of a configuration register) is adjusted to move the slew rate or transfer characteristic closer to its optimal point. This calibration process is repeated periodically to ensure that variations in temperature, voltage, and process (e.g., variations arising during manufacture) have a minimal effect upon the effective slew rate or transfer characteristic.

There is a single termination structures at the memory component end of the AC transmission line. This provides termination of signals representing address and control information traveling from memory controller 3701 to memory component 3702. The termination structure at the far end ensures that a wavefront is effectively absorbed after propagating down the transmission line once. As a result, there is negligible interference generated during a later wavefront. This allows the signaling rate of the wire to be maximized.

The address and control information is received at memory component 3702 by differential comparator 3714 of input receiver 3706. This circuit compares the voltage on the AC wire of AC bus 3720 to a reference voltage $V_R$ at input 3728.

Figure 38:
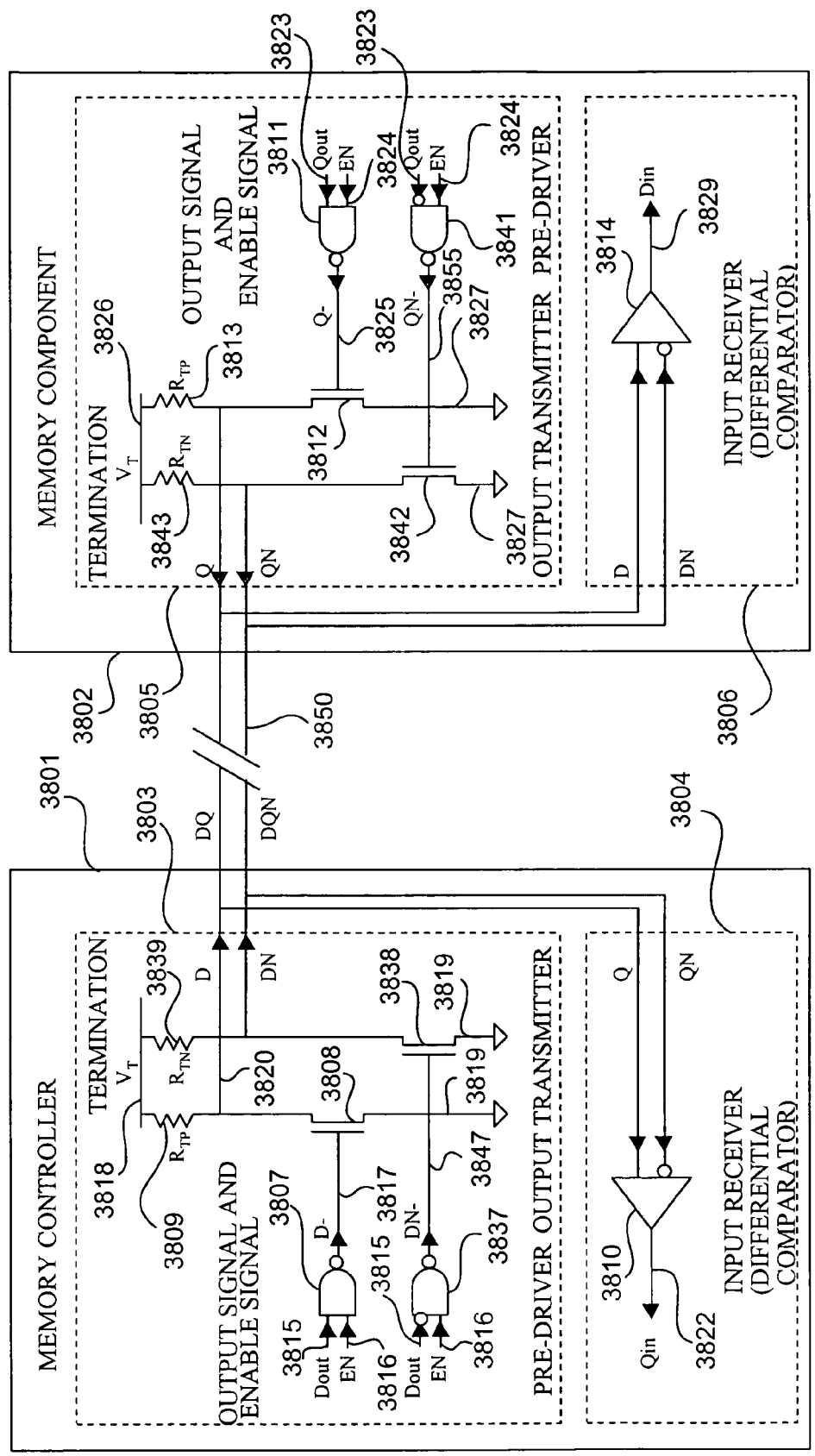
FIG. 38 is a schematic diagram illustrating an example of interface circuits to be used for differential signaling on a data bus in accordance with an embodiment of the invention.

FIG. 38 is a schematic diagram illustrating an example of interface circuits to be used for differential signaling on a data bus in accordance with an embodiment of the invention. Differential signaling implies that two wires are used to transfer one bit during each bit-time interval. Note that there can be one or more bit-time intervals in each tCC interval.

Memory controller 3801 includes output transmitter 3803 and input receiver 3804. Memory component 3802 includes output transmitter 3805 and input receiver 3806. Signals transmitted by output transmitter 3803 via data bus conductors 3820 and 3850 are received by input receiver 3806. Signals transmitted by output transmitter 3805 via data bus conductors 3820 and 3850 are received by input receiver 3804.

Output transmitter 3803 includes NAND gates 3807 and 3837, transistors 3808 and 3838, and terminations comprising resistors 3809 and 3839. Data input 3815 is coupled to an input of NAND gate 3807 and to an input of NAND gate 3837. Enable input 3816 is coupled to an input of NAND gate 3807 and to an input of NAND gate 3837. Output 3817 of NAND gate 3807 is couple d to a gate of transistor 3808, which is preferably an n-channel MOSFET. A source of transistor 3808 is coupled to ground 3819. A drain of transistor 3808 is coupled to data bus conductor 3820 and to a first terminal of resistor 3809. A second terminal of resistor 3809 is coupled to termination voltage 3818. Output 3847 of NAND gate 3837 is coupled to a gate of transistor 3838, which is preferably an n-channel MOSFET. A source of transistor 3838 is coupled to ground 3819. A drain of transistor 3838 is coupled to data bus conductor 3850 and to a first terminal of resistor 3839. A second terminal of resistor 3839 is coupled to termination voltage 3818.

Data bus conductor 3820 is coupled to an input of differential comparator 3810 of input receiver 3804. Data bus conductor 3850 is coupled to a second input of differential comparator 3810. Differential comparator 3810 provides an output signal at output 3822.

Output transmitter 3805 includes NAND gates 3811 and 3841, transistors 3812 and 3842, and terminations comprising resistors 3813 and 3843. Data input 3823 is coupled to an input of NAND gate 3811 and to an input of NAND gate 3841. Enable input 3824 is coupled to an input of NAND gate 3811 and to an input of NAND gate 3841. Output 3825 of NAND gate 3811 is coupled to a gate of transistor 3812, which is preferably an n-channel MOSFET. A source of transistor 3812 is coupled to ground 3827. A drain of transistor 3812 is coupled to data bus conductor 3820 and to a first terminal of resistor 3813. A second terminal of resistor 3813 is coupled to termination voltage 3826. Output 3855 of NAND gate 3841 is coupled to a gate of transistor 3842, which is preferably an n-channel MOSFET. A source of transistor 3842 is coupled to ground 3827. A drain of transistor 3842 is coupled to data bus conductor 3850 and to a first terminal of resistor 3843. A second terminal of resistor 3843 is coupled to termination voltage 3826.

Data bus conductor 3820 is coupled to an input of differential comparator 3814 of input receiver 3806. Data bus conductor 3850 is coupled to a second input of differential comparator 3814. Differential comparator 3814 provides an output signal at output 3829.

In memory controller 3801, write data signal Dout at data input 3815 passes through the pre-driver logic exemplified by NAND gate 3807 to give a signal D-, which is present at output 3817 and which controls the gate of NMOS transistor 3808. The NMOS transistor 3808 is used in a open-drain configuration, with the load provided by two termination structures, one of which is at memory controller 3601 and one of which is at a memory component 3802 at the far end of the DQ wire of data bus 3820.

The write data signal Dout is complemented and passed through a second pre-driver, exemplified by NAND gate 3837, to give a signal DN-, which controls the gate of a second NMOS transistor 3838, which serves as a driver to drive signals on data bus 3850. This NMOS transistor 3838 is also used in a open-drain configuration, with the load provided by two termination structures, one of which is at the memory controller 3801 and one of which is at the memory component 3802 at the far end of the DQN wire of data bus 3850.

Each termination structure comprises a termination resistor $R_{TP}$ or $R_{TN}$ connected to a termination voltage $V_T$. The termination structures (and the memory controller and memory component) are connected by the transmission line pair DQ and DQN. This transmission line pair is one wire-pair of a multi-wire-pair bus. It has a characteristic impedance which approximately matches an impedance of termination resistors 3809, 3839, 3813, and 3843.

The termination structures may reside on the memory controller and memory component, or they may be placed separately on the module or main wiring boards near the memory controller and memory component. The termination resistors can be passive devices (for example, a discrete resistor component) or they may be an active device (for example, a transistor with circuitry to control its gate voltage such that it has a resistor-like transfer characteristic). This circuitry that controls the transfer characteristic may use a calibration process to keep the transfer characteristic near an optimal point.

During such a calibration process, a value (such as a voltage) that represents the present transfer characteristic is first measured, and then another value (such as the contents of a configuration register) is adjusted to move the transfer characteristic closer to its optimal point. This calibration process is repeated periodically to ensure that variations in temperature, voltage, and process (e.g., variations arising during manufacture) have a minimal effect upon the effective transfer characteristic.

Although FIG. 38 shows a single memory component 3802 attached to the DQ and DQN wire pair, there could be more than one memory component in some systems. In such a case, the wire pair would connect to each memory component in succession, and the termination structure would reside on the module or main wiring board near the farthest memory component. Thus, termination resistors 3813 and 3843 could be omitted from all of the memory components. Alternatively, the termination structure may be integrated in only the memory component farthest from the memory controller 3801.

The pre-drivers for the write data in the memory controller 3801, exemplified by NAND gates 3807 and 3837, also receive an enable signal EN at enable input 3816, which permits the drivers to turn off (e.g., transition to a high impedance state). The EN signal is used to drive write data at selected times and to disable the driver at other selected times so read data may be driven onto transmission lines 3820 and 3850 by a memory component, for example, memory component 3802. The pre-drivers may also include circuitry that controls the slew rate of the drivers. The drivers may include circuitry that controls their transfer characteristic; for example, they may include circuitry to control their gate voltage such that it appears to be a current source with a relatively high source impedance. This circuitry that controls the slew rate or transfer characteristic may use a calibration process to keep the slew rate or transfer characteristic near an optimal point. During such a calibration process, a value (such as a voltage) that represents the present slew rate or transfer characteristic is first measured, and then another value (such as the contents of a configuration register) is adjusted to move the slew rate or transfer characteristic closer to its optimal point. This calibration process is repeated periodically to ensure that variations in temperature, voltage, and process (e.g., variations arising during manufacture) have a minimal effect upon the effective slew rate or transfer characteristic.

There are two termination structures, one on each end of each of the DQ and DQN transmission lines. These provide termination of signals traveling along transmission lines 3820 and 3850 in either direction, since write data travels from memory controller 3801 to memory component 3802, and read data travels in the opposite direction. The termination structure at either end ensures that a wavefront is effectively absorbed after propagating down the transmission line once. As a result, there is negligible interference generated during a later wavefront. This allows the signaling rate of the wire to be maximized.

On memory component 3802, the read data Qout is passed to two pre-drivers, exemplified by NAND gates 3811 and 3841, and drivers, exemplified by transistors 3812 and 3842, for transmission from memory component 3802 to memory controller 3801.

These pre-drivers and drivers may be similar to those of memory controller 3801. They operate in a complementary fashion with the other pre-drivers and drivers; write data is transmitted by memory controller 3801 and received by memory component 3802 at selected times, and at other selected times read data is transmitted by memory component 3802 and received by memory controller 3801.

The write data is received at memory component 3802 by a differential comparator 3814 of input receiver 3806. This circuit compares the voltages on the DQ and DQN wire pair of transmission lines 3820 and 3850. When the wire pair carries a valid signal, one wire will be at a higher voltage and the other will be at a lower voltage, permitting a single bit to be encoded. If the write data drivers have been disabled, both wires will carry the higher voltage. While this example does not make use of the encoding in which both wires carry the lower voltage, such encoding may optionally be used to convey meaningful information. An input receiver 3804, which may be similar, is provided on the memory controller 3801 to receive read data from the memory component 3802.

Figure 39:
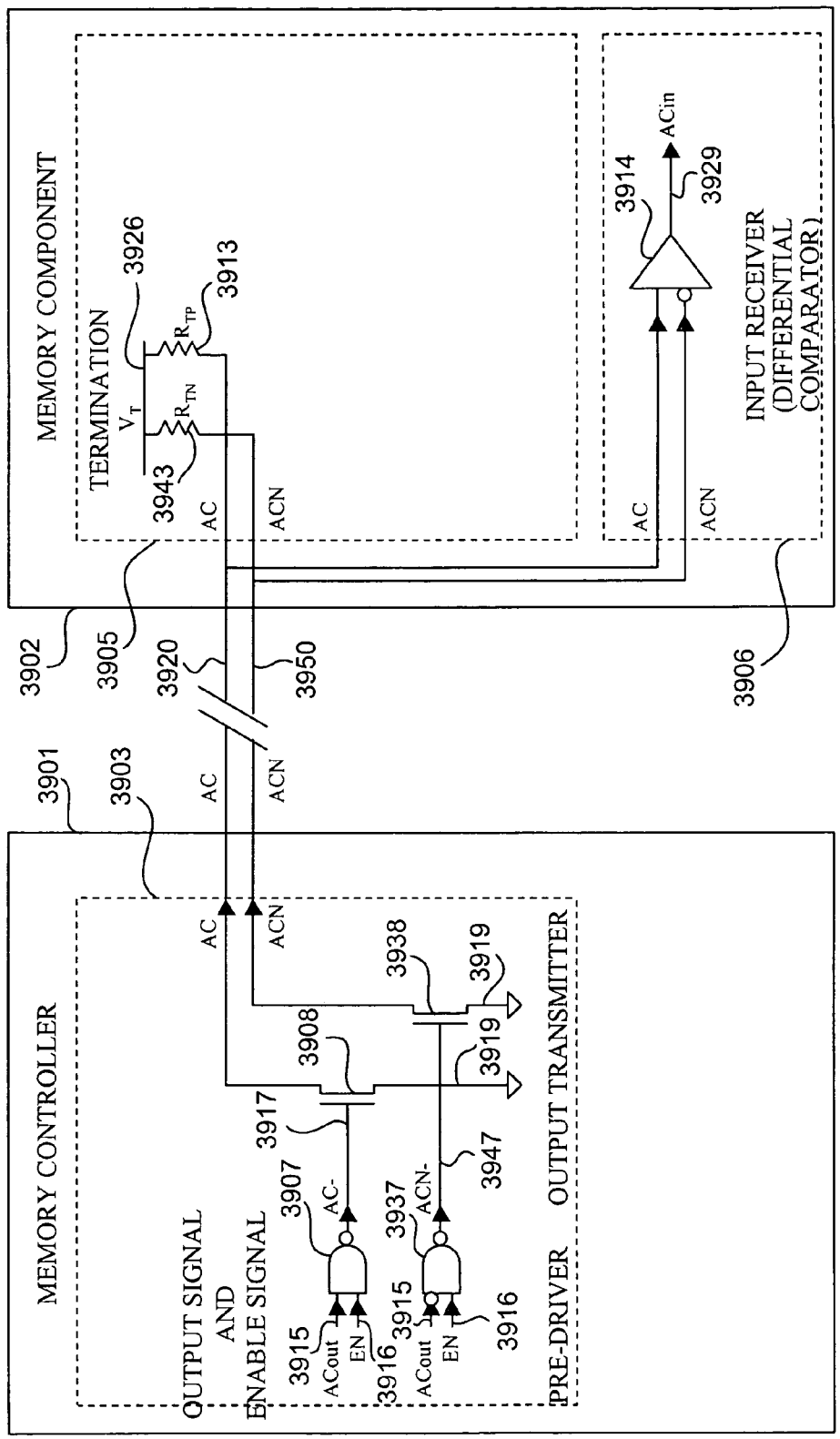
FIG. 39 is a schematic diagram illustrating an example of interface circuits to be used for differential signaling on an AC bus in accordance with an embodiment of the invention.

FIG. 39 is a schematic diagram illustrating an example of interface circuits to be used for differential signaling on an AC bus in accordance with an embodiment of the invention. Differential signaling implies that two wires are used to transfer one bit during each bit-time interval. Note that there can be one or more bit-time intervals in each tCC interval.

Memory controller 3901 includes output transmitter 3903. Memory component 3902 includes termination 3905 and input receiver 3906. Signals transmitted by output transmitter 3903 via data bus conductors 3920 and 3950 are received by input receiver 3906.

Output transmitter 3903 includes NAND gates 3907 and 3937 and transistors 3908 and 3938. Data input 3915 is coupled to an input of NAND gate 3907 and to an input of NAND gate 3937. Enable input 3916 is coupled to an input of NAND gate 3907 and to an input of NAND gate 3937. Output 3917 of NAND gate 3907 is coupled to a gate of transistor 3908, which is preferably an n-channel MOSFET. A source of transistor 3908 is coupled to ground 3919. A drain of transistor 3908 is coupled to data bus conductor 3920. Output 3947 of NAND gate 3937 is coupled to a gate of transistor 3938, which is preferably an n-channel MOSFET. A source of transistor 3938 is coupled to ground 3919. A drain of transistor 3938 is coupled to data bus conductor 3950.

Termination 3905 includes resistors 3913 and 3943. Address and control bus conductor 3920 is coupled to a first terminal of resistor 3913. A second terminal of resistor 3913 is coupled to termination voltage 3926. Address and control bus conductor 3950 is coupled to a first terminal of resistor 3943. A second terminal of resistor 3943 is coupled to termination voltage 3926.

Address and control bus conductor 3920 is coupled to an input of differential comparator 3914 of input receiver 3906. Address and control bus conductor 3950 is coupled to a second input of differential comparator 3914. Differential comparator 3914 provides an output signal at output 3929.

In memory controller 3901, AC signal ACout passes through the pre-driver logic exemplified by NAND gate 3907, to give the signal AC-, which is present at output 3917 and which controls the gate of NMOS transistor 3908. The NMOS transistor 3908 is used in a open-drain configuration, with the load provided by a termination structure on the memory component 3902 at the far end of the AC wire.

The AC signal ACout is complemented and passed through a second pre-driver exemplified by NAND gate 3937 to give the signal ACN-, which is present at output 3947 and which controls the gate of a second NMOS transistor 3938. This NMOS transistor is also used in a open-drain configuration, with the load provided a termination structure on the memory component 3902 at the far end of the ACN wire.

Each termination structure comprises a termination resistor $R_{TP}$ or $R_{TN}$ connected to a termination voltage $V_T$. The termination structures (and the memory controller and memory component) are connected by the transmission line pair AC and ACN, which comprises transmission lines 3920 and 3950. This transmission line pair is preferably one wire-pair of a multi-wire-pair bus. It has a characteristic impedance which matches an impedance of termination resistors 3913 and 3943.

The termination structure may reside on the memory component, or it may be placed separately on the module or main wiring board near the memory component. The termination resistor can be a passive device (for example, a discrete resistor component) or it may be an active device (for example, a transistor with circuitry to control its gate voltage such that it has a resistor-like transfer characteristic). This circuitry that controls the transfer characteristic may use a calibration process to keep the transfer characteristic near an optimal point. During such a calibration process, a value (such as a voltage) that represents the present transfer characteristic is first measured, and then another value (such as the contents of a configuration register) is adjusted to move the transfer characteristic closer to its optimal point. This calibration process is repeated periodically to ensure that variations in temperature, voltage, and process (e.g., variations arising during manufacture) have a minimal effect upon the effective transfer characteristic.

Although FIG. 39 shows a single memory component 3902 attached to the AC and ACN wire pair, there could be more than one memory component in some systems. In such a case, the wire pair would connect to each memory component in succession, and the termination structure would reside on the module or main wiring board near the farthest memory component. Thus, termination resistors 3913 and 3943 could be omitted from all of the memory components. Alternatively, the termination structure may be integrated in only the memory component farthest from the memory controller 3901. voltage, permitting a single bit to be encoded. If the address and control drivers have been disabled, both wires will carry the higher voltage. This example does not make use of the encoding in which both wires carry the lower voltage, but that encoding could be used to convey additional meaningful information.

Differential signaling will cost twice as many signal pins (2:1) as non-differential signaling. When the power and ground pins for the bus interface are accounted for, the ratio of total pins is closer to 1.5:1 for the differential:non-differential ratio. The AC bus typically needs to transfer less information in each tCC interval than the DQ bus, so it may be acceptable to use non-differential signaling for the AC bus even if differential signaling is used for the DQ bus.

Differential signaling permits higher signaling rates than non-differential signaling. In typical systems, there can be a difference of 2:1 or 3:1 in the maximum signaling bandwidth for the differential:non-differential ratio.

As a result, differential signaling can provide more signaling bandwidth per pin (typically 1.5 to 2.0 times as much) as non-differential signaling. It can provide a higher absolute signaling bandwidth rate (typically 2.0 to 3.0 times as much) as non-differential signaling.

In the system of FIG. 2, the interconnect topology of the AC (address/control) and DQ (data) buses are different. The AC bus is "common;" that is, it is driven from one end (at the memory controller) past a succession of memory components (connecting to each), and ending at a termination structure at the other end. This topology is also called a multi-drop bus.

The DQ bus is "sliced;" that is, it is driven from one end (at the memory controller) to a single memory, with a termination structure at each end. This topology is also called a point-to-point bus.

In general, the maximum signaling bandwidth of a multi-drop bus will be lower than that of a point-to-point bus. The periodic connections on the multi-drop bus act as a low pass filter, limiting the maximum spectral component of signals that are propagating on it.

In a typical system, an address/control bus that connects to 16 memory components might have only one quarter of the bandwidth as a data bus that connects to a single memory component. Even if the data bus were permitted to connect to two memory components (e.g., the data "slice" has two "ranks"), the signaling rate of the more lightly loaded bus would still be higher.

As a result, a system such as the one illustrated in FIG. 2 will support a much higher signaling bandwidth on its data bus than on its address/control bus. Because of this, it will be necessary to use a higher bandwidth signaling technology on the data bus to avoid wasting the higher available bandwidth.

For example, the system of FIG. 2 might use non-differential signaling on the AC bus to transfer two bits in each tCC interval and an AClk clock signal which has a rising edge and a falling edge in each tCC interval. In this way, the maximum spectral component of the AClk signal is the same as that of the AC bus signals.

This example system would use differential signaling on the DQ bus to transfer eight bits in each tCC interval, thus taking advantage of the higher signaling rate permitted by the point-to-point connection topology. The RClk and WClk clock signals for the DQ bus could be real signals accompanying the DQ bus, or these clock signals could be synthesized in each memory component using the AClk clock signal.

It should also be noted that a memory component that is designed to work in a memory system such as the one illustrated in FIG. 2 could also work in a memory system with a simpler connection topology. For example, a dedicated AC bus could be supplied to each memory component. This would cost more pins than the common AC (4) 1 1

This typically requires additive transmit circuits and receive circuits capable of discriminating between the resulting symbol combinations.

A third alternative for the data bus is to use one set of dedicated unidirectional wires for read data and a second set of unidirectional wires for write data. In this case, any control and timing signals for the read and write data also use dedicated unidirectional wires. The number of wires used in each set could be the same, or it could be different. When this alternative is chosen, there are no conflicts between read and write data, simplifying some of the system issues. It has the disadvantage that some of the bandwidth on one or the other of the unidirectional buses will be wasted if there is not a proper balance between read and write transfers.

It is also possible to implement the data bus as a combination of the three alternatives that have been described.

Termination Structures

Throughout the disclosure, it has been assumed that all wires have a termination structure on one end or on both ends, depending upon whether the wire is unidirectional or bidirectional. The termination structure is located at the end opposite from the transmit circuitry in the case of a unidirectional wire.

The termination structure allows the energy of a wavefront to be mostly absorbed. This permits the value of a wavefront to be sampled at the earliest possible time. This, in turn, allows symbols (bits) to be transferred at the maximum possible rate on a wire.

The termination structures can be components that are separate from the memory controller component and memory component. In that case, these termination components are placed on the same wiring board structures as the memory controller component and memory component. This approach has the disadvantage of increasing the length of wires and reducing the maximum signaling rate of the wires relative to the alternative of placing the termination structure on the memory controller component and memory component. However, such an approach may be preferable when benefits outweigh this disadvantage.

The use of termination structures that are integrated into a component provides two advantages. It allows wire to be kept as short as possible, allowing the signaling rate to be as high as possible. It also permits the termination structure to be implemented with active devices (transistors) rather than passive devices (resistors).

The use of active devices for a termination structure allows the termination structure to be adjusted to a range of termination values, thereby permitting it to be attached to external wires with a range of characteristic impedances. Note that the termination value is adjusted to be approximately the same as the characteristic impedance of the wire to which it is attached. In some cases, the termination value may be different from the characteristic impedance, with a deliberate mismatch between the values. This might be useful, for example, to compensate for the parasitic electrical elements of the component packages and wiring boards.

If the termination structure is integrated into the components using active devices, it is easy to turn it on and off to minimize the power dissipation. If the termination structure is integrated into the components using active devices, it is possible to use a calibration process to keep the termination value as optimal as possible. The calibration process involves either a hardware or software technique to measure a value (for example, a voltage) that is indicative of the termination value. As a result of the measurement operation, the termination value is adjusted to a more optimal value, for example, by changing a value in a register. This calibration process is repeated often enough so that the normal variations of supply voltage and temperature can be compensated. The process variations that are also present in the memory component and controller component (and which could affect the termination value) are also compensated. All of these capabilities permit the termination value to remain close to its optimal value, allowing the signaling rate of the attached wire to be as high as possible.

Transmitter Slew Rate and Transfer Characteristic

The pre-drivers used in each transmitter block may also include circuitry that controls the slew rate of the drivers. The drivers may include circuitry that controls their transfer characteristic; for example, they may include circuitry to control their gate voltage such that it appears to be a current source with a relatively high source impedance.

Thus, the pre-driver and driver control circuitry may use a calibration process to keep the slew rate or transfer characteristic as optimal as possible. The calibration process involves either a hardware or software technique to measure a value (for example, a voltage) that is indicative of the slew rate or transfer characteristic. As a result of the measurement operation, the slew rate or transfer characteristic is adjusted to a more optimal value, for example, by changing a value in a register. This calibration process is repeated often enough so that the normal variations of supply voltage and temperature can be compensated. The process variations (e.g., variations arising during manufacture) that are also present in the memory component and controller component (and which could affect slew rate or transfer characteristic) are also compensated. All of these capabilities permit the slew rate or transfer characteristic to remain close to its optimal value, allowing the signaling rate of the attached wire to be as high as possible.

Differential Clocks

A clock signal that accompanies a bus will generally have the same topology as the bus. Thus, the wires of the bus and the clock signal will have about the same maximum signaling rate. Therefore, it is preferable that the maximum frequency component of the clock signal be about the same as the maximum frequency component of the signals communicated over the bus. For example, if the cycle time (tCC) of the AClk clock signal (e.g., the time elapsed between time 308 and time 309) is twice the bit time (tBIT) of the AC bus (e.g., the time elapsed during transmission of one of address bits 311-328, as appropriate) in FIG. 4, then the maximum frequency components of the clock signal and the bus will be about the same. As an example, address bits 313 and 314 illustrate such a relationship.

In one embodiment, a clock signal and the accompanying bus share the same type of signaling techniques. For example, if the bus is non-differential, the clock signal can also be non-differential. However, it is harder to receive a clock than to receive a data or address and control signal. The data or address and control signals can utilize a clocked receiver, which typically allows greater signal amplification than a non-clocked receiver, which is used for the clock signal. As a result, there may be a benefit to use a differential clock to accompany a non-differential bus, even though both sets of signals are subject to about the same maximum signal rate limits imposed by the system topology.

Differential and Terminated Data Bus

When differential signaling is used on the wires of a data bus, it may also be particularly beneficial to use integrated termination structures on the memory controller and memory component. There are at least two reasons for this. First, the use of differential signaling means that the total current of a transmitter pair (the two transmitters that drive a signal and its complement on a wire pair) will be nearly constant regardless of the value of the signal. Because the current is nearly constant, the amount of switching noise generated in the memory controller or memory component will be small and the memory controller or memory component can better tolerate the increased noise generated by integrated termination structures.

Second, differential signaling may be beneficially used when the physical wire topology permits a high signaling rate. As already mentioned, the use of integrated termination structures on the memory controller and memory component reduces the wire length and also permits the highest possible signaling rate.

A relatively simple topology (e.g., a point-to-point connection from memory controller to memory component, for example) is, in most cases, preferable as a data bus topology. The use of differential signaling and integrated termination structures is compatible with such a relatively simple topology.

The control and address bus typically connects to a larger number of memory components (multi-drop bus). As a result, the lower signaling rates supported by the multi-drop wires may not be able to support signaling rates of which differential signaling is capable, and non-differential signaling may be preferable. Also, because the control and address bus is unidirectional, only one termination structure is needed at the end farthest from the memory controller component. As a result, there is less benefit from integrating the termination structure onto either the memory controller or any of the memory components. The use of non-differential signaling and non-integrated termination structures is compatible with this more complex multi-drop topology.

Differential Signaling and Preaccessing

Differential signaling permits higher signaling rates on a data bus. This means that the time tBIT that a symbol (bit) is driven on a wire is small. When the tBIT time is less than the column cycle time tCC, then additional information are accessed in the memory component to utilize the bandwidth provided during tCC. For example, if tBIT is 1/m of tCC, and the data bus carries $N_{DQ}$ bits of information at any instant, then NCC=m*$N_{DQ}$ bits of information are accessed during each column access in the memory component. Here, "m" is the preload ratio and, in this example, is both the ratio of tCC to tBIT and the ratio of NCC to NDQ. In general, these two ratios should preferably approximately match.

Such accessing is referred to as preloading or preaccessing and serves to ensure that the bandwidth in the memory component matches the bandwidth of the data bus (e.g., to ensure that sufficient information is obtained from the memory component to fill the available bandwidth of the data bus). As the bandwidth of the data bus is increased through the use of a simpler topology, differential signaling, or the use of integrated termination structures, more information will need to be preaccessed in each column access to ensure efficient use of the increased data bus bandwidth.

Differential Signaling and Per-Pin Timing Calibration

Differential signaling permits higher signaling rates on a bus, as compared to non-differential signaling. Integrated termination structures on the memory controller and/or the memory component also permit higher signaling rates on a data bus, as compared to termination structures external to the memory controller and/or the memory component.

Higher signaling rates require that the transmit and receive circuits of a memory controller and a memory component be able to drive and sense signals at very precise points of time. This precision can be accomplished with circuits that are adjustable for each signal (pin) on a component. For example, the times at which a transmit circuit presents signals on a bus can be precisely and individually adjusted for each pin of the bus. As another example, the times at which a receive circuit samples signals present on a bus can be precisely and individually adjusted for each pin of the bus. This can be done either in the memory controller component only, in the memory component only, or in both the memory controller and one or more memory components (depending upon the overall timing relationships chosen for the system).

In addition to providing for adjustable transmit and receive circuits for each bus signal of a component, a process for calibrating these circuits is provided. The calibration process involves either a hardware or software technique to measure a value that is indicative of the timing value that is to be adjusted (e.g., the transmit timing point or the receive timing point). As a result of the measurement operation, the timing point is adjusted to a more optimal value, for example, by changing a value in a register. This calibration process is repeated often enough so that the normal variations of supply voltage and temperature can be compensated. Process variations in the memory controller and memory component that result from imperfections in the manufacturing process (and that can affect the timing point value) are also compensated.

All of these capabilities permit the timing points to remain close to their optimal values, allowing the signaling rate to be as high as possible.

Most of the benefits realized with per-pin timing calibration will also be present when a small number of pins (two or four pins, for example) are able to share some or all of the calibration circuitry. In some systems, it will be possible to ensure that small groups or pins have similar enough timing characteristics (for example, because they connect to the same components or they have nearly identical wire routing on the wiring boards) that the any timing differences can be absorbed into the overall timing budget. The cost of this sharing, as opposed to true per-pin timing calibration, is that there may be a slight, but acceptable loss in the maximum signaling rate of the affected bus. Another cost might be the need to introduce a timing parameter for the system that constrains the amount of timing variation that is permitted among the pins of one of these wiring groups. The benefit of this sharing could be a reduction in the amount of circuitry needed to adjust to adjust the timing of the component so it may operate in the system.

The Synergy Between Individual Performance-Enhancing Features

A number of features present in the memory system of FIG. 2 have been described. Some of these features can improve the signaling rate between the memory controller component and the one or more memory components of the system. Others can reduce the cost of the system, or improve some other system metrics. However, adding a single feature may or may not yield a significant benefit to the system performance or the system cost. For example, when one part of the system is improved, another part may become the limitation to that system metric. In general, it is preferable to include a number of features in the system in order to realize the full benefit.

A summary of the features that have been discussed include:

(1) Individual timing adjustment for each pin or pin group of a device, for example, a memory controller or a memory component, (2) Asymmetric timing (all the timing adjustment done in either the memory component or all done in the memory controller), for example, to minimize cost, (3) A calibration process (with periodic measurement and adjustment) to optimize the timing adjustment of each pin or pin group of a device, (4) Adjustment of the bit time of a bus to match the signaling rate supported by the topology of the bus in the system, (5) Selection of a cycle time of the clock signal that accompanies a bus to provide adequate phase and frequency information to one or more devices connected to a clock signal conductor and bus, but without requiring a signaling bandwidth significantly higher than that of the accompanying bus, (6) A differential clock accompanying a non-differential bus to accommodate the more demanding requirements of clock receivers as compared with data or address and control receivers, (7) Use of differential signaling for a bus with a topology that permits a higher signaling bandwidth in order to increase performance, (8) Use of non-differential signaling for a bus with a topology that limits the signaling bandwidth in order to lower cost, (9) Use of termination structures on a bus to increase signaling bandwidth,

(10) Use of integrated termination structures on a device to reduce wire-stub lengths on a bus and increase signaling bandwidth,

(11) Use of active circuit elements with control circuitry to implement integrated termination structures on a device to allow adjustment to different characteristic bus impedances and power-state control,

(12) Use of a calibration process (with periodic measurement and adjustment) to optimize the termination value of an integrated termination structures on a device,

(13) Use of slew rate control circuitry and transfer characteristic control circuitry in the predriver and driver of transmitter blocks in one or more devices to increase signaling bandwidth or reduce cost,

(14) Use of slew rate control circuitry and transfer characteristic control circuitry in the predriver and driver of transmitter blocks in one or more devices to allow adjustment to different characteristic bus impedances and to allow adjustment for other bus properties,

(15) Use of a calibration process (with periodic measurement and adjustment) to optimize the slew rate control circuitry and transfer characteristic control circuitry on a device,

(16) Memory component designed to prefetch (preaccess) words that are wider than the width of the data bus so that the memory access bandwidth approximately matches the transfer bandwidth, and

(17) Memory component able to adjust the size of the prefetch (preaccess) word to accommodate connection to data buses of different width.

In general, it is better to utilize as many of the above features as possible to gain the full benefit in the system. However, there will still be some benefit to utilizing only a few, as may be necessary in some system environments.

The capabilities described above may be applied to a system as a whole, or to individual constituents. For example, embodiments of the invention may be practiced for a system, such as a memory system, a memory component, a controller, such as a memory controller, an interconnection device, such as a wiring board, and may include embodiments directed to apparatus and methods.

Numerous variations to the embodiments described herein are possible without deviating from the scope of the claims set forth herein. Examples of these variations are described below. These examples may be applied to control and address signals, read data signals, write data signals, and optional write mask signals. For example, a timing signal associated with the signals may be generated by an external clock component or by a controller component. That timing signal may travel on wires that have essentially the same topology as the wires carrying such signals. That timing signal may be generated from the information contained on the wires carrying such signals or from a timing signal associated with any of such signals. That timing signal may be asserted an integral number of times during the interval that each piece of information is present on a wire carrying such signals. As another variation, an integral number of pieces of information may be asserted on a wire carrying such signals each time the timing signal associated with such signals is asserted. As yet another variation, an integral number of pieces of information may be asserted on a wire carrying such signals each time the timing signal associated with such signals is asserted an integral number of times. The point when a timing signal associated with such signals is asserted may have an offset relative to the time interval that each piece of information is present on a wire carrying such signals.

As examples of other variations, the termination components for some of the signals may be on any of a main printed wiring board, a memory module board, a memory component, or a controller component. Also, two or more ranks of memory components may be present on the memory module and with some control and address signals connecting to all memory components and with some control and address signals connecting to some of the memory components. It is also possible for two or more modules of memory components to be present in the memory system, with some control and address signals connecting to all memory components and with some control and address signals connecting to some of the memory components.

As one example, a memory system includes a first memory controller, a first memory component, a first address and control bus connecting the first memory controller and first memory component, a first data bus connecting the first memory controller and the first memory component. The first data bus uses differential signaling and has a symbol (bit) time that is shorter than the symbol (bit) time of the first address and control bus. Optionally, a second memory component connects to the first address and control bus and to the first data bus. Optionally, a second memory component connects to the first address and control bus and a second data bus connects the first memory controller and the second memory component. The second data bus uses differential signaling and has a symbol (bit) time that is shorter than the symbol (bit) time of the first address and control bus.

The ratio of the first data bus symbol (bit) time to the first address and control bus symbol (bit) time is y/z, where y and z are positive integers and where y is greater than z. Optionally, the ratio y/z is 1/2. Optionally, the ratio y/z is 1/4. Optionally, the ratio y/z is 1/8 or less, for example, 1/16, 1/32/, 1/64, 1/128, 1/256, etc.

Optionally, a first clock signal is associated with the first address and control bus. The ratio of the cycle time of the first clock signal to the first address and control bus symbol (bit) time is z/x, where z and x are positive integers and x is greater than z. Optionally, the ratio z/x is 1/2. Optionally, the ratio z/x is 1/4. Optionally, the ratio z/x is 1/8 or less, for example, 1/16, 1/32, 1/64, 1/128, 1/256, etc.

Optionally, a first clock signal is associated with the first data bus. The ratio of the cycle time of the first clock signal to the first data bus symbol (bit) time is z/x, where z and x are positive integers and x is greater than z. Optionally, the ratio z/x is 1/2. Optionally, the ratio z/x is 1/4. Optionally, the ratio z/x is 1/8 or less.

Optionally, a first clock signal is associated with the first address and control bus. The ratio of the cycle time of the first clock signal to the first address and control bus symbol (bit) time is z/x, where z and x are positive integers and x is greater than z.

Optionally, a first clock signal is associated with the first data bus. The ratio of the cycle time of the first clock signal to the first data bus symbol (bit) time is y/w, where y and w are positive integers and w is greater than y.

Optionally, a first clock signal is associated with the first address and control bus. The ratio of the cycle time of the first clock signal to the first address and control bus symbol (bit) time is z/x, where z and x are positive integers and x is greater than z.

Optionally, a first clock signal is associated with the first data bus. The ratio of the cycle time of the first clock signal to the first data bus symbol (bit) time is y/w, where y and w are positive integers and w is greater than y.

As one example, a memory system includes a first memory controller, a first memory component, a first address and control bus connecting the first memory controller and first memory component, a first data bus connecting the first memory controller and the first memory component. Optionally, the ratio of the first data bus symbol (bit) time to the first address and control bus symbol (bit) time is 1/4 or less, for example, 1/8, 1/16, 1/32, 1/64, 1/128, 1/256, etc. Optionally, a second memory component connects to the first address and control bus and to the first data bus. Optionally, a second memory component connects to the first address and control bus, a second data bus connects the first memory controller and the second memory component. Optionally, the ratio of the second data bus symbol (bit) time to the first address and control bus symbol (bit) time is 1/4 or less, for example, 1/8, 1/16, 1/32, 1/64, 1/128 , 1/256, etc.

Optionally, a first clock signal is associated with the first address and control bus. The ratio of the cycle time of the first clock signal to the first address and control bus symbol (bit) time is z/x, where z and x are positive integers and x is greater than z. Optionally, the ratio z/x is 1/2. Optionally, the ratio z/x is 1/4. Optionally, the ratio "z/x" is "1/8" or less, for example, 1/16, 1/32, 1/64, 1/128, 1/256, etc.

Optionally, a first clock signal is associated with the first data bus. The ratio of the cycle time of the first clock signal to the first data bus symbol (bit) time is z/x, where z and x are positive integers and x is greater than z. Optionally, the ratio z/x is 1/2. Optionally, the ratio z/x is 1/4. Optionally, the ratio z/x is 1/8 or less, for example, 1/16, 1/32, 1/64, 1/128, 1/256, etc.

Optionally, a first clock signal is associated with the first address and control bus. The ratio of the cycle time of the first clock signal to the first address and control bus symbol (bit) time is z/x, where z and x are positive integers and x is greater than z.

Optionally, a first clock signal is associated with the first data bus. The ratio of the cycle time of the first clock signal to the first data bus symbol (bit) time is y/w, where y and w are positive integers and w is greater than y.

Optionally, a first clock signal is associated with the first address and control bus. The ratio of the cycle time of the first clock signal to the first address and control bus symbol (bit) time is z/x, where z and x are positive integers and x is greater than z.

Optionally, a first clock signal is associated with the first data bus. The ratio of the cycle time of the first clock signal to the first data bus symbol (bit) time is y/w, where y and w are positive integers and w is greater than y.

Accordingly, a method and apparatus for coordinating memory operations among diversely-located memory components has been described. It should be understood that the implementation of other variations and modifications of the invention in its various aspects will be apparent to those of ordinary skill in the art, and that the invention is not limited by the specific embodiments described. It is therefore contemplated to cover by the present invention, any and all modifications, variations, or equivalents that fall within the spirit and scope of the basic underlying principles disclosed and claimed herein.

What is claimed is:

1. A memory system comprising:
   a first memory controller;
   a first memory component;
   a first address and control bus connected to the first memory controller and the first memory component, the first address and control bus including a plurality of signal conductors that extend from the first memory controller to the first memory component; and
   a first data bus connected to the first memory controller and to the first memory component, wherein the first data bus uses differential signaling and has a first data bus symbol time that is shorter than a first address and control bus symbol time of the first address and control bus.

2. The memory system of claim 1 further comprising:
   a second memory component connected to the first address and control bus and to the first data bus.

3. The memory system of claim 1 further comprising:
   a second memory component connected to the first address and
   control bus; and
   a second data bus connected to the first memory controller and to the second memory component, wherein the second data bus uses differential signaling and has a second data bus symbol time that is shorter than the first address and control bus symbol time of the first address and control bus.

4. The memory system of claim 1 wherein a quotient of the first data bus symbol time divided by the first address and control bus symbol time is less than or equal to 1/8.

5. The memory system of claim 1 further comprising a memory module having the first memory component disposed thereon, and wherein the plurality of signal conductors include, at least in part, conductive traces disposed on the memory module.

6. A memory system comprising:
   a first memory controller;
   a first memory component;
   a first address and control bus connected to the first memory controller and to the first memory component, the first address and control bus including a plurality of signal conductors that extend from the first memory controller to the first memory component;
   a first clock signal conductor connected to the first memory controller and to the first memory component; and
   a first data bus connected to the first memory controller and to the first memory component, wherein the first data bus has a first data bus symbol time that is shorter than a first address and control bus symbol time of the first address and control bus and wherein the first address and control bus symbol time is shorter than a first clock signal cycle time of the first clock signal.

7. The memory system of claim 6 further comprising:
   a second memory component connected to the first address and control bus, to the first clock signal conductor, and to the first data bus.

8. The memory system of claim 6 further comprising:
   a second memory component connected to the first address and control bus and to the first clock signal conductor; and
   a second data bus connected to the first memory controller and to the second memory component, wherein the second data bus uses differential signaling and has a second data bus symbol time that is shorter than the first address and control bus symbol time of the first address and control bus.

9. The memory system of claim 6 wherein a first quotient of the first data bus symbol time divided by the first address and control bus symbol time is less than or equal to 1/8 and a second quotient of the first address and control bus symbol time divided by the first clock signal cycle time is less than or equal to 1/2.

10. The memory system of claim 6 further comprising a memory module having the first memory component disposed thereon, and wherein the plurality of signal conductors include, at least in part, conductive traces disposed on the memory module.

11. A memory system comprising:
a first memory controller;
a first memory component;
a first address and control bus connected to the first memory controller and to the first memory component, the first address and control bus including a plurality of signal conductors that extend from the first memory controller to the first memory component; and
a first data bus connected to the first memory controller and to the first memory component, wherein the first memory component includes a first termination structure connected to the first data bus and wherein the first data bus has a first data bus symbol time that is shorter than a first address and control symbol time of the first address and control bus.

12. The memory system of claim 11 further comprising:
a second memory component connected to the first address and control bus; and
a second data bus connected to the first memory controller and to the second memory component, wherein the second memory component includes a second termination structure connected to the second data bus and wherein the first data bus symbol time is shorter than the first address and control bus symbol time of the first address and control bus.

13. The memory system of claim 11 wherein the first memory controller includes a third termination structure connected to the first data bus.

14. The memory system of claim 11 wherein a quotient of the first data bus symbol time divided by the first address and control bus symbol time is less than or equal to $1/8$.

15. The memory system of claim 11 wherein a calibration process is used to adjust a first termination value of the first termination structure.

16. The memory system of claim 11 further comprising a memory module having the first memory component disposed thereon, and wherein the plurality of signal conductors include, at least in part, conductive traces disposed on the memory module.

17. A memory system comprising:
a first memory controller;
a first memory component;
a first address and control bus connected to the first memory controller and to the first memory component, the first address and control bus including a plurality of signal conductors that extend from the first memory controller to the first memory component; and
a first data bus connected to the first memory controller and to the first memory component, wherein the first memory component includes a first termination structure connected to the first data bus, wherein the first data bus uses differential signaling, and wherein the first address and control bus uses non-differential signaling.

18. The memory system of claim 17 further comprising:
a second memory component connected to the first address and control bus; and
a second data bus connected to the first memory controller and to the second memory component, wherein the second memory component includes a second termination structure connected to the second data bus and wherein the second data bus uses differential signaling.

19. The memory system of claim 17 wherein the first memory controller includes a third termination structure connected to the first data bus.

20. The memory system of claim 17 wherein a calibration process is used to adjust a first termination value of the first termination structure.

21. The memory system of claim 17 further comprising a memory module having the first memory component disposed thereon, and wherein the plurality of signal conductors include, at least in part, conductive traces disposed on the memory module.

22. A memory system comprising:
a first memory controller;
a first memory component;
a first address and control bus connected to the first memory controller and to the first memory component, the first address and control bus including a plurality of signal conductors that extend from the first memory controller to the first memory component; and
a first data bus connected to the first memory controller and to the first memory component, wherein the first data bus uses differential signaling and wherein the first memory component accesses a first word stored in the first memory component, the first word being wider than a first data bus width of the first data bus.

23. The memory system of claim 22 further comprising:
a second memory component connected to the first address and control bus and to the first data bus.

24. The memory system of claim 22 further comprising:
a second memory component connected to the first address and control bus; and a
second data bus connected to the first memory controller and to the second memory component, wherein the second data bus uses differential signaling and wherein the second memory component accesses a second word stored in the second memory component, the second word being wider than a second data bus width of the second data bus.

25. The memory system of claim 22 further comprising a memory module having the first memory component disposed thereon, and wherein the plurality of signal conductors include, at least in part, conductive traces disposed on the memory module.

26. A memory system comprising:
a first memory controller;
a first memory component;
a first address and control bus connected to the first memory controller and to the first memory component, the first address and control bus including a plurality of signal conductors that extend from the first memory controller to the first memory component; and
a first data bus connected to the first memory controller and to the first memory component, wherein the first memory controller includes a first receive circuit having a first read timing adjustment subcircuit for adjusting a first adjustable read data sampling time point for first read data sampled from the first data bus and wherein the first data bus uses differential signaling.

27. The memory system of claim 26 further comprising:
a second memory component connected to the first address and control bus; and
a second data bus connected the first memory controller and to the second memory component, wherein the first memory controller includes a second receive circuit having a second read timing adjustment subcircuit for adjusting a second adjustable read data sampling time point for second read data sampled from the second data bus and wherein the second data bus uses differential signaling.

28. The memory system of claim 26 wherein a calibration process is used to adjust the first adjustable read data sampling time point.

29. The memory system of claim 26 wherein the first memory controller contains a first transmit circuit having a first write timing adjustment subcircuit for adjusting a first adjustable write data driving time point for first write data driven on the first data bus.

30. The memory system of claim 26 further comprising a memory module having the first memory component disposed thereon, and wherein the plurality of signal conductors include, at least in part, conductive traces disposed on the memory module.

31. A memory system comprising:
   a first memory controller;
   a first memory component;
   a first address and control bus connected to the first memory controller and to the first memory component, the first address and control bus including a plurality of signal conductors that extend from the first memory controller to the first memory component; and
   a first data bus connected to the first memory controller and to the first memory component, wherein the first memory controller component includes a first receive circuit having a first read timing adjustment subcircuit for adjusting a first adjustable read data sampling time point for first read data sampled from the first data bus and wherein the first memory component includes a first termination structure connected to the first data bus.

32. The memory system of claim 31 further comprising:
   a second memory component connected to the first address and control bus; and
   a second data bus connected to the first memory controller and to the second memory component, wherein the first memory controller includes a second receive circuit having a second read timing adjustment subcircuit for adjusting a second adjustable read data sampling time point for second read data sampled from the second data bus and wherein the second memory component includes a second termination structure connected to the second data bus.

33. The memory system of claim 31 wherein a calibration process is used to adjust the first adjustable read data sampling time point.

34. The memory system of claim 31 wherein the first memory controller includes a first transmit circuit having a first write timing adjustment subcircuit for adjusting a first adjustable write data driving time point for first write data driven on the first data bus.

35. The memory system of claim 31 wherein the first memory controller includes a third termination structure connected to the first data bus.

36. The memory system of claim 31 further comprising a memory module having the first memory component disposed thereon, and wherein the plurality of signal conductors include, at least in part, conductive traces disposed on the memory module.

\* \* \* \* \*